(12) United States Patent
Das et al.

(10) Patent No.: US 9,522,426 B2
(45) Date of Patent: Dec. 20, 2016

(54) SYSTEMS AND METHODS FOR ADDITIVE MANUFACTURING AND REPAIR OF METAL COMPONENTS

(71) Applicants: Suman Das, Atlanta, GA (US); Rohan Bansal, Buffalo, NY (US); Justin Gambone, Watervliet, NY (US)

(72) Inventors: Suman Das, Atlanta, GA (US); Rohan Bansal, Buffalo, NY (US); Justin Gambone, Watervliet, NY (US)

(73) Assignee: GEORGIA TECH RESEARCH CORPORATION, Atlanta, GA (US)

( * ) Notice: Subject to any disclaimer, the term of this patent is extended or adjusted under 35 U.S.C. 154(b) by 431 days.

(21) Appl. No.: 14/076,101

(22) Filed: Nov. 8, 2013

(65) Prior Publication Data

US 2014/0163717 A1   Jun. 12, 2014

Related U.S. Application Data

(60) Provisional application No. 61/724,035, filed on Nov. 8, 2012.

(51) Int. Cl.
*G06F 19/00* (2011.01)
*B22F 3/105* (2006.01)
(Continued)

(52) U.S. Cl.
CPC ............ *B22F 3/1055* (2013.01); *B22F 5/009* (2013.01); *B22F 5/04* (2013.01); *B29C 67/0077* (2013.01);
(Continued)

(58) Field of Classification Search
USPC .................... 700/119, 120, 98; 264/497, 401
See application file for complete search history.

(56) References Cited

U.S. PATENT DOCUMENTS

| | | | |
|---|---|---|---|
| 5,409,537 A | 4/1995 | Poullos et al. | |
| 6,311,759 B1 * | 11/2001 | Tausig | B21J 5/004 164/113 |
| 6,515,093 B1 * | 2/2003 | Somers | B32B 27/32 525/236 |
| 6,622,774 B2 * | 9/2003 | Song | B22D 27/045 164/128 |

(Continued)

OTHER PUBLICATIONS

International Search Report for International Application No. PCT/US13/69340; mailed May 7, 2014.

*Primary Examiner* — Kidest Bahta
(74) *Attorney, Agent, or Firm* — Troutman Sanders LLP; Ryan A. Schneider; Parker D. Hancock

(57) ABSTRACT

Scanning Laser Epitaxy (SLE) is a layer-by-layer additive manufacturing process that allows for the fabrication of three-dimensional objects with specified microstructure through the controlled melting and re-solidification of a metal powders placed atop a base substrate. SLE can be used to repair single crystal (SX) turbine airfoils, for example, as well as the manufacture functionally graded turbine components. The SLE process is capable of creating equiaxed, directionally solidified, and SX structures. Real-time feedback control schemes based upon an offline model can be used both to create specified defect free microstructures and to improve the repeatability of the process. Control schemes can be used based upon temperature data feedback provided at high frame rate by a thermal imaging camera as well as a melt-pool viewing video microscope. A real-time control scheme can deliver the capability of creating engine ready net shape turbine components from raw powder material.

19 Claims, 82 Drawing Sheets

(51) Int. Cl.
  *B22F 5/00*   (2006.01)
  *B22F 5/04*   (2006.01)
  *B29C 67/00*  (2006.01)
  *C30B 13/24*  (2006.01)
  *C30B 29/52*  (2006.01)
  *B22F 7/06*   (2006.01)
  *B29L 31/08*  (2006.01)
  *B23P 6/00*   (2006.01)

(52) U.S. Cl.
  CPC ............... *C30B 13/24* (2013.01); *C30B 29/52* (2013.01); *B22F 2003/1057* (2013.01); *B22F 2007/068* (2013.01); *B23P 6/007* (2013.01); *B29L 2031/08* (2013.01); *Y02P 10/295* (2015.11)

(56) References Cited

U.S. PATENT DOCUMENTS

| | | | |
|---|---|---|---|
| 6,676,892 B2* | 1/2004 | Das | B22F 3/1055 419/7 |
| 7,020,539 B1 | 3/2006 | Kovacevic et al. | |
| 7,045,738 B1* | 5/2006 | Kovacevic | B05B 7/144 219/121.63 |
| 2002/0015654 A1* | 2/2002 | Das | B22F 3/1055 419/8 |
| 2005/0040147 A1 | 2/2005 | Hoebel et al. | |
| 2009/0206065 A1 | 8/2009 | Kruth et al. | |
| 2011/0061591 A1* | 3/2011 | Stecker | B22F 3/1055 118/663 |

* cited by examiner

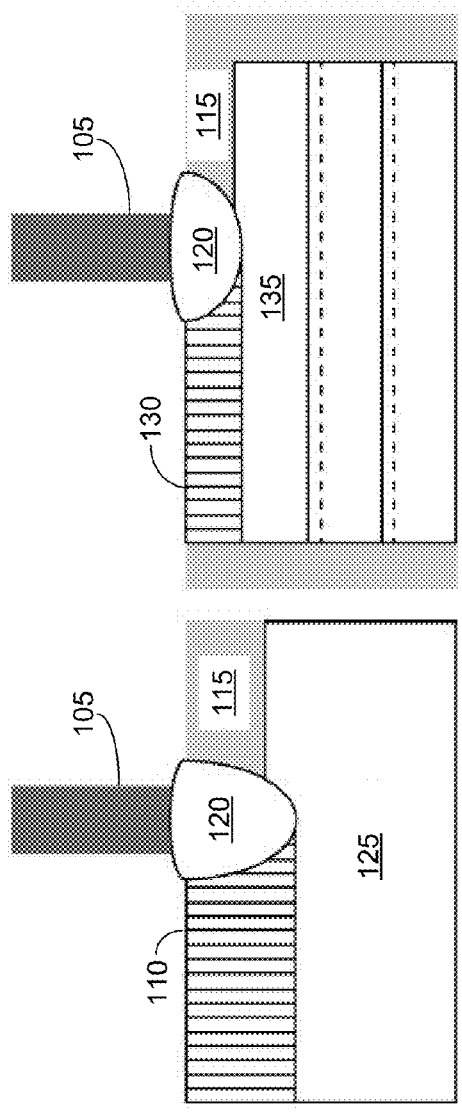
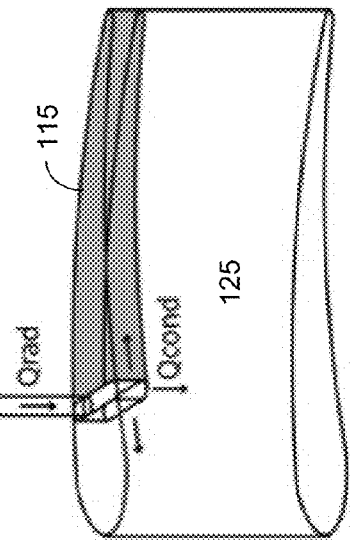
Fig. 1a
Fig. 1b
Fig. 1c

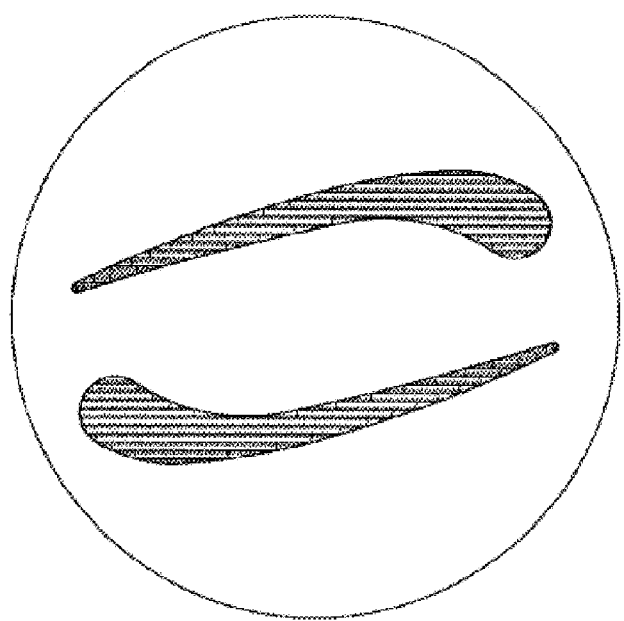
Fig. 12
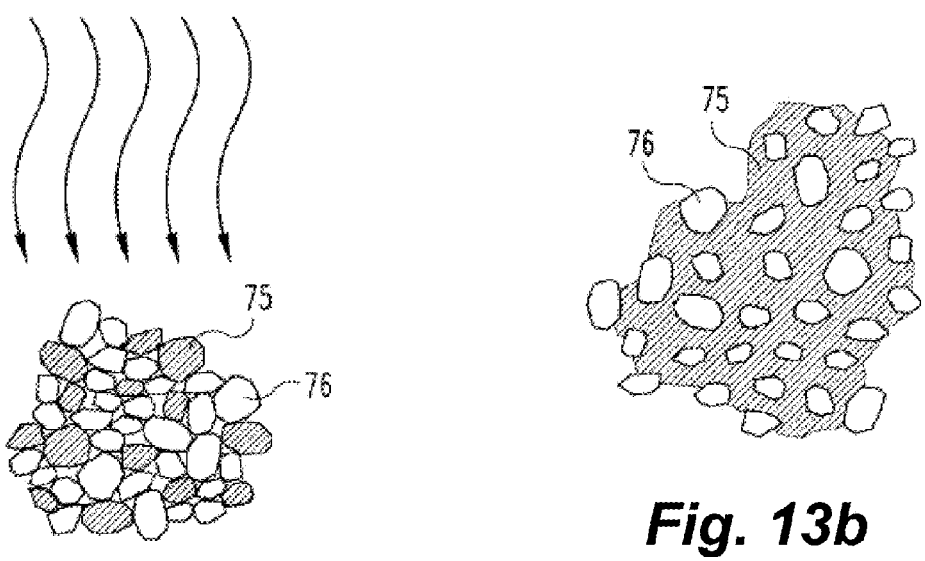
Fig. 13a
Fig. 13b

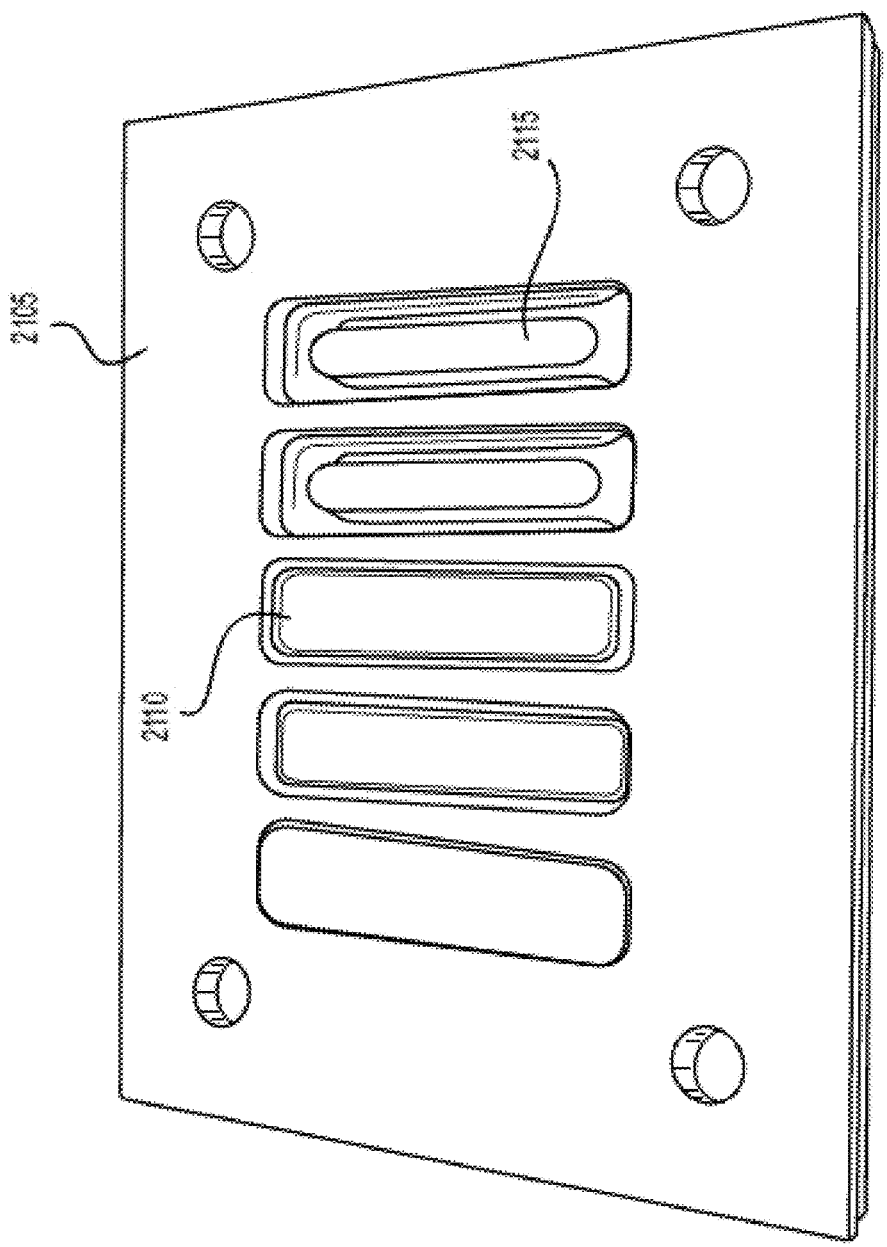

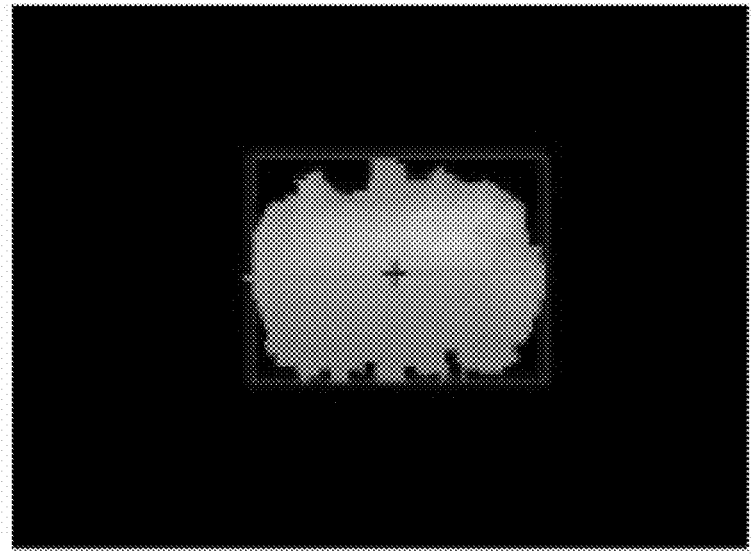
Fig. 65
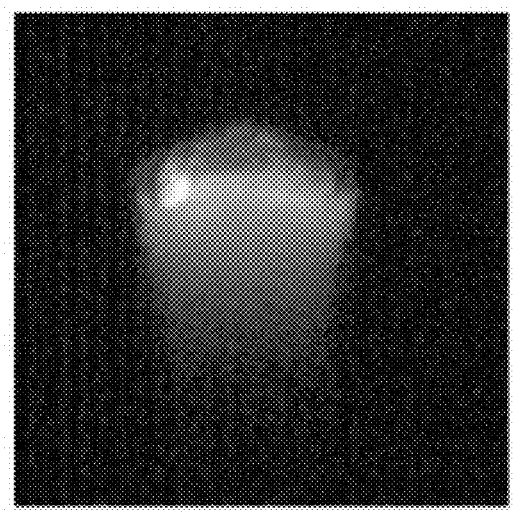 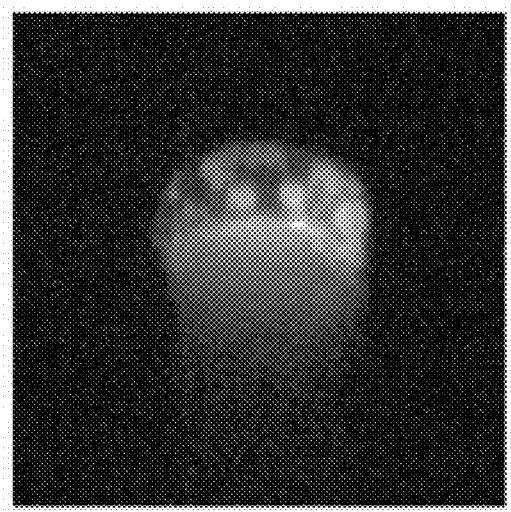
Fig. 66a        Fig. 66b

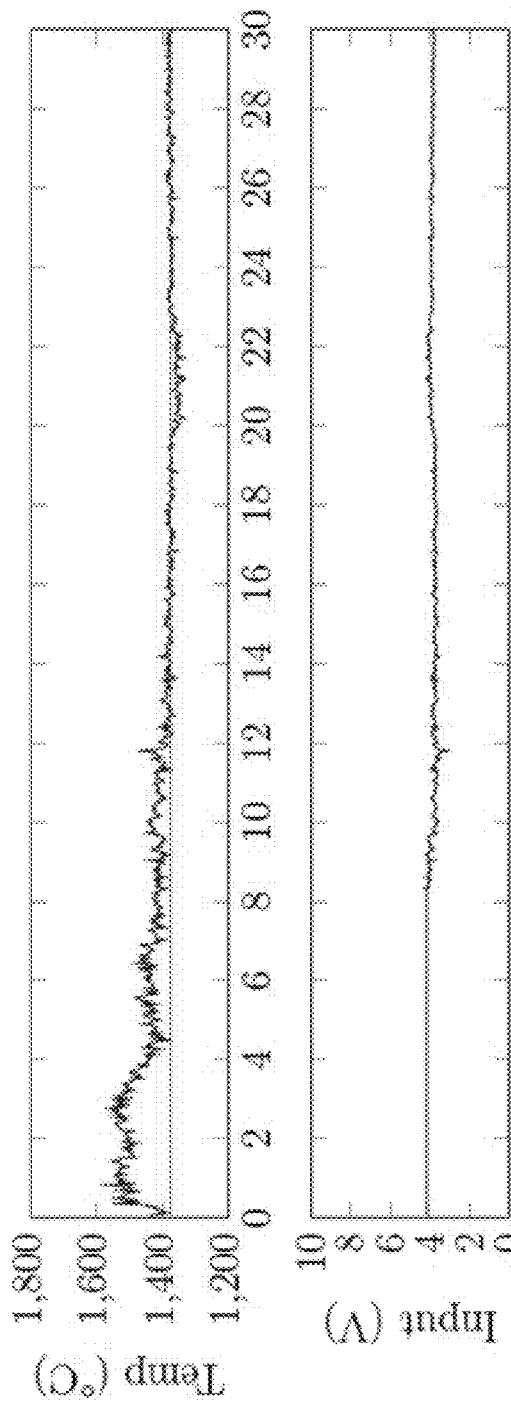
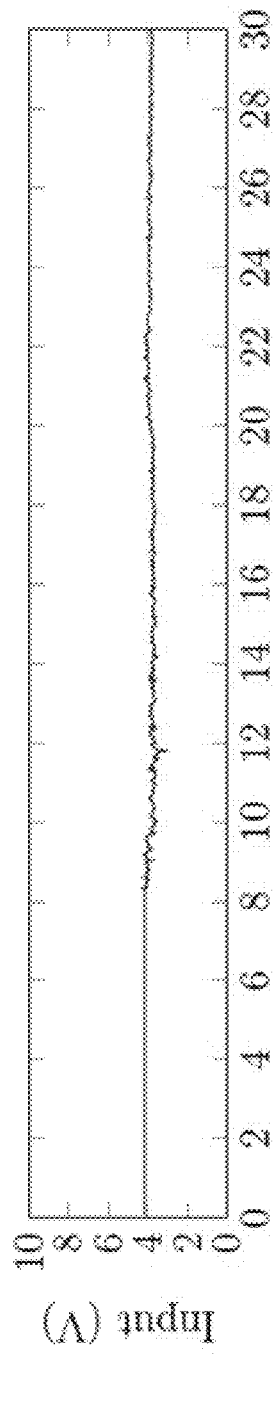
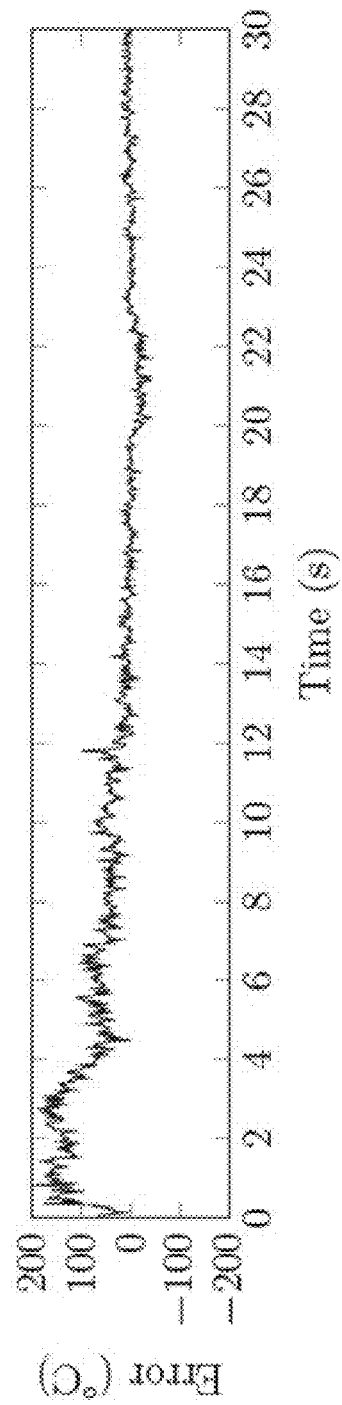
Fig. 75a
Fig. 75b
Fig. 75c

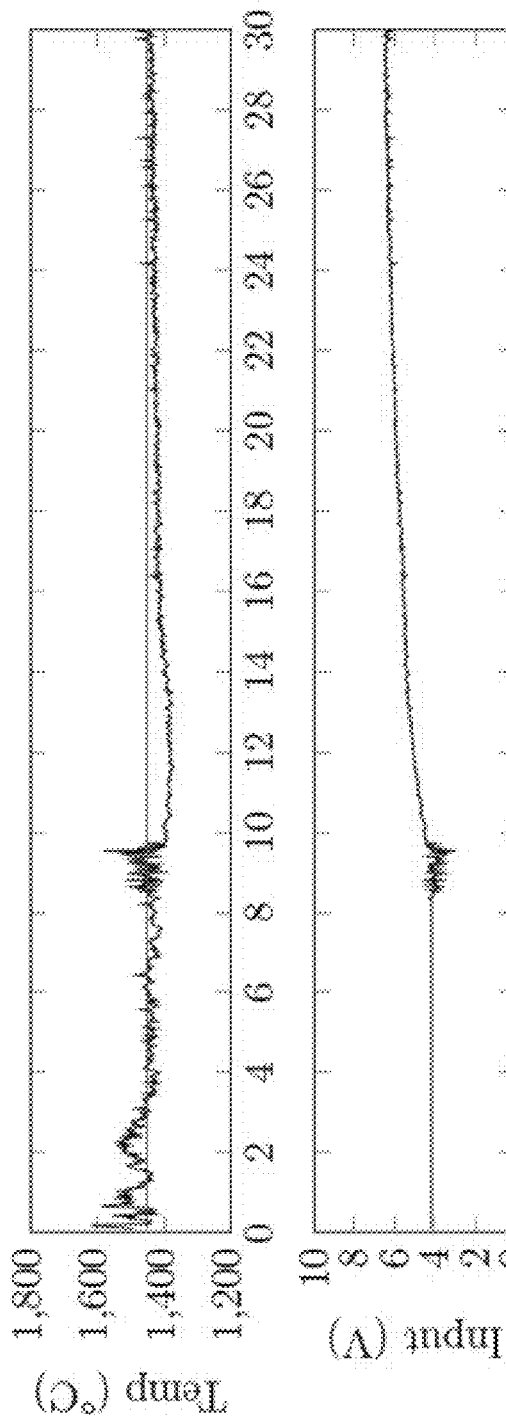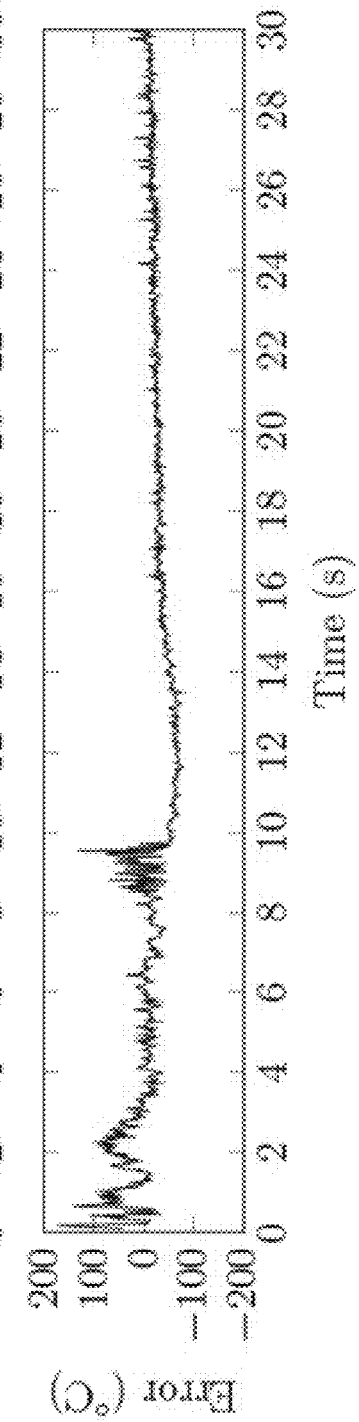
Fig. 76a
Fig. 76b
Fig. 76c

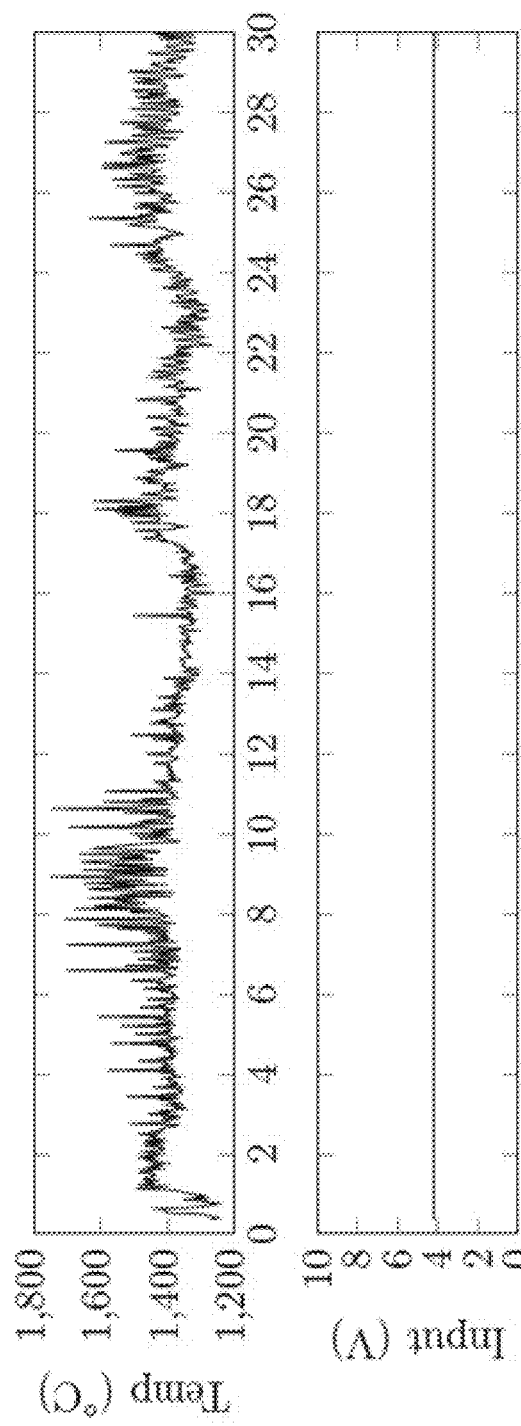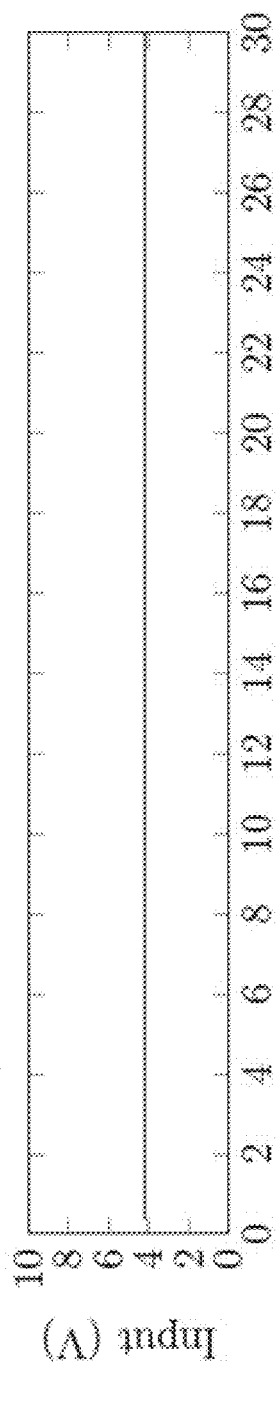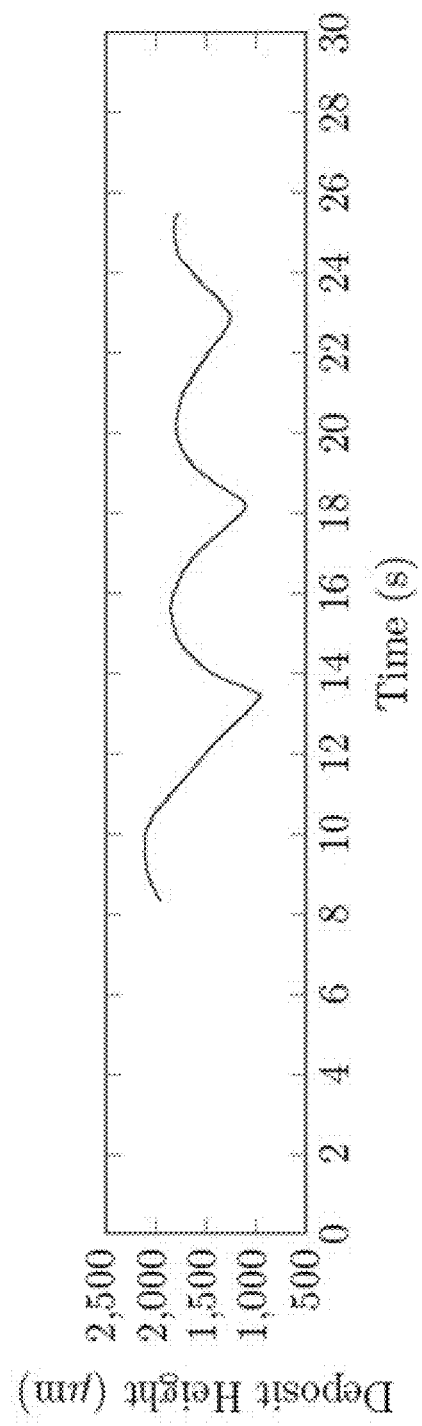

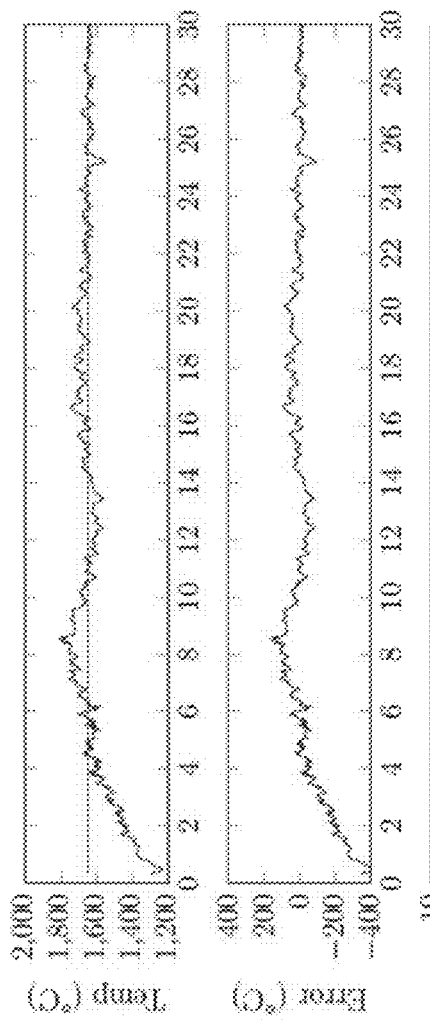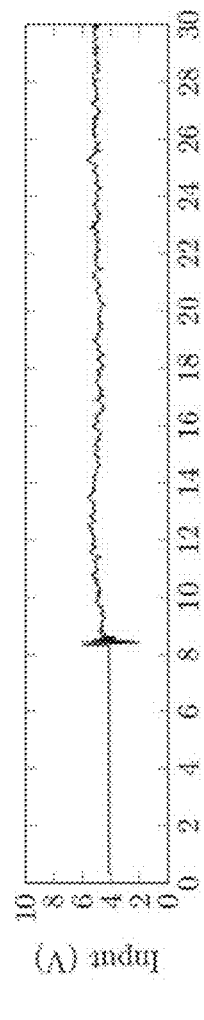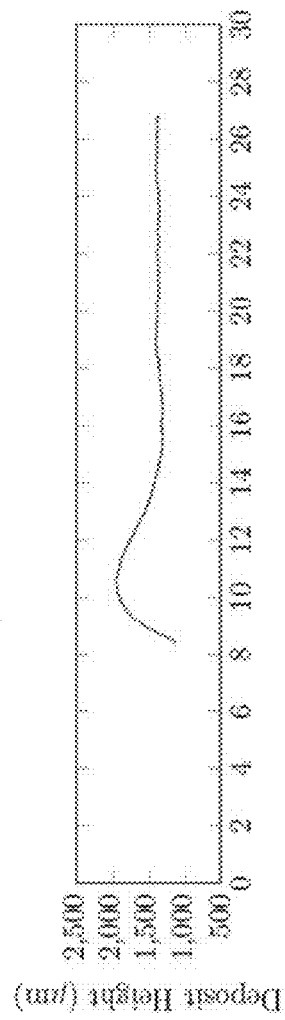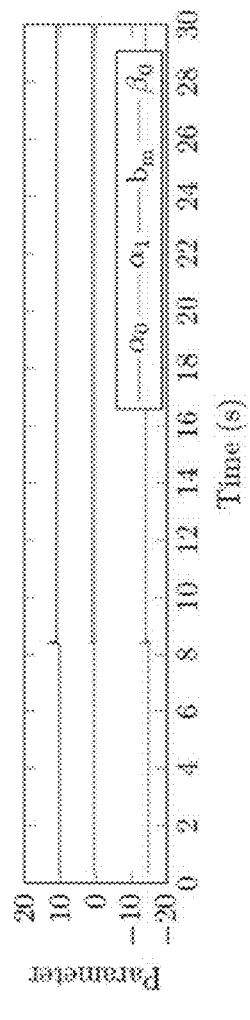

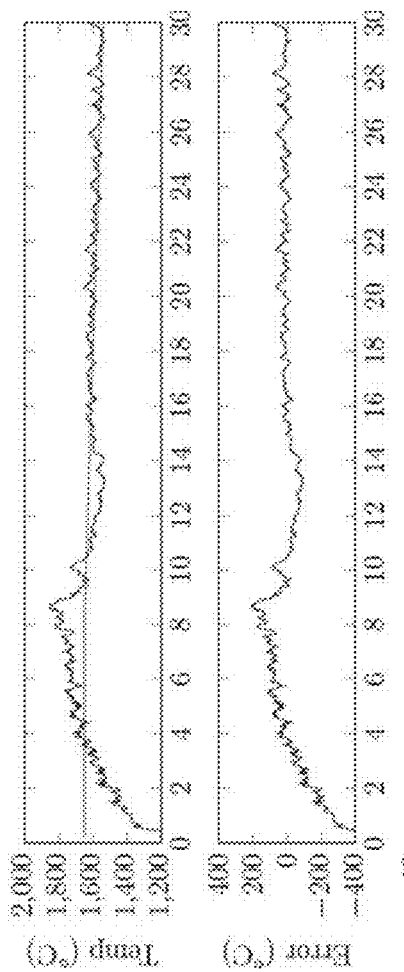
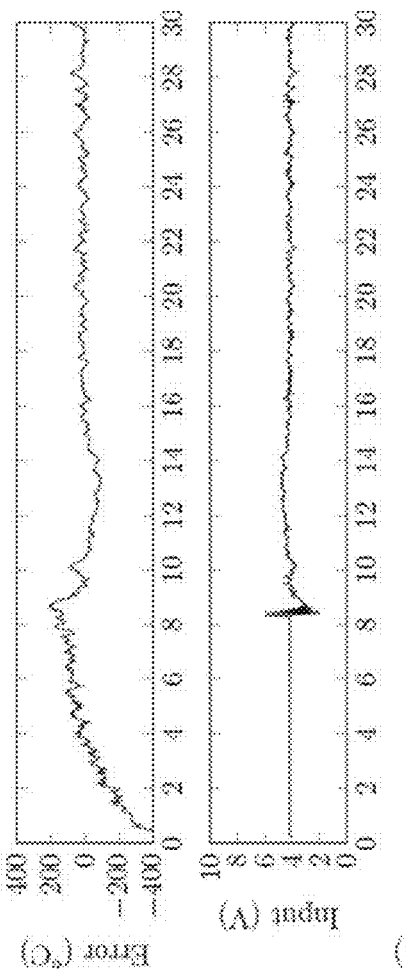
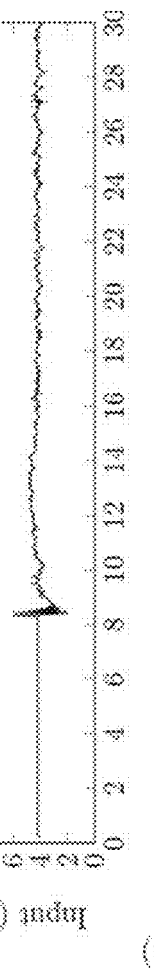
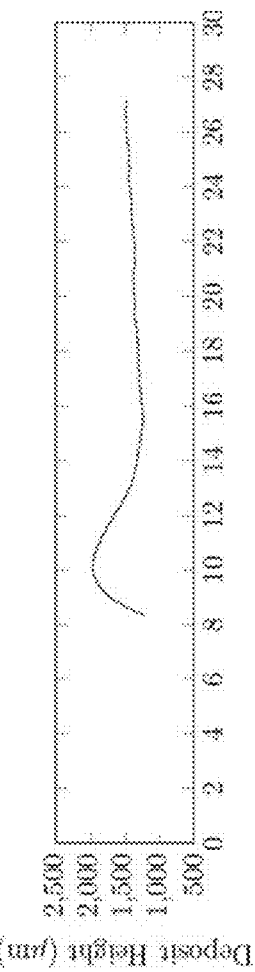
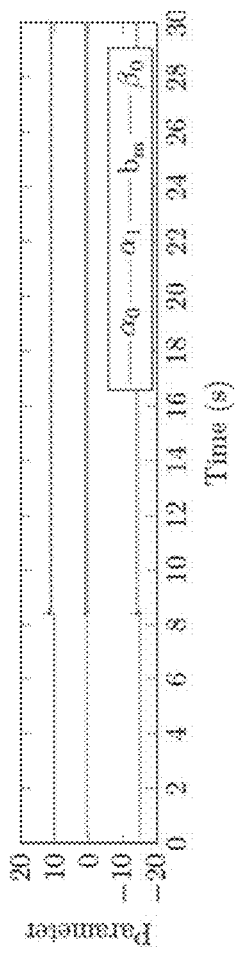
Fig. 85a
Fig. 85b
Fig. 85c
Fig. 85d
Fig. 85e

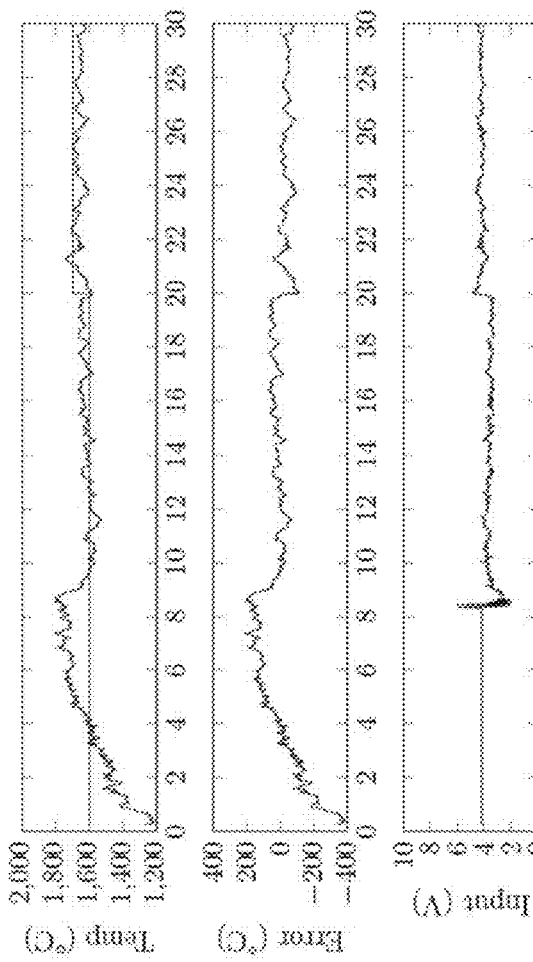
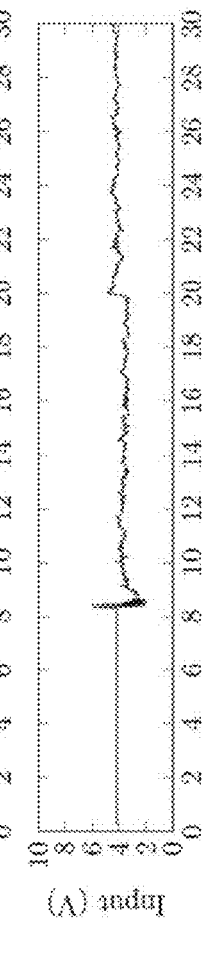
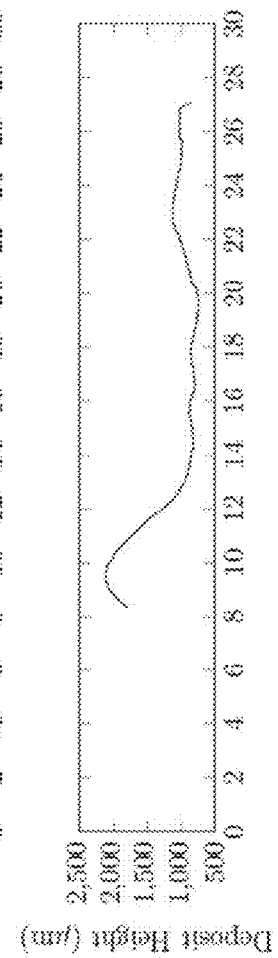
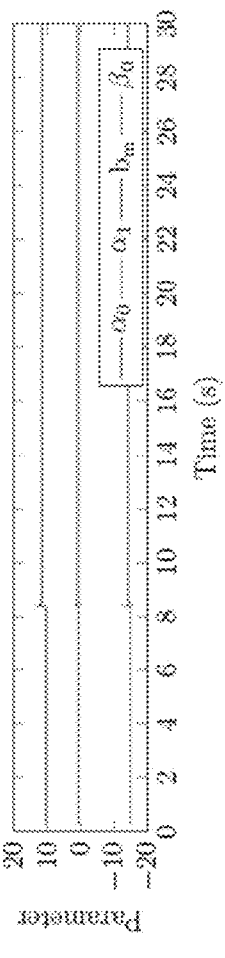
Fig. 87a
Fig. 87b
Fig. 87c
Fig. 87d
Fig. 87e

SYSTEMS AND METHODS FOR ADDITIVE MANUFACTURING AND REPAIR OF METAL COMPONENTS

CROSS REFERENCE TO RELATED APPLICATIONS

This application claims benefit, under 35 U.S.C. §119(e) to U.S. Provisional Applications No. 61/724,035 filed Nov. 8, 2012, which is incorporated herein as if set forth below.

STATEMENT REGARDING FEDERALLY SPONSORED RESEARCH

The present invention was made with United States Government support under contract number N00173-07-1-0031 awarded by the U.S. Naval Research Lab. The United States Government has certain rights in the present invention.

BACKGROUND OF THE INVENTION

1. Field of the Invention

Embodiments of the present invention relate generally to a system method for using a directed beam of energy to selectively sinter metal powder to produce or repair a part; and specifically, to the use of selective laser sintering (SLS) and scanning laser epitaxy (SLE) to produce or repair a full density metal part.

2. Background of Related Art

Since its inception in the 1930's, the gas turbine engine has grown to be the workhorse power plant of modern aircraft. Over the years, there have been significant advances in the technology related to aircraft propulsion systems and the methods of manufacturing these system components. Associated with the technological advances has been a desire to reduce engine life cycle costs by minimizing acquisition, operating, and maintenance costs. While there are many ways to reduce engine life cycle costs, one approach may be through technological developments such as advanced materials, innovative structural designs, improved aerothermodynamics, improved computational methods, and advanced manufacturing techniques.

Traditional manufacturing techniques have typically coupled the cost of manufacturing a part with the volume of parts produced. Manufacturing techniques that are designed for large scale production, such as casting and extrusion are often cost effective, but these manufacturing techniques are generally unacceptable for small quantities of parts. Another traditional manufacturing technique for producing parts is powder metallurgy which requires a tool for shaping the powder, therefore often rendering the powder metallurgy process unattractive for producing a limited quantity of parts.

Where only a small quantity of parts is desired, conventional subtractive machining methods (e.g., CNC milling machines) are often employed to produce the part. A conventional subtractive machining method utilizes the removal of a portion of the material from the initial block of material to produce the desired shape. Examples of conventional subtractive machining methods include: broaching, drilling, electric discharge machining, flame cutting, grinding, turning, etc. While the conventional subtractive machining methods are usually effective in producing the desired component, they have a multitude of limitations.

There are other manufacturing processes which are additive in nature. The type of processes that would be classified as additive in nature include plating, cladding, flame spraying, welding, laminating, etc. However, these processes are generally used in conjunction with the conventional subtractive machining techniques to produce a component that cannot be directly machined.

Solid Freeform Fabrication (SFF) is a group of emerging technologies that have revolutionized product development and manufacturing. The common feature shared by these technologies is the ability to produce freeform, complex geometry components directly from a computer generated model. SFF processes rely on the concept of layerwise material addition in selected regions. A computer generated model serves as the basis for making a replica. The model is mathematically sliced and then each slice is recreated in the material of choice to build a complete object.

An early application of SFF technologies was in the area of Rapid Prototyping (RP). RP enables engineers to quickly fabricate prototypes in a fraction of the time, and at typically less than half the cost, when compared with conventional prototyping methods. The tremendous economy of RP is facilitated by its high degree of automation, both in the design, using computer aided design (CAD), and fabrication cycles. On the manufacturing side, computer driven RP machines can accept CAD solid models as input to automatically create a physical realization of the desired component. The overall advantage of this powerful combination is the ability to rapidly iterate through several design and prototyping cycles before "freezing" the design for final production at significantly lowered costs and shorter "time to market."

Most RP technologies were initially developed for polymeric materials. These technologies allowed designers to rapidly create solid representations of their designs in a surrogate material for design visualization and verification. Further demand for functional prototypes led to the development of materials and processes that enabled production of prototype patterns and parts that could be subjected to limited testing for form and fit. Major developments have taken place next in the area of SFF known as Rapid Tooling. The focus of this area has been to develop SFF technologies to enable rapid production of prototype tooling for a variety of manufacturing techniques including injection molding, electro-discharge machining and die casting. The growth in this area has been spurred by the economical advantages of making limited run prototype tooling via SFF as compared to conventional techniques.

Over the past ten years, there has been an explosion in the development and growth of SFF technologies. These technologies can be broadly categorized into three classes, namely transfer, indirect, and direct SFF methods. Transfer methods are those methods that use a pattern or sacrificial intermediary to generate the desired component whereas "indirect" methods are those SFF methods that directly produce intermediate density parts that undergo post-processing such as conventional sintering and infiltration to attain full density. Direct methods are methods that directly produce fully dense or near fully dense complex shaped parts in the desired composition (e.g. metal, ceramic, or cermet) by applying a geometry and property transformation to the material with minimal post-processing requirements. In the context of making metal components by SFF, a number of "transfer" and "indirect" methods are available.

What is needed, however, is a direct SFF technique capable of creating functional, fully dense, metal and cermet components via the direct, layerwise consolidation of constituent powders. The system should eliminate of expensive and time-consuming pre-processing and post-processing steps. The system and method should be suitable for use with nickel and cobalt base superalloys, superalloy cermets, titanium base alloys and monolithic high temperature metals such as molybdenum. It is to such a system and method that embodiments of the present invention are primarily directed.

SUMMARY OF THE INVENTION

Embodiments of the present invention relate to a system and method of direct laser sintering of metals to perform repairs on existing parts and to create parts from powdered materials. The system can comprise a laser, a bed of powdered material, a chamber, a mirror, and, in some embodiments, a vacuum pump. The system can use the laser, or other concentrated power source, to precisely melt the powdered metal to fuse it to underlying layers. The system can repair cracks, while maintaining underlying material structure and can create fully functional parts from powdered material.

In some embodiments, scanning laser epitaxy (SLE) can be used to provide layer-by-layer additive manufacturing for the fabrication of three-dimensional objects with specified microstructure through the controlled melting and re-solidification of a metal powder placed atop a base substrate. The SLE process can be used, for example, for the repair of single-crystal (SX) turbine airfoils as well as the manufacture of functionally-graded turbine engine components.

In some embodiments, the SLE process consists of placing powder on a substrate and scanning it with a tightly focused high power laser beam. The melting and resolidification of the powder and underlying substrate are controlled by carefully adjusting the laser power and scan speed such that a particular desired microstructure can be achieved. In SLE, as opposed to selective laser melting (SLM), a portion of the underlying substrate or underlying layer can be remelted to, for example, seed the grain growth of the subsequent layer. This can enable the deposition of new material on existing parts without creation of new grain boundaries. This, in turn, can create previously unattainable single-crystal and directionally solidified microstructures in additive manufacturing. In addition, fully consolidated, porosity free, three-dimensional parts with region specific microstructures can be created.

To achieve these desired capabilities, laser parameters such as, for example and not limitation, scan speed and laser power, can be tightly controlled in real-time. Real-time control of these parameters enables the system to drive grain growth in particular directions by controlling the temperature gradients and cooling rates present during processing. The system can also regulate the amount of meltback of the prior layer. The use of real-time control algorithms enables the creation of macrostructures with pre-defined microstructural morphology.

Embodiments of the present invention can also comprise a method for controlling the above-mentioned laser and manufacturing parameters. In some embodiments, a PID controller with appropriate gains can be used to control these parameters in real-time. In other embodiments, a model reference adaptive control (MRAC) scheme can be used. In still other embodiments, a particular form of MRAC, or "one step ahead adaptive control scheme" (OSAAC) can be used.

Embodiments of the present invention can also comprise a system and apparatus for the free form fabrication of components. The system can manufacture components from a variety of materials, including materials previously thought to be "unweldable," including, for example and not limitation, aerospace superalloys. In some embodiments, function components such as, for example, gas turbine blades and other components having structures consistent with a metallurgical casting with a refined microstructure can be created.

Embodiments of the present invention can comprise a system for fabricating components for use in a gas turbine engine. The system includes a directed energy beam, such as a laser, and is adaptable to produce almost any single layer or multi-layer three dimensional metal parts. Broadly speaking, the method comprises sequentially depositing layers of metal powder into a chamber with a partial pressure atmosphere. Once a layer of powder is deposited, a scanning laser beam can selectively fuse the layer of the powder into the desired shape. The process can continue until a nonporous or fully dense part is completely fabricated, layer by layer.

These and other objects, features and advantages of the present invention will become more apparent upon reading the following specification in conjunction with the accompanying drawing figures.

BRIEF DESCRIPTION OF THE DRAWINGS

FIG. 1a depicts a side view of the SLE repair process, in accordance with some embodiments of the present invention.

FIG. 1b depicts a side view of the multi-layer SLE process, in accordance with some embodiments of the present invention.

FIG. 1c depicts the SLE repair process on a turbine blade, in accordance with some embodiments of the present invention.

FIG. 12 is an illustrative view of a laser scan path for the processing of abrasive cermet blade tips, in accordance with some embodiments of the present invention.

FIG. 13a represents a portion of the unmelted material constituents that are utilized in the direct laser process, in accordance with some embodiments of the present invention.

FIG. 13b represents a portion of the material of FIG. 13a that has been melted and allowed to solidify by the direct laser process, in accordance with some embodiments of the present invention.

FIG. 21 is a representation of a sample preparation displayed in three steps, in accordance with some embodiments of the present invention.

FIG. 22b is a representation of a processing chamber, in accordance with some embodiments of the present invention.

FIG. 65 is a representation of an illustration of the melt pool detected via connected component labeling, in accordance with some embodiments of the present invention.

FIG. 66a is a representation of a contrasting image of powder flowing smoothly into the melt pool, in accordance with some embodiments of the present invention.

FIG. 66b is a representation of a contrasting image of powder balling at the melt front due to low laser power, in accordance with some embodiments of the present invention.

FIGS. 75a-75c are a representation of a PI trial run, in accordance with some embodiments of the present invention.

FIGS. 76a-c are a representation of another PI trial run, in accordance with some embodiments of the present invention.

FIGS. 79a-79c are a representation of a measured temperature profile for the open loop trial with smoke extractor in place, in accordance with some embodiments of the present invention.

FIGS. 84a-84e are a representation of a measured temperature profile for a trial with a constant 1650° C. reference temperature with an average error of 5.80° C., in accordance with some embodiments of the present invention.

FIGS. 85a-85e are a representation of a measured temperature profile for a trial with a ramp down from 1650° C. to 1500° C. reference temperature with an average error of 8.73° C., in accordance with some embodiments of the present invention.

FIGS. 87a-87e are a representation of a measured temperature profile for a trial with a step from 1600° C. to 1700° C. reference temperature, having an average error of −16.66° C., in accordance with some embodiments of the present invention.

DETAILED DESCRIPTION

Figures 2A, 2B, 2C:
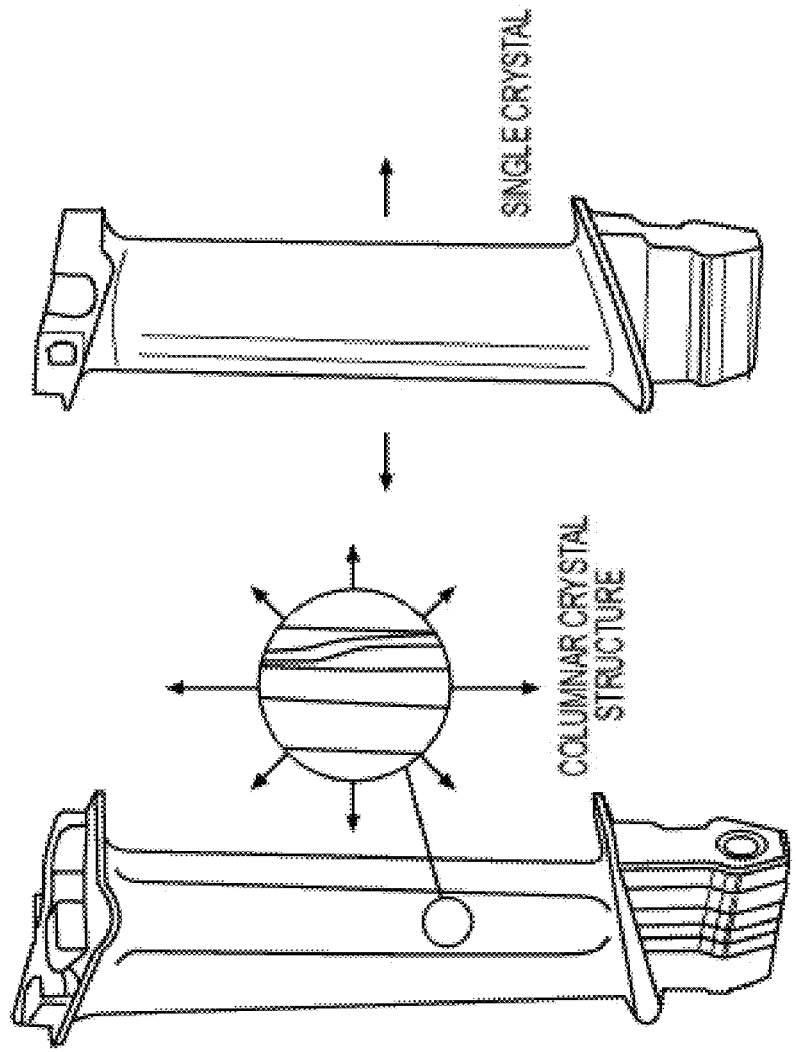
FIG. 2a depicts a turbine blade with an equiaxed crystal structure.
FIG. 2b depicts a turbine blade with a columnar crystal structure.
FIG. 2c depicts a turbine blade with a single crystal structure.

Embodiments of the present invention relate generally to additive manufacturing and repair techniques, and more specifically to a system and method for creating and repairing parts using selective laser sintering (SLS) and scanning laser epitaxy (SLE). The system can comprise a high-powered laser, a highly accurate control system, and a bed of powdered material that can be melted and solidified in place. The system can be used to repair parts that, for example, are cracked, eroded, or damaged during use. The system can also be used to create whole parts from powdered raw materials. The system can also be used to create whole parts from solid partial parts to which material is added in the form of melted and resolidified powdered material.

To simplify and clarify explanation, the system is described below as a system for creating and repairing turbine blades for jet turbine engines. One skilled in the art will recognize, however, that the invention is not so limited. The system can be used to repair a variety of parts manufactured from materials that can be melted and resolidified. The system can also be used to manufacture parts from these materials.

The materials described hereinafter as making up the various elements of the present invention are intended to be illustrative and not restrictive. Many suitable materials that would perform the same or a similar function as the materials described herein are intended to be embraced within the scope of the invention. Such other materials not described herein can include, but are not limited to, materials that are developed after the time of the development of the invention, for example. Any dimensions listed in the various drawings are for illustrative purposes only and are not intended to be limiting. Other dimensions and proportions are contemplated and intended to be included within the scope of the invention.

As described above, a problem with conventional manufacturing techniques is that they are wasteful and time consuming. Traditional subtractive techniques, such as CNC milling, can provide accurate machining, but result in high material costs due to the removal of material during machining. Traditional additive techniques, on the other hand, tend to produce final products that have voids, or other defects, that reduce the quality of the finished product. In addition, traditional methods are unable to operate at the temperatures and other environmental factors required for advanced materials such as nickel superalloys.

Embodiments of the present invention, on the other hand, are related to Direct Selective Laser Sintering (Direct SLS), which is a direct SFF technique. Direct SLS is a laser based rapid manufacturing technology that can enable production of functional, fully dense, metal and cermet components via the direct, layerwise consolidation of constituent powders. In Direct SLS, a high energy laser beam can directly consolidate a metal or cermet powder to a high density (>80%), with minimal or no post-processing requirements. In comparison with "indirect SLS," direct SLS is also a binderless process. Direct SLS also does not involve furnace de-binding and infiltration post-processing steps as in "indirect SLS." Compared to conventional bulk metal forming processes (e.g. casting or forging); direct SLS does not require the use of patterns, tools or dies. The metal powder being processed by direct SLS directly undergoes a shape and property transformation into final product that may require minimal post-processing such as finish machining.

Several processing requirements differentiate direct SLS of metals from SLS of polymers or polymer coated powders. An important distinguishing characteristic is the regime of high temperatures involved in direct SLS of metals. At the temperatures necessary for processing metals of interest (generally >1000° C.), for example, the reactivity of the melt poses serious process control issues. Control of the processing atmosphere is significant because it enables successful layerwise buildup and also addresses safety concerns. In some embodiments, known as SLS/HIP, discussed below, SLS processing can take place under vacuum to ensure full densification of the canned shape during HIP post-processing.

Conventionally, no work has been done on direct SLS of high performance materials, such as, for example and not limitation, Nickel and Cobalt base superalloys, superalloy cermets, titanium based alloys, and monolithic high temperature metals such as Molybdenum. These materials are often used for high performance components that typically experience high operating temperatures, high stresses, and severe oxidizing or corrosive environments. Direct SLS, with its ability to produce components in such materials is especially useful for functional prototype, low volume or "one of a kind" production runs. To manufacture a typical prototype lot of 100 superalloy cermet abrasive turbine blade tips, for example, direct SLS can achieve acceptable microstructure and properties with 80% cost savings over the traditional methods.

Embodiments of the present invention can also comprise a hybrid net shape manufacturing technique known as Selective Laser Sintering/Hot Isostatic Pressing (SLS/HIP), which exploits the freeform shaping capabilities of SLS combined with the full densification capability of HIP to rapidly produce complex shaped metal components. SLS/HIP is a significantly faster, lower cost, highly automated, flexible replacement for conventional powder metallurgy and HIP processes that are currently employed in the naval and aerospace defense sectors for the manufacture of low volume or "one of a kind" high performance components.

Embodiments of the present invention can also comprise Scanning Laser Epitaxy (SLE). SLE is a new direct digital manufacturing (DDM) technique that enables the creation of three dimensional nickel-based superalloy components using an incremental layering system. The system can create functionally graded materials, with specified microstructure and other attributes, to allow the formation of heterogeneous multifunctional components (HMCs). HMCs are commonly found in the aerospace industry engine components due to the extreme temperature and pressure that are induced inside a turbine engine. Turbine blades, for example, are a critical part of the engine that are used to extract energy from the high temperature and high pressure environment created by the combustor, are the current focus for the SLE technique. Turbine blades generally utilize advanced nickel-based superalloys, materials which exhibit the ability to withstand large loads at high temperature and pressure. The blades include complex geometry to allow for the cooling of the blade through the incorporation of airflow, and an advanced microstructure, which increases the load the superalloy can sustain during operation. The SLE manufacturing technique is capable of working with these advanced alloys, conforming to the shape of the component and extending the existing microstructure into the repaired section.

SLE can also produce a three dimensional object through the creation of individual layer deposits. The underlying substrate, which can be, for example, an initial seeding piece or a previously created layer, has a metal powder placed over it before being processed. For each layer a highly focused laser can be used to melt and re-solidify the metal powder and a portion of its underlying substrate to allow any underlying microstructure to be extended into the newly developed segment, as seen below.

As shown in FIGS. 1a-1c, a significant application of the SLE process is in the creation and repair of turbine blades in the aerospace industry. The final blade can comprise multiple microstructures throughout its volume including single crystal (SX), columnar, and equiaxed. By remelting a small portion of a substrate, the microstructure used in the previous section of the turbine blade can be extended into the new area. This is especially important for single-crystal components as it enables the creation of new material without a grain boundary. This requirement has heretofore labeled SX materials as non-weldable. The process also mitigates other problems, such as hot tearing and cracks that can arise in other repair techniques.

In some embodiments, an energy source 105, such as a laser, can be used to melt metal powder 115 to form a new layer of material 110 with the same properties as the underlying material 125. For a turbine blade 125, for example, the system can produce a layer 110, while maintaining single crystal structure, for example. In other embodiments, the system can be used to create multi-layer 135 parts from metal powder 115 using the laser 105. In either case, the melt pool 120 can be closely controlled to create material with the desired properties (e.g., single crystal). In some embodiments, the specified microstructure 130 can be controlled to produce, for example and not limitation, an equiaxed, columnar, or single crystal structure.

The optimization of SLE for a new metal alloy requires the optimization of its three primary settings: laser power, the laser scanning speed and the number of repeated scans performed at the initial edge of the sample to establish a melt pool. These three settings allow for the establishment of a stable melt pool and temperature gradient which can effectively seed and grow any desired microstructure within the newly placed material. The three research areas that lend to complete microstructure control are process modeling, properly controlling the creation of a part and characterizing the created components.

By creating a model of the system, for example, the number of experimental runs needed to find the ideal settings for a part is reduced. This, in turn, lowers the material cost, while improving efficiency. When creating a part, the use of an advanced control system enables exact heat distribution in each layer, while also giving the process the ability to conduct on-the-fly repairs to keep the sample within the specified parameters. The microstructure of each manufactured part can then be analyzed to determine what occurred at the particular runtime settings and to improve the settings for the final product.

Embodiments of the present invention relate to improving the microstructure analysis by use of a program that can track various features found in samples produced through the SLE technique and a design of experiment (DOE) program to provide greater insights into how the SLE settings influence the microstructure. The system can use optical micrographs, for example, and can be quickly completed using a typical laboratory computer through the use of Matlab, or other suitable software. This can enable the creation of an automated system for identifying ideal parameters that bridge the low end microstructure tracking, conducted by eye or basic feature recognition programs, and the more time-consuming and costly techniques, such as EBSD. The use of this mid-range microstructure tracking and analysis program can be used to find the optimal settings for every new material, microstructure layout, deposit height, sample size, etc. This program can also enable the SLE technique to be used for casting repair.

Conventional programs are not designed to distinguish between different manufacturing techniques. EBSD, for example, provides great detail of the crystal orientation across an entire sample, but does not differentiate between the cast and laser-processed regions. Creating a custom microstructure analysis program for SLE allows the inclusion of features never before considered to be considered when choosing processing parameters. The system can also allow the inclusion of every useful sample, due to its rapid execution. This capacity can provide greater insight into the SLE process parameter-microstructure relationships.

As mentioned above, an initial application of SLE is to repair damaged and worn turbine blades. Hundreds of turbine blades are used in a single engine and are critical to its efficiency. After extended use, however, the edges of the turbine blade, which are located near the inner wall of the engine, begin to degrade. After as little as one millimeter of wear on a turbine tip, the efficiency of the engine can drop drastically, caused by the excess air that can now bypass around the turbine blade past the worn section.

Normally, the worn turbine blades are not repaired, but instead are replaced with a new blade. This has a huge effect on the operating cost of the engine, however, because a single blade can cost hundreds to tens of thousands of dollars. The average expected lifecycle of a turbine blade is approximately three years, or 5 million miles of flight, though each blade must be routinely checked for earlier failure. Turbine blade tip repair is a promising alternative and is being pursued to allow for a low cost alternative to the current replacement program.

Several processes are being developed to perform repair work on damaged turbine blades, though all have significant problems. Selective laser melting (SLM), direct metal laser sintering (DMLS), and shape deformation manufacturing (SDM) tend to have similar flaws in their repair work.

Excessive meltback depth and warping can lead to delamination of layers and cracking in the samples. If the melt viscosity is too high during a process, for example, then the creation of small spheres at the laser interaction area, known as balling, can occur. During the solidification of the sample, if the strain caused by the shrinkage cannot be accounted for in the elastic and plastic deformation of the material then hot tearing can occur.

The level of microstructure control and formation is also problematic for competing repair techniques. Nickel-based superalloys, for example, have shown a strong susceptibility to stray grain formation during manufacture, especially with processes like SLM. Unlike the SLE process, the aforementioned manufacturing techniques are also incapable of extending a single crystal microstructure.

The issues that arise in SLM, DMLS, and SDM are not found or are greatly diminished in the SLE process when substantially optimized parameters are used for each specific material. Reducing these problematic features while creating the needed microstructure within the part can be achieved by finding the optimal SLE settings for each alloy. As mentioned above, three important variables that can be controlled during the process are laser power, laser scanning speed, and the number of initial repeated scans.

To find the optimal settings for each new material a series of experiments can be conducted. For each experiment, a metallographic image can be used to evaluate several broad microstructure characteristics and problematic features. Basic trends can initially be found through naked eye comparison and intuition. After a suspected trend for each parameter has been found and a general area of interest has been located, several DOEs can be conducted to find optimal settings. Using the simple parameter measurements described above, the DOEs performed can find trends and the optimal variable values to create quality and repeatability.

Using digital optical micrographs, which can be quickly and routinely created for each experimental run, a full understanding of the microstructure can be found and utilized. Using a custom-made quantitative metallographic program, every needed microstructure detail can be recognized, isolated, and recorded. Using this tracking data for every usable part, and the corresponding SLE settings, both a statistical analysis and an optimization process can be conducted. The statistical approach can enable ready comparison between samples, so that trends and relations can be visualized. The inclusion of a sequential analysis DOE program can conserve costly materials and processing time, while providing relevant data to create an optimally fit, piecewise relation equation between the SLE parameters and each measured response.

Manufacturers of present day turbine engines, as found in high performance jet aircraft and energy generation systems, strive to increase engine efficiency and drive down costs. Increasing the operating temperature of a turbine engine can increase efficiency, but this is limited by the properties of the materials used inside of the engine. The high temperature components of turbine engines today can reach temperatures of over 1200° C., limiting the usable materials to those that exhibit a resistance to creep and fatigue at high temperatures. Nickel-based superalloys are one of these materials and are currently the most common materials used for the high temperature components of high performance jet aircraft. Despite the superior properties of these Ni-superalloys, they are still pushed to their performance limits.

To further increase the strength and durability of the turbine components, these Ni-superalloys are now cast with particular microstructural morphologies that can better withstand the extreme operating conditions. As shown in FIGS. 2a-2c, there are three microstructural morphologies typically found in cast turbine components: polycrystalline or equiaxed, directionally-solidified, and single-crystal. Turbine components cast with a polycrystalline morphology tend to be susceptible to failure because they contain some grain boundaries that are transverse to the longitudinal direction of the blades or to the main axis of stress. Directionally-solidified blades, on the other hand, only have grain boundaries in a single direction perpendicular to the main axis of stress, resulting in a more durable blade. Finally, single-crystal, or monocrystalline, components contain no grain boundaries and are the most desirable because they require no grain-boundary strengthening alloying components, such as boron and carbon. These components, which would otherwise be necessary, are undesirable because they lower the melting point of the alloy, adversely impacting the fatigue life of the component.

Despite being cast with advanced single-crystal microstructures, turbine blades still have a limited operating life due, in part, to material loss at the blade tip resulting from abrasion between the blade and the engine shroud. Once a blade has experienced a certain amount of material loss, typically on the order of 0.5-1 mm on an 8 cm tall blade, it must be scrapped and replaced. Replacing each of these blades becomes quite expensive due to the difficulty involved in casting SX components. Thus, a process capable of repairing and reconditioning these blades such that they can be replaced in an engine is very desirable.

Currently, there is no effective way of repairing turbine blades that have been cast with a directionally solidified or single-crystal morphology because these alloys are considered "non-weldable" or "non-joinable." Although many processes such as laser-engineered net shaping (LENS) and various welding operations have been tried, each of these processes has been encumbered by crack formation or stray grain growth.

LENS and epitaxial laser metal forming (ELMF) are two analogous cladding processes that have been applied to the repair of cracks that form on the platform of a turbine blade. In both of these processes, a high power laser is focused onto the specimen and a melt pool is formed. Metal powder is then blown into the melt pool at the focal point of the laser and a deposit is created that follows the raster scan pattern of the laser. This method of repair has typically been plagued by crack formation, the formation of equiaxed grains, as well as grain multiplication that occurs when dendrite arms are separated from their main dendrites due to remelting. Repair processes based on welding have also been susceptible to similar issues such as cracking and stray grain formation. It has been hypothesized that these issues can be minimized or avoided by expanding the operating range over which scanning takes place.

In contrast, the SLE process is capable of operating at much higher scan velocities because the laser can be scanned using a set of high speed galvanometer scanners and is not mechanically attached to, or impeded by, any powder blowing mechanism. Additionally, the use of a pre-placed powder bed in the SLE process eliminates any melt pool disturbance that would be caused by the powder blowing mechanism used in cladding processes, removing another potential cause of poor microstructure formation. The SLE process can also avoid issues with hot tearing and liquation cracking found when using similar processes on a number of materials previously thought to be "non-weldable" and "non-joinable."

The high resolution scan spacing used in the SLE process can enable each subsequent raster scan to overlap a portion of both the prior and the next raster scans resulting in a pre-heat and post-heat treatment during the scanning operation. This, in turn, can eliminate any hot tearing as seen in other processes. The high resolution scan spacing also enables a finer grain structure to develop in the deposits made via SLE, which exposes a large boundary area and limits the stresses that would otherwise cause liquation cracking. These features of SLE have shown that it is possible to work with materials such as, for example and not limitation, Rene-80 that are highly susceptible to liquation and strain-age cracking and were previously deemed unweldable. Further control of the temperature gradients present in the process in real-time can only serve to further improve the SLE process and limit the surface tension-driven instabilities that cause many of these hot tearing and other cracking phenomena.

Another advantage of the SLE process is its ability to create functionally-graded microstructures. A number of applications for turbine components with functionally graded microstructures have been identified. One example is that of a turbine disc made of a superalloy composition with equiaxed structures of radially increasing grain size. The smaller grains at the inside of the disc offer better tensile capabilities, while larger grains towards the outside offer superior resistance to fatigue and creep. Typically components like these require numerous long processing steps and lengthy thermal treatment times to produce the functionally graded microstructures. In contrast, SLE enables the production of these components in a single processing step, while also enabling complex internal features due to the layer by layer processing.

Figure 3:
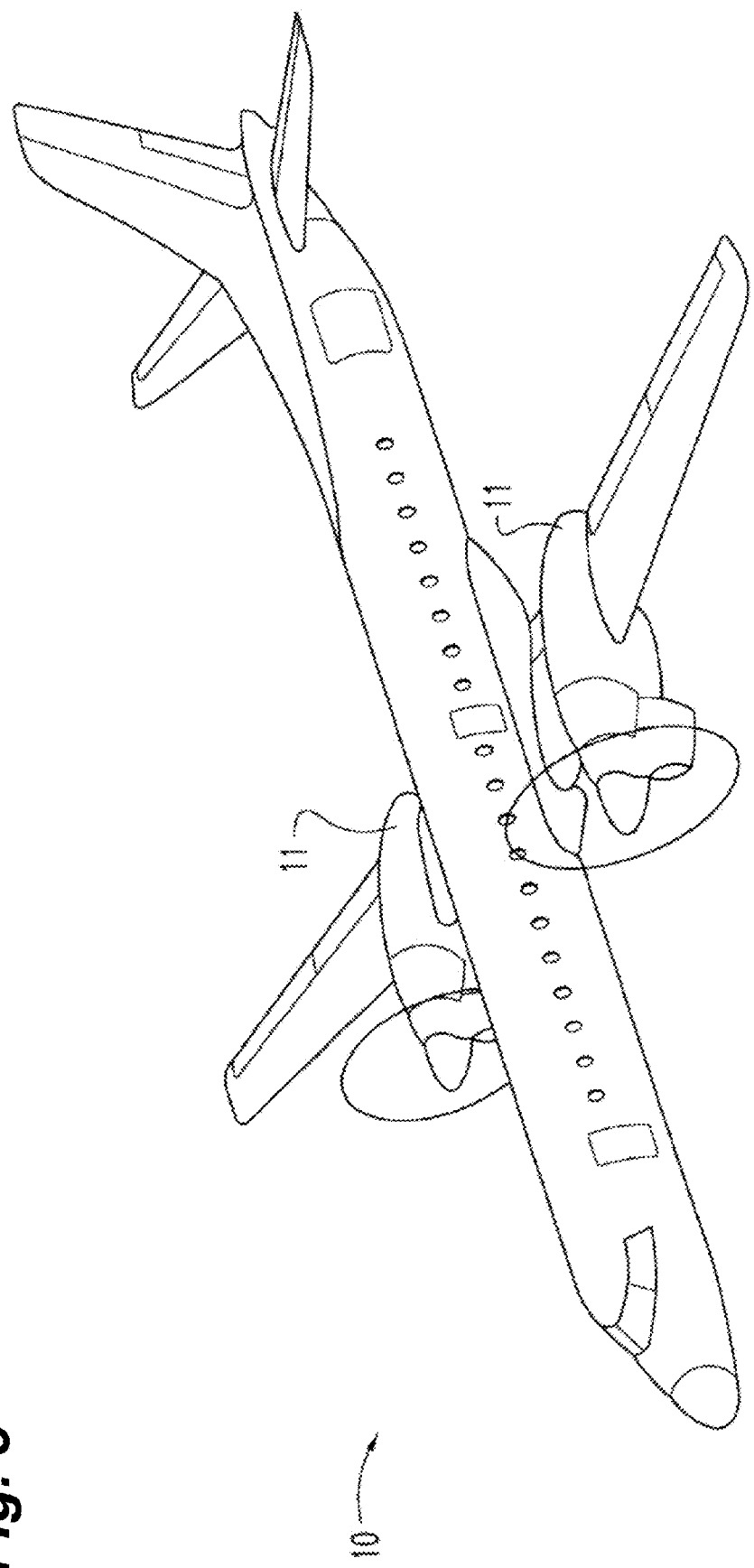
FIG. 3 is a perspective view of an aircraft having gas turbine engines.
Figure 4:
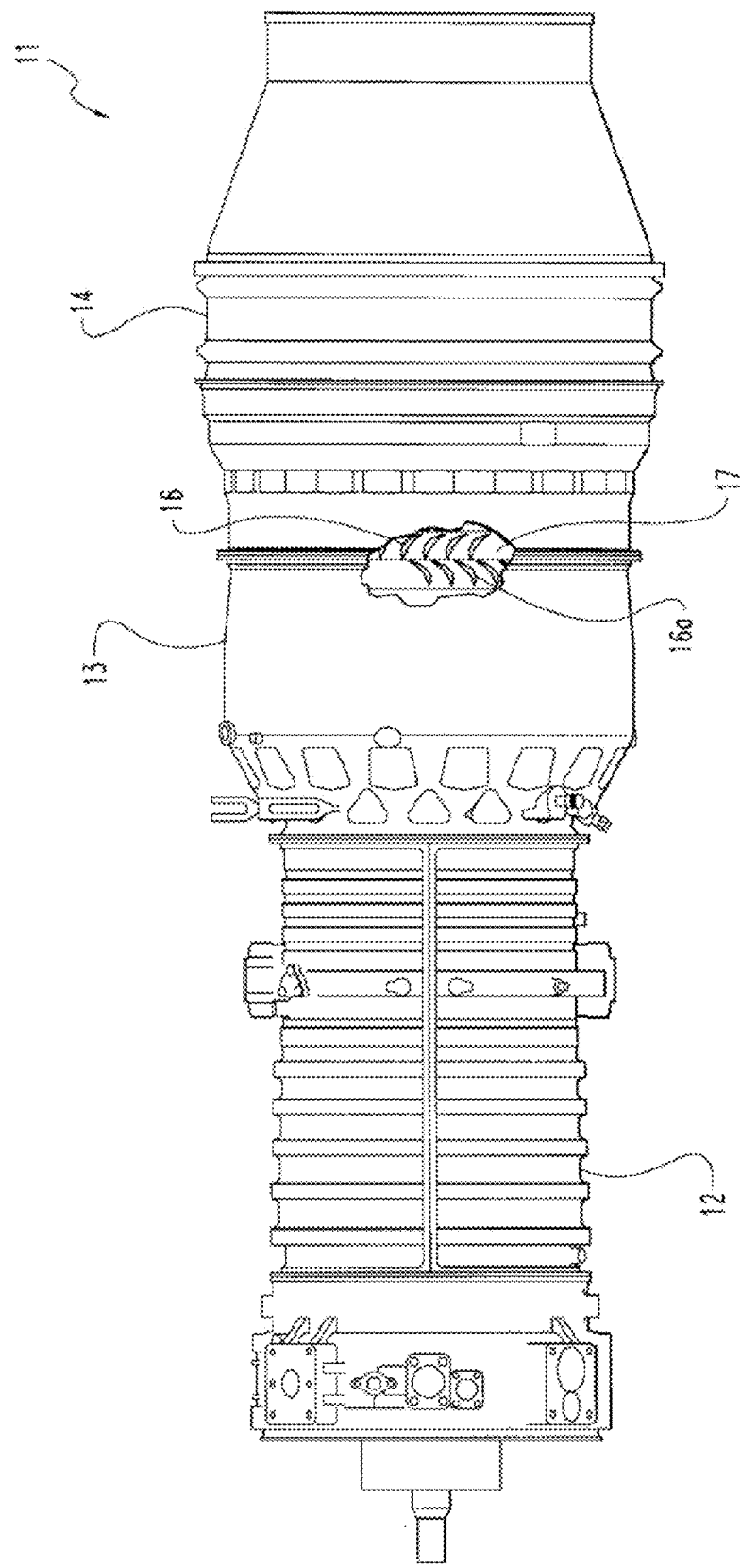
FIG. 4 is a side, partial cutaway view of a gas turbine engine.

FIGS. 3 and 4 illustrate an aircraft 10, including an aircraft flight propulsion engine 11. It is understood herein that an aircraft is generic and includes helicopters, tactical fighters, trainers, missiles, and other related apparatus. In addition, other applications of turbine engines include, but are not limited to, power plants, watercraft, and motor vehicles.

As shown, the flight propulsion engine 11 includes a compressor 12, a combustor 13, and a power turbine 14. One of skill in the art will recognize that there are multitudes of ways in which the components can be linked together. Additional compressors and turbines can be added with intercoolers connected between the compressors and reheat combustion chambers could be added between the turbines. Further, the gas turbine engine is equally suited to be used for industrial applications. Historically, there has been the widespread application of industrial gas turbine engines, such as pumping sets for gas and oil transmission lines, electricity generation, and naval propulsion.

Figure 5:
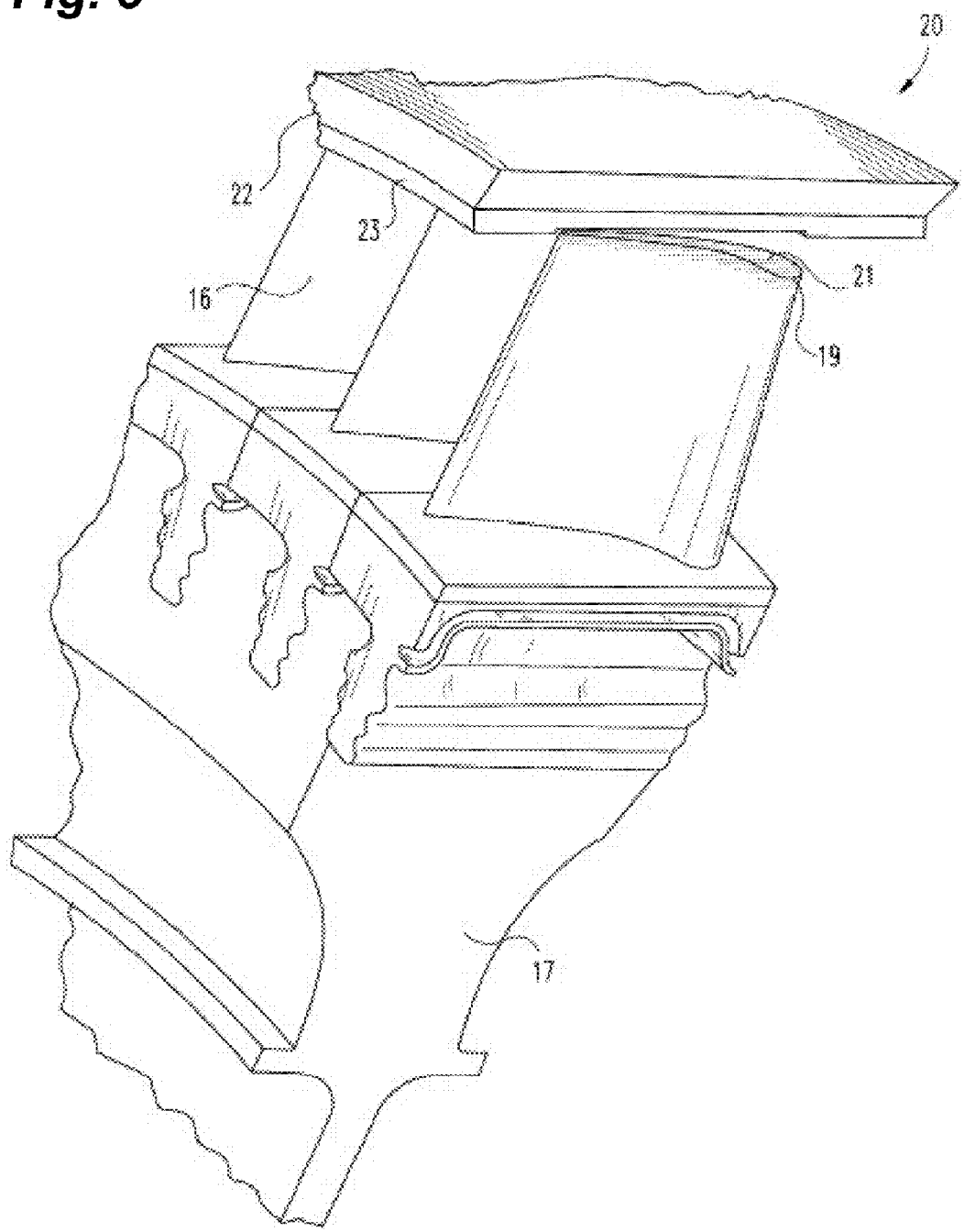
FIG. 5 is a partial, perspective view of a seal system of a gas turbine engine.

As shown in FIG. 5, there is illustrated the enlarged partially fragmented view of the gas turbine engine 11. The gas turbine engine 11 having a rotor disk 17, with a plurality of turbine blades 16 mounted thereto, that is coupled to a shaft (not illustrated) within the gas turbine engine 11. A plurality of turbine vanes 16a form a nozzle within the gas turbine engine for directing the flow of working fluid relative to the blades 16. In some case, the working fluid is air extracted from the compressor 12.

FIG. 5 also depicts a portion of a working fluid sealing system 20. The sealing system 20 is designed to minimize the leakage of working fluid away from and around the working fluid path. The efficiency of the gas turbine engine is largely dependent upon the ability to control and minimize the leakage of this working fluid. Thus, the clearance between the tip 19 of the turbine blade 16 and the static structure 22 of the gas turbine engine assists in controlling the bypassing of the rotor 17 and turbine blades 16 by the working fluid. Clearance between the rotating and static components (21 and 23 respectively) changes with the expansion and contraction of the components due to the thermal cycling occurring in the gas turbine engine.

The sealing system 20 can comprise the two corresponding components that form a virtual seal between the rotating and static components. The two components are an abrasive component 21 that is coupled to the turbine blade 16, and a stationary abradable component 23 which is coupled to the stationary component 22. The stationary abradable component 23 is often referred to as a shroud and is a member that circumscribes the rotor disk 17 and blades 16 while covering a portion of the stationary component 22.

The turbine blade 16 with abrasive component 21 rotates relative to the abradable component 23 to wear-form a virtual seal track in the abradable component 23. The rotation of the rotor disk 17 with turbine blades 16 coupled thereto allows the abrasive components 21 to abrade the abradable component 23 when there is no clearance between the respective components. A particular aspect of the abrasive component 21 is the ability to withstand repeated and severe encounters with the abradable component 23 with only minimal loss of material from the abrasive component 21 and preferential wear of the abradable component 23. Thus, instead of a rubbing interface between the components 21 and 23 when the radial clearance therebetween has disappeared, the abrasive component 21 cuts the abradable component 23 to maintain a minimum clearance therebetween. The abrasion of the abradable component 23 by the rotating abrasive component 21 forms a fluid passageway between the rotating components. In one form of the present invention, the abradable component 23 is a semi-porous abradable ceramic that is generally known to those of ordinary skill in the art.

Figure 6:
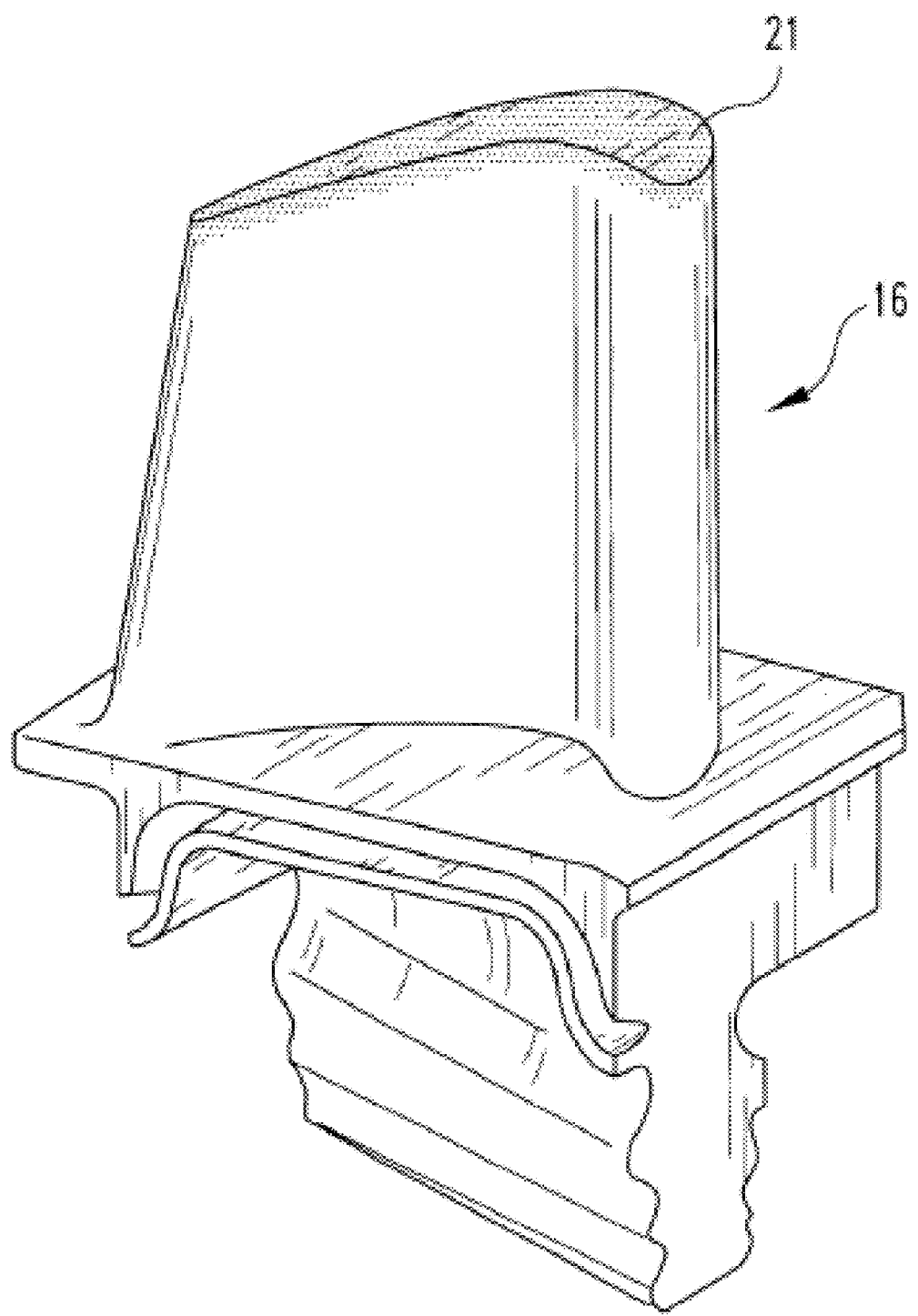
FIG. 6 is a perspective view of a turbine blade from FIG. 5, with an abrasive cermet tip, in accordance with some embodiments of the present invention.

FIG. 6 depicts an exemplary turbine blade 16. The turbine blade 16 can be of a wrought or cast structure. The gas turbine blade 16 can be, for example, a unitary cast alloy structure produced by a precision casting operation utilizing various super alloy compositions. Various types of nickel, titanium, and cobalt super alloy compositions and manufacturers of such compositions are known to those skilled in the art. Most super alloy compositions of interest are complicated mixtures of, for example and not limitation, titanium, tin, vanadium, aluminum, molybdenum, silicon, neodymium, nickel, cobalt, chromium, aluminum, titanium, iron, tungsten, tantalum, rhenium and other select elements. Some exemplary materials are generally known by the trade names CMSX-3, CMSX-4, and MARM-247.

Of course, the application of embodiments of the present invention is not intended to be limited to the above materials, and can be utilized with other materials. A technique for producing a cast unitary turbine blade 16 having equiaxed, directionally solidified or single crystal alloy structures is disclosed in U.S. Pat. No. 5,295,530 to O'Connor which is incorporated by reference herein. A gas turbine blade and a gas turbine vane are often referred to as an airfoil.

The abrasive component 21 can be metallurgically bonded to the blade 16 without the presence of a brazing element or other lower melting temperature joining materials. Elimination of the low melting point braze element produces a brazeless cermet having an extended oxidation life and the capability to withstand exposure to higher operating temperatures than components having a brazed element. The abrasive component 21, comprising an abrasive cermet composition, can include a metal powder superalloy matrix combined with ceramic abrasive particles. In some embodiments, the ceramic abrasive particles can be coated with a reactive material. In other embodiments, the ceramic abrasive particles are not coated with a reactive material.

In some embodiments, the abrasive component 21 can comprise about 0 wt. % to about 50.0 wt. % ceramic abrasive particles coated with a reactive metal, and about 50.0 wt. % to about 100.0 wt. % superalloy. The ceramic abrasive particles can comprise a ceramic grit material, which can comprise, for example and not limitation, one or more of the following: cubic boron nitride, manmade diamond, silicon carbide, and aluminum oxide, or combinations thereof. In some embodiments, the ceramic abrasive particles can have a grit size in the range between 80 mesh size and 120 mesh sizes. Of course, other particle sizes and ceramic grit materials are contemplated herein.

The reactive material can be, for example, titanium, which serves to wet the surface of the ceramic abrasive coating to promote a metallurgical bond between the particles and the metal matrix. The titanium coating can be applied using, for example, fluid bed chemical vapor deposition techniques to ensure uniformity of the coating on the particles. Of course, other suitable processes known in the art are acceptable. The ceramic abrasive particles may be homogenous or graded through any portion thereof.

In some embodiments, the bed of material that forms the abrasive component 21 can be subjected to a direct through thickness laser processing which causes the metal matrix material to become molten, solidify, and bond with the turbine blade 16. Direct laser processing is a manufacturing technique for fabricating parts from a powder bed, and details pertaining to the direct laser process utilized to make the abrasive tipped blade 16 are provided below. This method is applicable to an entire region of material, a select region of material, and for cutting portions of the component. The direct tipping of the blade with the abrasive component 21 through the direct laser process produces a component free of the life degradation that results from many prior art methods that includes the addition of melting point depressants typically present in braze alloys and/or that require exposing the components to a high temperature brazing and/or a diffusion bonding thermal cycle which degrades the morphology of the strengthening phase.

Figure 7:
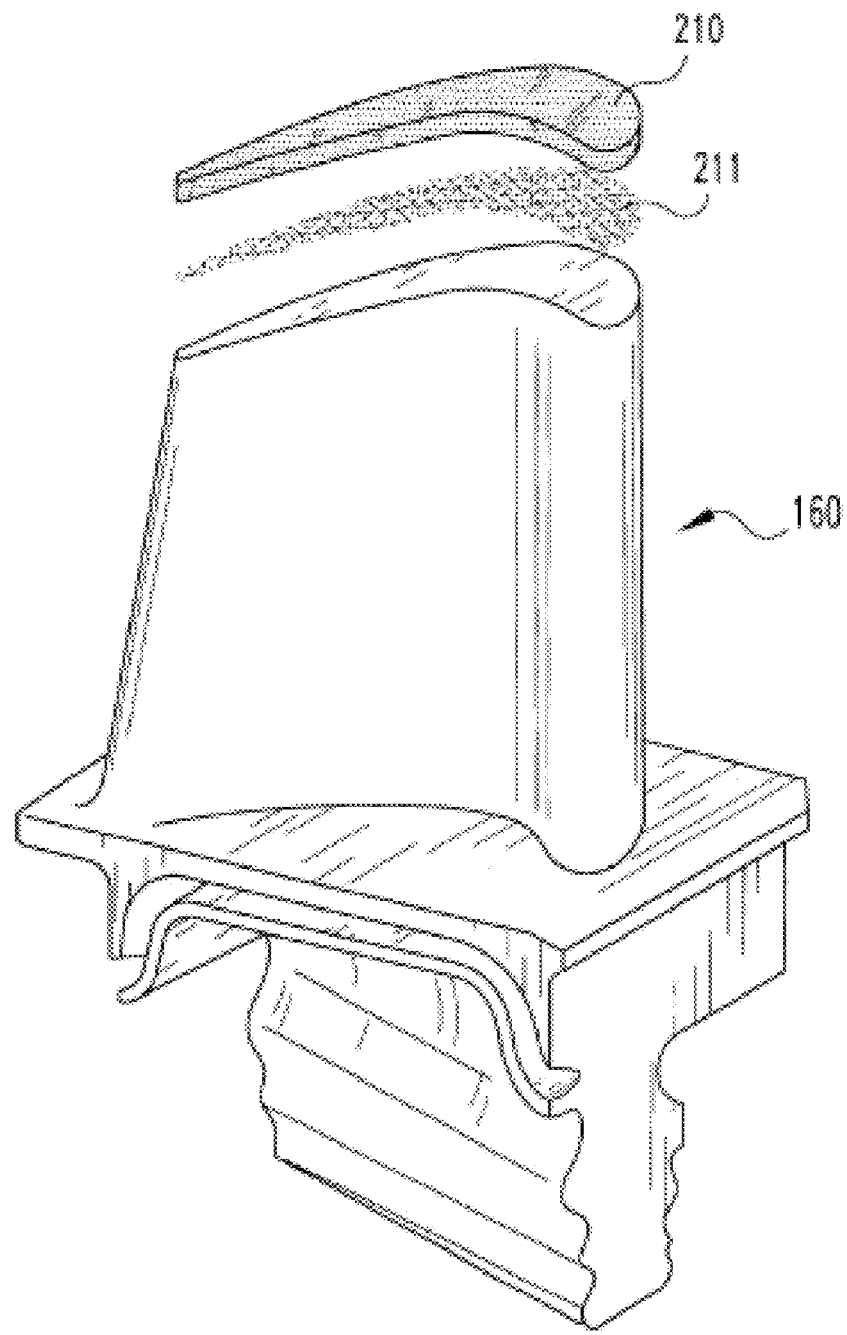
FIG. 7 is a partially exploded view of another gas turbine blade with an abrasive cermet tip, in accordance with some embodiments of the present invention.

FIG. 7 depicts another gas turbine engine blade 160 with an abrasive cermet component 210 coupled thereto by a secondary joining operation. The secondary joining operation is generally a brazing operation utilizing a brazing material 211 that couples the abrasive component 210 to the blade 16. In some embodiments, the abrasive component 210 can be fabricated by the direct laser process that is used to produce the abrasive component 21. Thereafter the abrasive component 210 can be joined to blade 160 with the brazing material 211.

Figure 8:
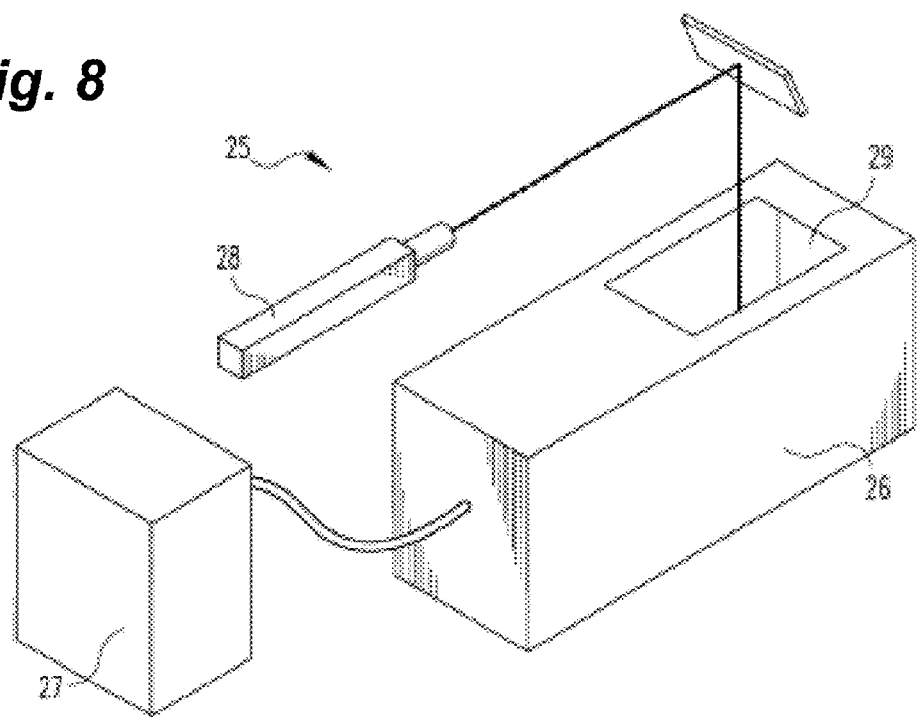
FIG. 8 is an illustrative view a direct laser processing workstation, in accordance with some embodiments of the present invention.

FIG. 8 depicts an apparatus 25 for performing the direct laser processing of a powder bed of material to produce a free form fabrication. The term free form fabrication as used herein includes, unless otherwise specified, the capability to make a solid and/or hollow part. Apparatus 25 includes a chamber 26 within which the direct laser process takes place, and a laser 28 for performing the melting of the material that is then allowed to solidify.

In some embodiments, the chamber 26 can be a fluid tight pressure vessel with a vacuum pumping system 27 coupled thereto for changing the atmosphere within the chamber, and a heat source capable of heating the powder bed of material 30 (FIG. 9) to elevated temperatures. Preheating of the powder material bed 30 prior to the laser beam melting and solidifying aids in the outgassing of the material and improves surface characteristics, wetting, and flow, among other things. Chamber 26 is designed and constructed so as to maintain a high purity atmosphere of select gases. The heat source can be located internal or external to the chamber 26 and can be capable of accurately heating and controlling the powder bed to temperatures within the range from ambient temperature to approximately 2000 degrees centigrade. The vacuum source is preferably capable of providing a high vacuum.

In some embodiments, the laser melting and solidifying of the material can occur when the material bed is at an elevated temperature thereby improving dimensional stability. In one embodiment, temperatures within the range of about 500 degrees centigrade to 750 degrees centigrade can be used for the material bed during the direct laser processing-melting and solidification stages. In another embodiment, temperatures greater than 750 degrees centigrade can be used for the material bed during the laser processing. In some embodiments, the vacuum can be in the range of about $5 \times 10^{-3}$ Torr to about $1 \times 10^{-7}$ Torr, and preferably about $5 \times 10^{-5}$ However, other pressures are contemplated herein.

In some embodiments, the chamber 26 can be thought of as being analogous to a vacuum furnace that can be adjusted to provide a tightly controlled atmosphere within the chamber. The control of the atmosphere is characterized by the ability to regulate the chemical makeup of the gas within the chamber, degree of vacuum, and temperature. In other embodiments, an inert atmosphere can be utilized to suppress the volatilization of the material constituents within the chamber 26.

The laser 28 can provide a beam that selectively melts and allows the resolidification of the material within the chamber 26. Other means for melting the material contemplated herein include, but are not limited to, ultrasound, x-ray, and microwave. In some embodiments, the chamber 216 can have a sealed, laser transparent window 29 to enable the passage of the laser beam therethrough. In other embodiments, the system can comprise a disposable or indexable laser transmission window apparatus to compensate for window clouding and deposits. Thereby allowing the ready return to a more completely transparent laser transmission window for facilitating process control and reproducibility. The means for melting the material could be confined within the chamber 26, the means could be external to the chamber and passable through an opening in the chamber, and/or delivered through a medium coupled to the chamber such as a fiber optic cable.

Figure 9:
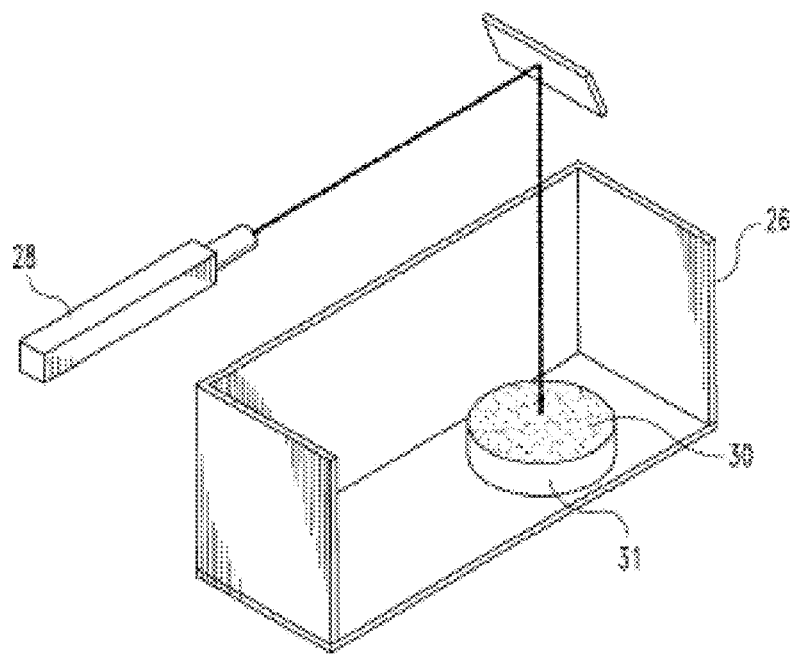
FIG. 9 is a partial cutaway view of the direct laser processing workstation of FIG. 8, in accordance with some embodiments of the present invention.

FIG. 9 depicts the chamber 26 with a portion removed for purposes of clarity. As shown, positioned within the chamber 26 can be a powder bed of material 30 for melting with the laser beam. The material holder 31 is illustrated as a tray; however, other types of material holders are contemplated herein. In some embodiments, for example, the material holder can hold a turbine blade to enable abrasive cermet composite to be directly melted, solidified, and bonded on the blade (i.e., producing a directly tipped blade). In some embodiments, the powder bed of material 30 is not bonded to the material holder 31. In other embodiments, a member is positioned on the material holder so that the powder bed of material can be bonded thereto. In still other embodiments, the powder bed can be directly bonded to the material holder.

In some embodiments, the system can enable the holding of a component (such as a tool, blade, etc) at various inclinations so as to orient the component for localized repair within the chamber 26. The repair of the component can involve, for example, the localized heating of a component that is at ambient, or near ambient, temperatures. The localized heating can be done, for example and not limitation, by inductive heating, an electron beam, a laser, plasma, and/or focused lamps. The material holders of the present invention can be designed to withstand the preheat temperatures that the powder beds 30 are subjected to.

Figure 10:
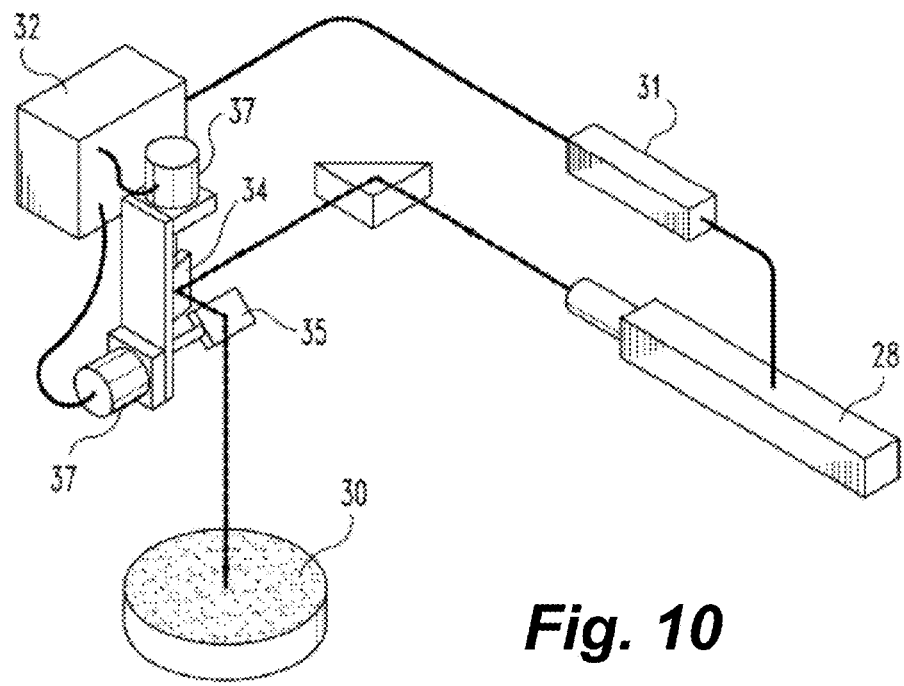
FIG. 10 is a schematic view of the portion of the FIG. 8 apparatus that controls the direction of the laser beam within the direct laser processing workstation, in accordance with some embodiments of the present invention.

FIG. 10 depicts a laser 28 and an apparatus for control thereof. In some embodiments, an Nd:YAG laser having sufficient power to melt a portion of material bed. Both single pass through thickness melting of the material and double pass through thickness melting of the material bed are contemplated herein. However, other types of lasers and different power levels are within the contemplation of the present invention. In some embodiments, a 250 watt laser can be used. The control of a laser is believed within the contemplation of a person of ordinary skill in the art and the particular laser apparatus control scheme disclosed herein is not meant to limit the present methods and apparatus for making components by direct laser processing.

The components of the laser system as shown in FIG. 10 are integrated within the laser head 28. Laser head 28 can include, for example, such conventional control elements as described in U.S. Pat. No. 4,863,538, and U.S. Pat. No. 5,156,697; for example a safety shutter, a front mirror assembly, and focusing elements such as diverging and converging lenses. A computer 31 and scanning system 32 can also be included for controlling the direction of the laser beam as it impinges upon the powder bed 30. In some embodiments, the computer 31 can comprise a microprocessor for controlling laser 28 and a CAD/CAM system for generating the data by which the dimensions of the part can be defined. Of course, other methods to generate the data to define the parts dimensions are contemplated herein. In some embodiments, the laser scanning position and scan speed can be controlled by the computer software.

Scanning system 32 can comprise a prism 33 for redirecting the path of travel of the laser beam. The number of prisms necessary for directing the laser beam to the desired location is generally based on the physical layout of the apparatus. Alternatively, one or more fixed mirrors can be used in place of prism 33 for directing the laser beam from the laser 28 to the scanning system 32, depending upon the particular layout of the equipment. Scanning system 32 can further comprise a pair of mirrors 34, 35 which are driven by respective galvanometers 36, 37.

The galvanometers 36, 37 can be coupled to their respective mirrors 34, 35 to selectively orient the mirrors 34, 35 and control the aim of the laser beam. In some embodiments, the galvanometers 36, 37 can be mounted perpendicularly to one another so that minors 34, 35 are mounted nominally at a right angle relative to one another. A function generator driver, for example, can control the movement of galvanometers 36, 37 to control the aim of the laser beam on the powder bed 30, in conjunction with the computer 31. In some embodiments, the function generator driver can be coupled to computer 31, for example, so that the CAD/CAM data within the computer can be realized in the directional control of the laser beam via minors 34, 35. It is contemplated that alternative scanning systems may be used such as acousto-optic scanners, rotating polygonal minors, and resonant minor scanners.

Figure 11:
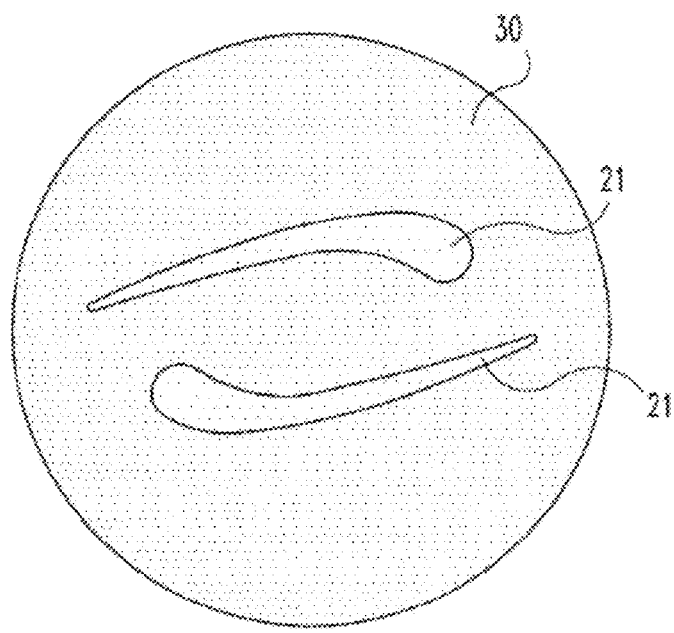
FIG. 11 is an illustrative diagram of the abrasive cermet blade tip of FIG. 7 formed in the powder parts bed comprising a portion of FIG. 9, in accordance with some embodiments of the present invention.

FIG. 11 depicts a plan view of a pair of abrasive cermet components 21 formed in the powder bed 30. The abrasive cermet components 30 can be formed by the direct laser processing of the material within, the powder bed 30 are them coupled to the turbine blade 16.

An enlarged illustrative view of a laser beam scanning sequence is depicted in FIG. 12 Laser scanning sequences can vary because, among other things, the part geometry and the scanning sequence affects the thermal profile of the part. In some embodiments, the pattern can be chosen to provide a uniform thermal profile. One method of achieving a uniform thermal profile is by the selection of appropriate laser scan speed, scan spacing, and laser beam energy for the individual scan length vector. A scan length vector, for example, can define a portion of the component that will be subjected to a particular pass of the laser beam. In some embodiments, the scan spacing can be less than 0.100 inches. In other embodiments, the scan spacing can be in the range of about 0.0001 inches to about 0.0003 inches.

Table 1 contains scan spacings that were utilized to produce abrasive cermet components by direct laser processing. It is understood that the view in FIG. 12 is merely illustrative and is not intended to be limiting in any fashion such as geometry, scan spacing, beam diameter, etc. Material powder bed 30 becomes a target surface for the laser beam during the direct laser processing.

In some embodiments, a component fabricated of abrasive cermet material can be less than about four inches in diameter and can have a thickness less than about 0.100 inches. In other embodiments, the component fabricated from abrasive cermet material can have a thickness in the range of about 0.035 to about 0.060 inches. In some embodiments, the component fabricated from abrasive cermet material having a thickness of about 0.060 inches. Monolithic metallic components having a size less than four inches in diameter and a thickness of up to four inches are contemplated herein. In some embodiments, the monolithic metallic components can have a thickness greater than 0.100 inches and can be fabricated by melting the first powder bed layer and then melting additional layers of powder placed over the first layer of powder. In some embodiments, the monolithic metallic component can have a thickness of about 0.100 inches. In some embodiments, components formed by the direct laser processing can have a laminar structure.

FIGS. 13a and 13b illustrate the melting and solidification of the metal matrix component constituents 75 of the abrasive cermet composite material. The laser beam can melt the metal matrix composite to obtain the appropriate amount of flow from the molten material. The appropriate amount of flow can be qualitatively defined, for example, as the amount of flow necessary to eliminate porosity, producing a high density part while maintaining high dimensional precision and minimizing tearing. The control of the amount of flow is dependent upon many parameters including, but not limited to, the atmosphere in which the melting and solidification occurs, degree of preheat of the material powder bed, and characteristics affecting laser energy density such as laser power, scan spacing and scan speed.

In some embodiments, to maintain a uniform thermal profile, a very fine scan spacing with a high scan speed can be used. The selection of scan speed and scan spacing have a direct affect on the surface roughness of the resulting component. A fine scan spacing, for example, will provide a relatively uniform smooth surface, whereas scan speed effects on surface roughness are largely dependent upon the overall energy density and the associated residence time in the molten material region. For a given material, a high scan speed with a high energy density, which would produce a long residence molten time, can produce a poor surface finish. The same scan speed with a lower energy density, on the other hand, can produce a better surface finish. In some embodiments, fine scan spacing can be used and the laser power and scan speed can be varied to deliver different energy densities, thereby producing a short molten residence time with full through thickness melting and density. TABLE 1 provides test data of various examples that have produced acceptable results.

TABLE 1

| Temperature (° C.) | Laser Power (Watts) | Scan Spacing (in.) | Scan Speed (in./s) | Energy Density (J/cm$^2$) |
|---|---|---|---|---|
| 300 | 115 | .000166 | 33 | 3202 |
| 300 | 85 | .000166 | 39 | 2088 |
| 450 | 130 | .000166 | 33 | 3678 |
| 550 | 145 | .000166 | 33 | 4102 |
| 615 | 135 | .000166 | 33 | 3819 |
| 750 | 135 | .000275 | 30 | 2495 |
| 750 | 200 | .000275 | 30 | 3696 |
| 850 | 97.5 | .000156 | 61 | 1588 |
| 860 | 150 | .000156 | 61 | 2443 |
| 860 | 105 | .000156 | 99 | 1052 |
| 850 | 110 | .000156 | 109 | 1000 |
| 860 | 97.5 | .000156 | 64 | 1525 |
| 900 | 150 | .000275 | 61 | 1386 |

The test data for the cermet composite indicates that full through thickness melting can be achieved with energy densities of approximately 1900 joules/cm$^2$. The sample of cermet composite included 73.5 wt. % metal alloy, and 26.5 wt. % abrasive grit coating. More preferably the metal alloy was a MarM247. In some embodiments, the abrasive grit coating can comprise an abrasive grit material with about a 2.5 wt. % to 12 wt. % titanium coating forming a uniform coating on all surfaces of the particles. At these energy levels (1900 Joules/cm$^2$), however, the samples illustrated porosity entrapped around the grit particle 76 (See, FIGS. 13*a* and 13*b*). Energy densities in the range of 2,000 to 4,000 joules/cm$^2$, however, successfully eliminated porosity retained around the grit particles 76 in the superalloy cermet composite.

In one sample, the porosity began to disappear when energy density levels were about 2,500 joules/cm$^2$. At the energy level of 2,500 joules/cm$^2$ there was a transition in microstructure from very fine equiaxed to dendritic. The very fine grained microstructure, ASTM grain size 10, produced in the samples processed at 1,900 joules/cm$^2$ to 2,500 joules/cm$^2$ can be used in monolithic metallic materials because they behave superplastically at elevated temperatures. This form of microstructure control can enable the production of parts with equiaxed grain, providing more uniform and improved mechanical properties.

The production of a component by direct laser processing can start with blending the material components together. In some embodiments, the material can be blended for 4-6 hours prior to insertion in the chamber 26. The material can then be preheated for a period of time to preprocess the material. In some embodiments, the preheating can occur within the chamber 25. Thereafter the environment within the chamber 26 can be adjusted and the bed of material 30 can be subjected to the direct laser processing. In some embodiments, the direct laser processing can occur while the bed of material 30 is at an elevated temperature to enhance dimensional stability. The component formed can have a structure consistent with a metallurgical casting with a refined microstructure. Further, the microstructure refinement can be adjusted by varying, for example and not limitation, the energy density, atmosphere, and preheating that the material bed 30 was subjected to. For example, control of the energy density in this process can enable region specific microstructure control, thereby enabling a part to have multiple microstructures ranging from equiaxed to dendritic. Further, the component may have regions containing equiaxed, dendritic, directionally solidified, and/or single crystal.

The direct laser process is a procedure in which the material constituents of the powder bed are directly laser melted and consolidated to produce a solidified part requiring little or no post processing. In the direct laser processing procedure the constituents that were not melted are reusable thereby minimizing the amount of scrap and wasted raw material generated in the process. The components formed are substantially free of voids and cracks and can be fabricated so as to be near net shape. In some embodiments, the components microstructure can be modified by a post process heat treatment. The direct laser process can have parameters adjusted to produce a highly dense part or a porous part, as desired. In addition, the process can be used to produce composite components such as cermet abrasive components and/or full density monolithic metallic components.

Figure 14:
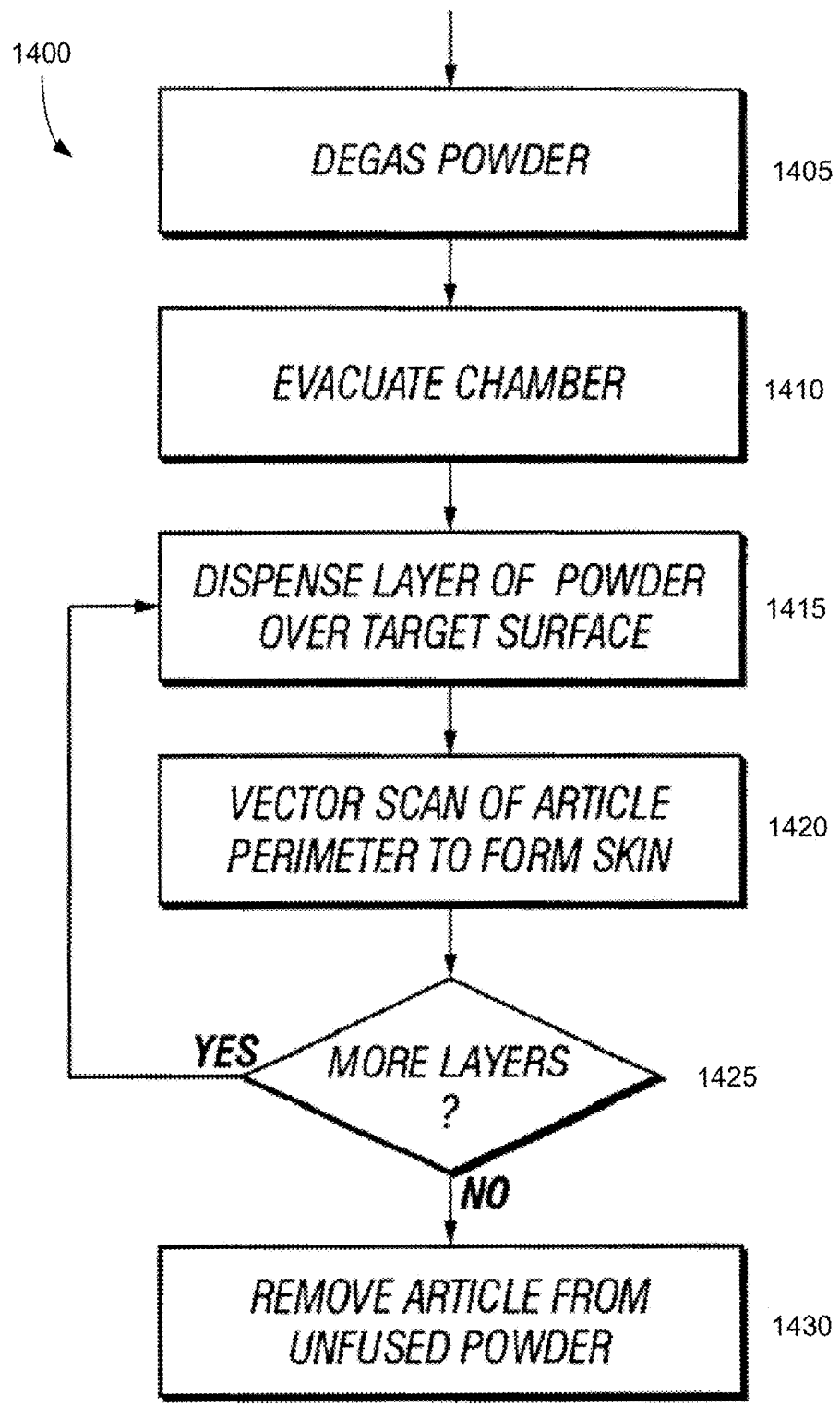
FIG. 14 is a flowchart for the direct laser process, in accordance with some embodiments of the present invention.

As shown in FIG. 14, embodiments of the present invention can also comprise a method for repairing and creating parts using powdered materials and a directed energy source (e.g. a laser). A number of variations, related to pre-processing and processing steps, may be employed to optimize the results.

The directed energy source can be any commercially acceptable laser capable of melting a broad variety of metallic powders, with or without preheating the powder bed. As mentioned above, such an apparatus can also include a scanning control capable of tracing a programmed scan path. In some embodiments, the laser can be capable of melting a broad variety of metallic powders without preheating the powder bed. A particular example of a laser for the present invention is a 250 Watt continuous wave (CW) Nd:YAG laser with a 6 mm beam diameter (1/c$^2$), 18 mrad fall angle divergence, and wavelength of 1.06 μm. In some embodiments, the beam diameter can be approximately 100-500 μm. Preferably, powders used in the system and method can comprise particles that are substantially identical in both size and sphericity and free of any internal porosity. While this is not required, materials meeting such requirements are well known and available. Powders made up of smaller particles (i.e., approximately 10-100 μm) are preferred, but particle size may vary depending on the specifications of the part to be built. The appropriate particle size will be apparent to one of reasonable skill in the art.

In preprocessing, embodiments of the present invention can avoid the common technique of preheating the powder bed before SLS processing. However, preheating can also result in an acceptable product. The preheat temperature can vary according to the material to be sintered. For example, the preheat may be used to bring the temperature of the powder to a point just below the melting point of the powder. In some embodiments, the system can be equipped with a heating device, such as a molybdenum rod element that can achieve temperatures up to approximately 1000° C.

In further preprocessing, the powder can be degassed to improve results. The powder can be degassed by a static hot degas method, for example, that heats the powder in a container under vacuum by radiant heating. To avoid burning the powder, however, a dynamic degassing method can be used, exposing each portion of powder to relatively the same heat. In some embodiments, such dynamic degassing can be achieved with an inert stifling device introduced into the powder container to circulate the powder uniformly during the degas cycle.

In some embodiments, the processing atmosphere can be kept at a relatively high vacuum level—on the order of approximately $10^{-3}$ Torr. Such an atmosphere can produce improved results over inert gas atmospheres, which can contain unacceptable levels of contaminants (e.g., water and oxygen). Such contaminants can create oxide films on sintered layers, which can prevent good bonding between subsequently sintered layers and molten material from flowing freely. Further, with the goal of in situ containerization in SLS/HIP processing, SLS is preferably performed under a high vacuum. Such a partial pressure atmosphere can be achieved by evacuating the chamber to a high vacuum level (e.g., $5\times10^{-7}$ to $1\times10^{-5}$ Torr), followed by a back fill to partial pressure with an ultrahigh purity inert gas such as 99.999% purity Argon or Helium (e.g., <2 ppm oxygen, <3 ppm moisture, <1 ppm hydrocarbons and <6 ppm nitrogen).

A vacuum level of $10^{-3}$ Torr also reduces vaporization of alloying elements from the melt pool and condensation of metal vapors on the laser window. To further prevent such condensation, a fine leak of ultra-high purity (UHP) inert gas, such as Argon or Helium, can be used just under the laser window after evacuating the chamber to high vacuum. In some embodiments, this can be achieved using a double sided flange introduced between the laser window and a flange on the chamber side window mount, a weld fitting stainless steel tubing welded on the side of the double sided flange, a variable leak valve connected via stainless steel tubing to the fitting on the double sided flange, and connected on the inlet side of the leak valve, a stainless steel diaphragm gas regulator mounted on a UHP gas cylinder via stainless steel tubing with fittings at both ends. A knurled, fine control knob and lever mechanism with a mechanical advantage of 13000:1 on the leak valve can enable precise control of gas inflow. Of course, other apparatus could be used and are contemplated herein.

In some embodiments, a system for controlling the processing atmosphere vacuum level can comprise a vapor diffusion pump backed by a mechanical vacuum pump. The system can also comprise a gate valve mated with a high conductance 90-degree elbow, which, in turn, can be mated with a wide diameter flanged port fitted to the chamber. In some embodiments, the gate valve can also comprise a "roughing port." Any interfaces in the system can be finished to minimize leakage. In addition, in some embodiments, all walls of the chamber except that for introducing powder into the chamber can be fusion welded to minimize the need for O-rings or other seals. To prevent ejection of powder from the feed and part side cylinders during chamber evacuation, pressure between the chamber void space above the powder bed and the void space below the columns of powder in the feed and part cylinders can be equalized. This can be achieved, for example, by connecting the aforementioned void spaces using stainless steel bellows hose. The rate of evacuation can be controlled, for example, by the use of bellows valves installed at each evacuation port.

An apparatus for delivering powder into the chamber can comprise part and feed side powder cylinders, a powder delivery roller, and associated actuators. To maintain vacuum integrity, stainless steel edge-welded bellows can be used for the part, feed, and roller actuator shafts. To transmit rotational motion to the roller, a hollow actuator shaft with a concentric rotary shaft coupled to a bevel gear system can be used. One end of the rotary shaft can be connected via the bevel gear system to the roller, for example, and its outer end could be coupled to a MDC Direct Drive high vacuum rated rotational feed-through.

In some embodiments, a flexible shaft can transmit rotational motion from a DC motor, for example, mounted on the machine frame to the ambient atmosphere end of the feed-through. The flexible shaft is preferably sufficiently long to provide rotation to the roller shaft via the rotary feed-through because the entire roller assembly would likely reciprocate along the powder bed. In some embodiments, a motor that is sufficiently small and lightweight can prevent the flexible shaft from wrapping around itself. This condition may lead to inconsistent powder delivery. In the apparatus for powder delivery, the actuator for providing reciprocating motion to the roller assembly torque can include a mount suitable to hold when back driving a load greater than 45N (10 lbs.) Such actuators are known in the art.

An apparatus for delivering powder can also have an optimized center to center distance between the part and feed cylinders, such that heat flux from the heaters to the powder plate is efficient and uniform without sacrificing efficiency of powder delivery. Further, any expansion slots (to prevent buckling of the powder plate when it is heated) that may be present in the powder plate of an apparatus for powder delivery can comprise a blocking plate, or other device, for blocking the transfer of powder through those slots. In some embodiments, the blocking plate can be flexible enough to allow the powder plate to expand without buckling when it is heated.

Figure 15:
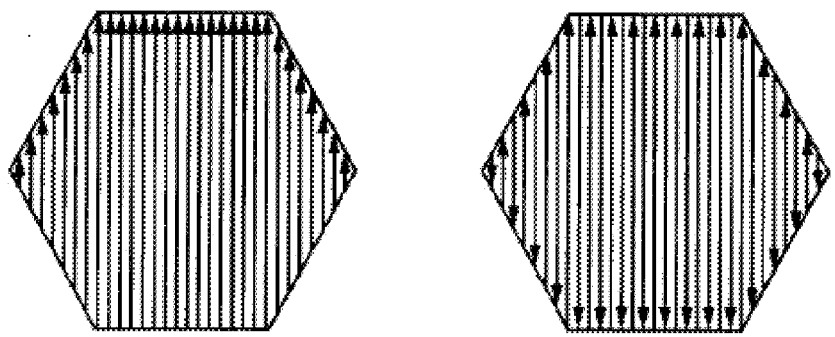
FIG. 15 is a representation of a raster scan pattern, in accordance with some embodiments of the present invention.
Figure 16:
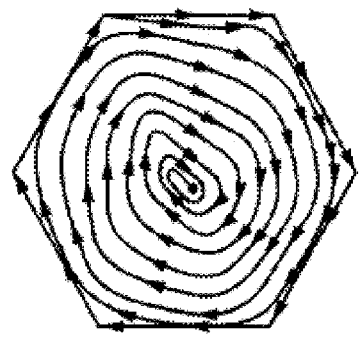
FIG. 16 is a representation of a continuous vector scan pattern, in accordance with some embodiments of the present invention.
Figure 17:
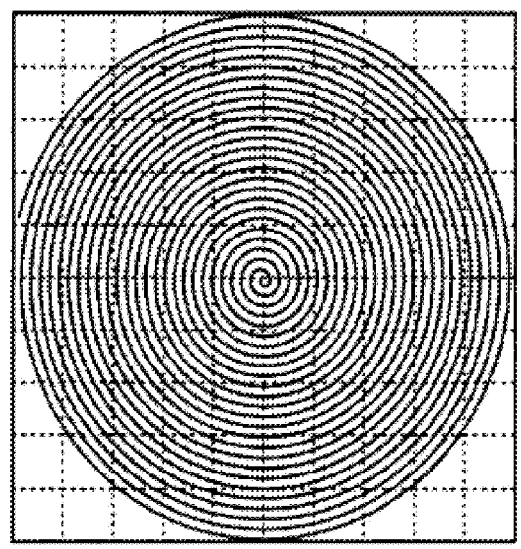
FIG. 17 is a representation of an Archimedes spiral, in accordance with some embodiments of the present invention.

Once powder is deposited, the laser can scan along a predetermined path to selectively fuse the powder into the desired shape. In some embodiments, the laser does not follow a traditional raster scanning path as shown in FIG. 15. Rather, the laser can employ a continuous vector ("CV") mode of scanning (an example of which is shown in FIG. 16), which can enable each individual motion segment to take place in an arbitrary direction, but treats successive segments as part of a continuous path. In this manner, a constant melt pool is maintained under the laser beam. In some embodiments, the scan can follow the path of a parametric curve such as an Archimedes spiral, as shown in FIG. 17, or another arbitrary, piecewise parametric curve that fills the area of the cross section to be fabricated. In some embodiments, the scan path can follow a parametric curve or another arbitrary, piecewise parametric curve that corresponds to the contours of the interior and exterior boundaries of the cross section to be fabricated.

Figure 18:
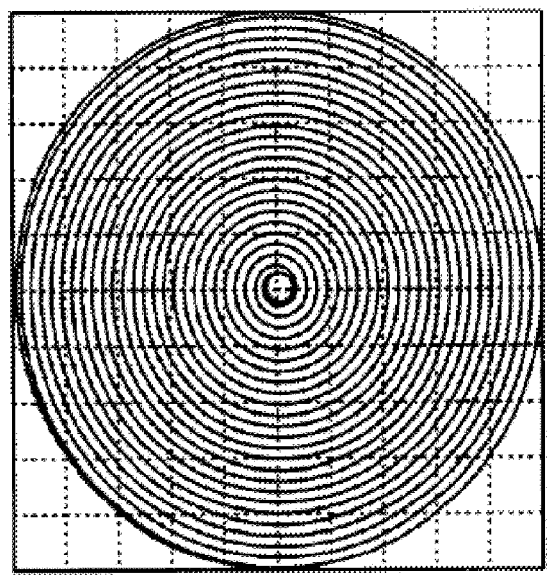
FIG. 18 is a representation of a modified neoid scan pattern, in accordance with some embodiments of the present invention.

Maintaining a constant melt pool is important to forming a homogenous, nonporous product and involves maintaining a constant melt pool in the layer presently scanned and a constant remelt of a portion of the layer just previously scanned. As shown in FIG. 18, a typical CV scan path can comprise a neoid scan pattern, which begins at a point inside of the area to be fully densified, where a finite starting radius for the path is defined. In some embodiments, the starting radius can approximate the beam diameter of the laser to prevent unexposed powder inside the radius. In other embodiments, the scan path could be a cycloid path.

The scan can begin by tracing a circle with the starting radius for the path and then repeat scanning around the starting radius up to 20 times. Simultaneously ramping the laser power to a terminal power while doing so can enable the creation of a melt pool at the center, while substantially avoiding the balling that takes place at the location of initial incidence of a laser beam on a metal powder bed. Further, in some embodiments, the laser beam can oscillate in a path perpendicular to the scan path of the laser to stop any forward velocity of the melt that may break up the continuity of the solid-liquid interface. In some embodiments, scan speed can be in the range of about 0.1-10.0 inches/second. Scan spacing between successive rotations of the CV scan path can be set in a range of about 0.0001-0.020 inches, preferably about 0.0001-0.005 inches.

Figure 19:
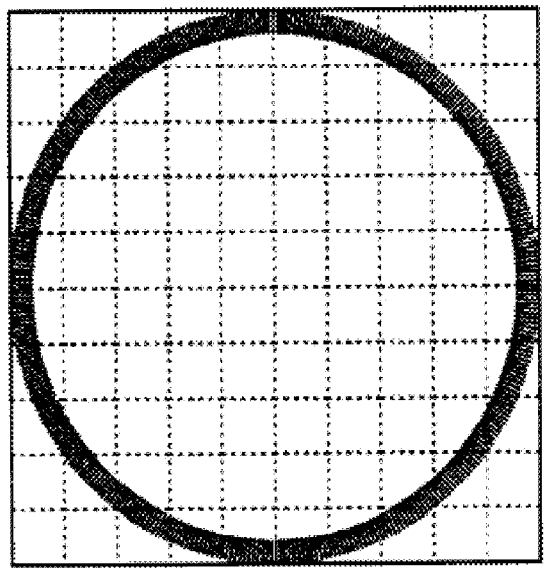
FIG. 19 is a representation of a radial scan pattern, in accordance with some embodiments of the present invention.

In some embodiments, the scan pattern for processing an annular region can correspond to the radial scan pattern illustrated in FIG. 19. While the scan path is actually angular in nature, the angles of the scan path are acute to the point where the lines are virtually and functionally parallel, radiating outward (thus the term "radial scan"). After a rotation is complete, an additional overlap scan of about 25° (preferably about 25.7°) can be included to fully melt and resolidify the starting segment of the of the scan over which laser power ramping takes place. Thickness of layers can be about 0.005 inches, while scan spacing between the radial lines can be in the range of about 0.0001-0.010 inches, preferably about 0.00015 inches.

In SLS/HIP processing, for the top end-cap, the neoid scan pattern can be employed in the same way it was for the bottom end-cap, followed by a scan pattern of concentric rings (each ring corresponding the radial scan path illustrated in FIG. 19) of successively smaller diameters, starting at the outer diameter of the end-cap. An overlap of about 50% can be employed between successive rings. Following with the radial scan pattern can help to ensure that complete bonding and continuous interface between the top end-cap and the underlying skin layer.

An important aspect of the present invention involves the bonding of successive layers over previous ones. In fusing successive layers, the present invention comprises remelting a portion of the previous layer. The process of remelting the previous layer is analogous to the dilution or "meltback" step in conventional fusion welding. Doing so can reduce, or eliminate, contaminants and oxide films that may have formed on the previous layer, thus improving bonding between layers, to form a nearly nonporous product. In addition, during solidification, grain growth will occur at the solid-liquid interface between the base metal and the liquid in contact with it, similar to the epitaxial solidification known in fusion welding. Remelting the base layer enables epitaxial grains to grow heterogeneously.

Some alloys (such as Alloy 625) tend to crack in Direct SLS in both axial and planar directions along the end-cap/core interface and in the part interior. While a significantly longer sinter cycle reduces such cracking, it also increases delay and expense. In some embodiments, therefore, the solution to cracking is to decrease scan spacing, increase scan speed and decrease the starting diameter to ensure that a melt pool forms in the center, rather than leaving an unsintered region in the center.

In some embodiments, metal powder can be placed in the vacuum degassed state at room temperature in the feed side cylinder. The chamber can then be closed and evacuated first by a mechanical pump via a roughing port to about $10^{-3}$ Torr. At this vacuum level, the roughing port can be closed off and the gate valve connecting the chamber to the vapor diffusion pump can be opened. The chamber can now be further evacuated to high vacuum (preferably approximately $10^{-6}$ Torr). At this point, a small leak of ultra-high purity inert gas, such as Argon or Helium, can be introduced into the chamber via a leak valve connected to the chamber via stainless steel tubing. The leak can be adjusted so that a dynamic partial pressure of about $10^{-3}$ Torr is established inside the chamber while the inert gas is constantly flowing into the chamber and swept out of the chamber through the diffusion pump.

A piston in the feed cylinder can move up by about 0.005 inches, pushing a layer of powder above the surface of the powder plate. A roller actuator can then move a horizontal, cylindrical, counter-rotating roller across the powder plate. This movement of the roller sweeps a new layer of powder across the powder plate and deposits it at the surface of the part cylinder. Next, the laser beam can be actuated by a pair of galvanometer scanners to scan a pattern under computer control over the newly deposited layer of powder. The scan pattern can ensure that the powder is fused to form a fully dense layer of the desired shape and is completely bonded to the previously solidified layer underneath. After scanning is complete, the part side piston can be lowered by about 0.005 inches, and another layer of fresh powder can be deposited using the procedure described earlier. The next layer of desired shape is next scanned by the laser and this process repeats, building up the object layer-by-layer until the complete object has been constructed.

In some embodiments, a variation of the present invention can solve a problem particular to metal processing. In laser sintering, substantial unwanted downward growth can occur in fresh powder layers with no underlying solid layer. By building a support layer, however, and then "skipping" a layer, the oxide surface film that forms on the supporting layer can act as a well-defined stop-off layer, thus alleviating the unwanted growth.

The method begins as above, scanning one or more layers and building upward with successive layers. The variation is practiced if the shape of the next cross section to be fabricated (the "second cross section") is such that it would not rest completely within the interior and exterior boundaries of the current cross section (the "first cross section"). In this case, the powder that will lie under the second cross section, but that lies outside of the first cross section, can be scanned to form a "dummy layer." In scanning the second cross section, the portions of the second cross section that lie over the first cross section are scanned normally, remelting a portion of the first cross section to eliminate any oxide films to create a nonporous, homogenous product. However, the portions of the second cross layer that fall outside the boundaries of the first cross layer are scanned so that no portion of the first cross section is remelted (scanning parameters such as scan speed, scan spacing, and laser power should be adjusted according to the material scanned). In this configuration, the underlying oxide film will provide a barrier to any unwanted, downward growth.

In postprocessing, the part and leftover powder can be left to cool under vacuum for about 12 hours, at which time the processing chamber can be purged to atmospheric pressure with argon or helium. Such a "cool down" substantially avoids oxidation of the metal powder and allows any unsintered powder to be reused after collection.

In some embodiments, SLE can also be used to process a variety of superalloys commonly used in the aerospace industry for turbine blades and other components. Each material can require, for example, differing laser power, scanning speed, and/or repeated scans to create the desired microstructure. This can result in a large number of experimental runs to isolate the best settings. Due to the high cost associated with the material and components, however, a set of experiments can be performed using several simplifications to recreate the conditions of a worn turbine blade while mitigating the cost.

Figure 20:
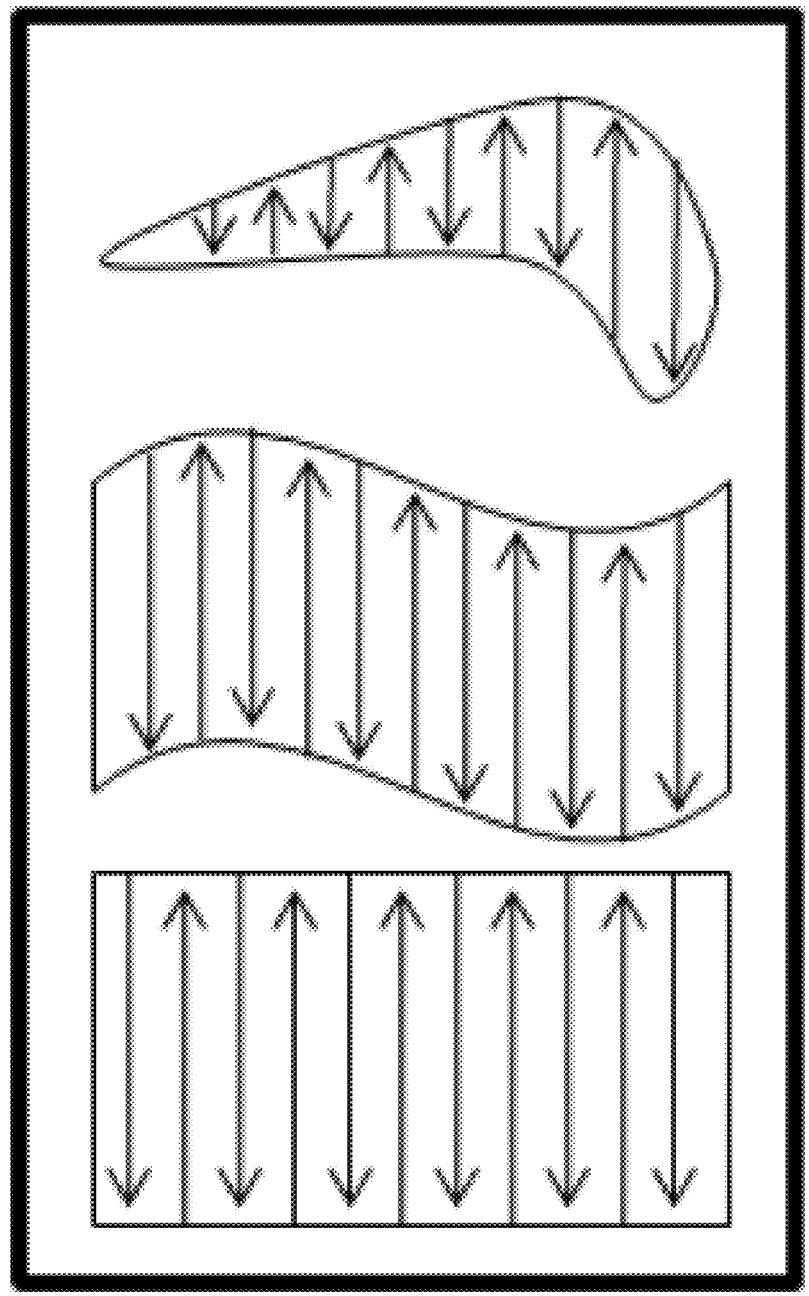
FIG. 20 is a representation of raster scan complexity steps, in accordance with some embodiments of the present invention.

During the initial testing phase of a new alloy, for example, the geometry can be simplified from a complex shape to a similarly-sized rectangular coupon that is 1.25 inches long by 0.27 inches wide by 0.1 inches thick, made from the same material as the turbine blade. This allows for lower cost sample creation, for example, simplified conditions, and faster processing. As the optimal operating parameters are better recognized, the geometry can be altered to a more turbine blade-like design through two steps, as shown in FIG. 20. After rectangular deposits are completed, wave deposits can be made on rectangular coupons. Next, airfoil like designs can be created on rectangular coupons and, finally, on airfoil shaped coupons.

Since turbine blades are much larger than the sample coupons, a heat sink can be used to correctly simulate the heat transfer that will occur when an actual blade is being repaired. An Inconel 625 base plate 2105 can be used containing five evenly spaced coupons 2110 (of course, the number of coupons in arbitrary). Within each well where the coupons rest, there can be a through-hole 2115 that simulates the hollow space below the tip cap of a typical internally-cooled turbine blade, creating a more realistic heat distribution during processing.

For each experiment, the sample coupons can first be thoroughly cleaned to remove any possible contaminants from the process. They can then be carefully set within insets located in the Inconel 625 baseplate. A containment vessel can then be placed over the sample and can be fitted to the base plate 2105 to hold the powder to a desired height. Using previously measured packing densities for each different powder, a precise amount of the powder being used can be weighed and then metered into each cavity evenly. This procedure is shown in FIG. 21, with the rightmost cavities left empty, the middle cavity holding the sample, and the leftmost cavity holding the sample and powder.

In this configuration, each base plate 2105 can hold up to five samples and there are a total of four baseplates available for the current experimental coupons, providing up to twenty samples that can be tested in one operation. Each base plate 2105 can be screwed onto a different aluminum breadboard measuring ten inches square with each board having inserts that enable them to be placed on a rail system. Of course, the mechanical setup can be different without departing from the spirit of the invention.

Figure 22A:
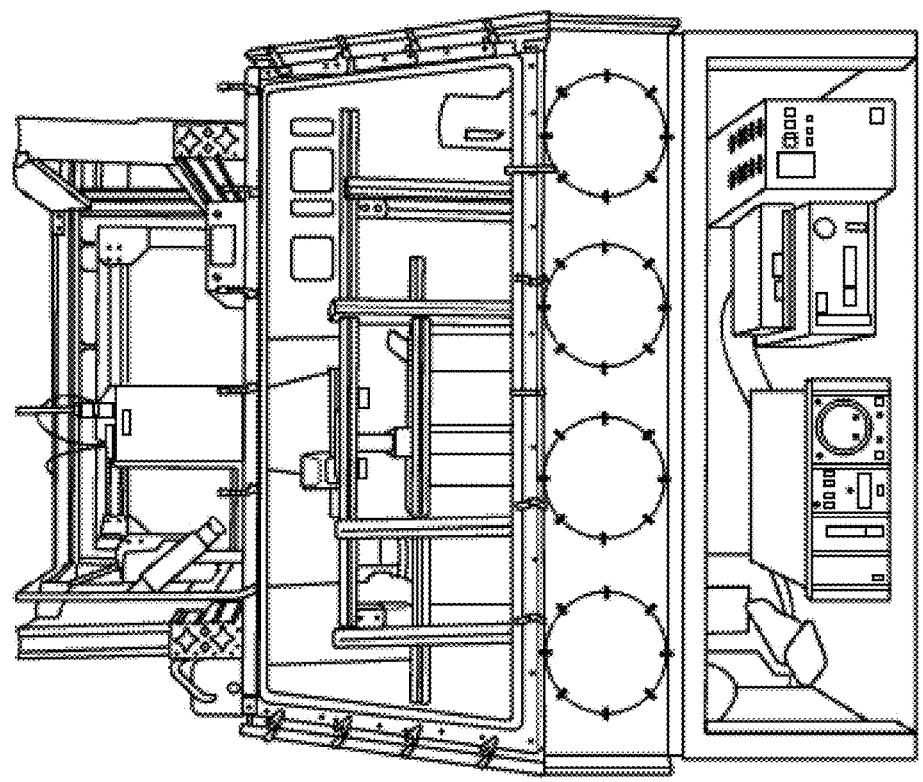
FIG. 22a is a representation of fiber laser SLE equipment, in accordance with some embodiments of the present invention.
Figure 22A:
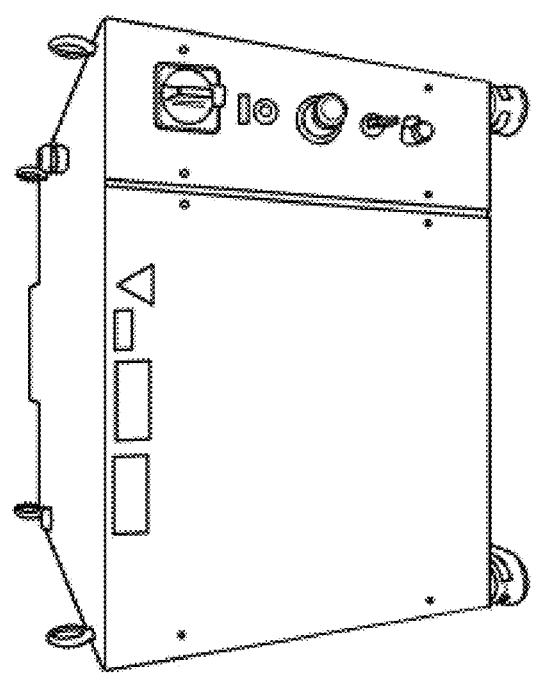

The samples can then be placed in a controlled atmosphere process chamber, where they can be inserted into a rail made from 80/20 extruded aluminum. The chamber can then be purged with inert gas for processing. Once a full set of five samples on a baseplate are processed, the next breadboard can be moved into place along the rail to the exact operating location. During processing a 1 kW Fiber Laser, FIG. 22*a* can be used in conjunction with a galvanometer scanner, as shown in FIG. 22*b* to establish and move the melt pool across a sample.

Figure 23:
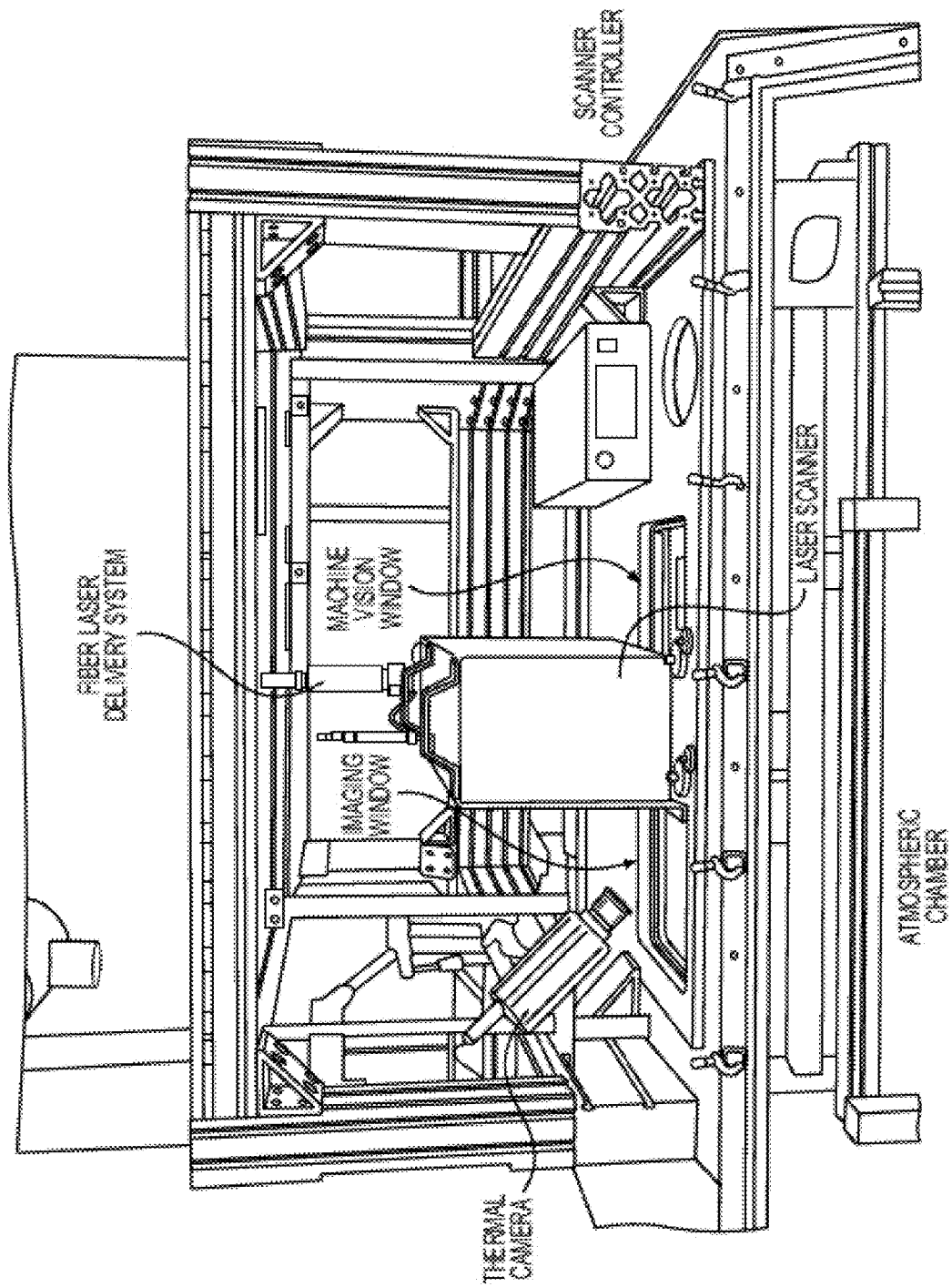
FIG. 23 is a representation of an overview of the equipment used in the SLE process, in accordance with some embodiments of the present invention.

During operation, at least three instruments can be used to collect data: a thermal imaging camera, a video microscope, and laser processing machine vision camera. The instruments mounted on the atmospheric chamber are shown in FIG. 23. The thermal imaging camera can be used to measure the temperature field of a sample during operation, among other things. This information can be used to provide data so that real-time control can be used to maintain a desired temperature field that will result in a desirable microstructure. The video microscope allows a realtime view of the operation and can help with inspection after a run is concluded. The laser processing machine vision camera can provide a clear view of the sample as it is being processed with no interference from the laser or ambient lighting. Such machine vision cameras work by utilizing a high powered strobe light to shine light onto the sample at a specific frequency. The camera then collects information for only those instances, and combined with a filter to remove the wavelength most commonly associated with the laser, a clear image can be formed. The machine vision camera allows the melt pool to be readily observed and can even give insight into how the unprocessed powder is fed into it.

Figure 24:
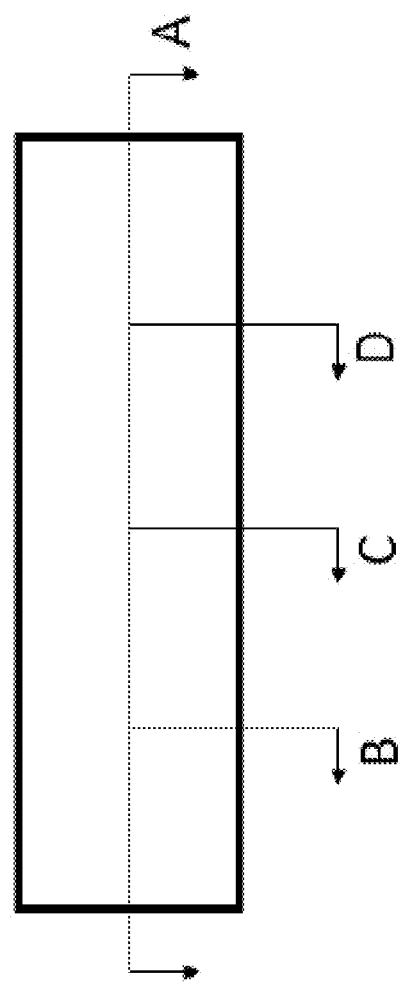
FIG. 24 is a representation of the locations where coupon samples are cut for analysis, in accordance with some embodiments of the present invention.

Once a group of samples has been processed, several steps can be taken to enable them to be imaged for later analysis. First a sample can be cut using a suitable saw (e.g., a Buehler Table Saw) lengthwise through the center width, marked as A on FIG. 24. One half of the sample can be kept for later imaging while the other is cut widthwise at several instances along the length of the sample. The lengthwise cut can give insight into how the process changes during operation, while the widthwise cuts can give information related to how the melt pool and the deposits react near the edges of a sample.

Each sample can be mounted in Bakelite using a suitable press (e.g., a Beuhler press) such that the cut section is visible. Next the sample can be sanded flat using several steps with increasing grit sandpaper. Once sanded smooth, the sample can be polished first using a 9 micron diamond polish suspension, then a 3 micron diamond polish suspension, before finally undergoing a final polish with a silica slurry. Of course, other grits and techniques could be used and are contemplated herein.

Once polished, the sample can be imaged under a Microscope at high magnification (e.g., 100× magnification). Using a moving stage, dozens of images can be taken by the microscope and stitched together to create one seamless image. Each image for a lengthwise cut of a sample can typically be approximately 500 MB (i.e., approximately 7000 pixels high by 15000 pixels long). The size of the image can enable the viewer to view the sample at a macro level, while retaining the ability to zoom in for viewing finer features. These images, which can be created in relatively little time (i.e., within a day of the sample being created), can be used as the primary visual input for the microstructure detection programs described below.

Microstructure Detection

Figure 25:
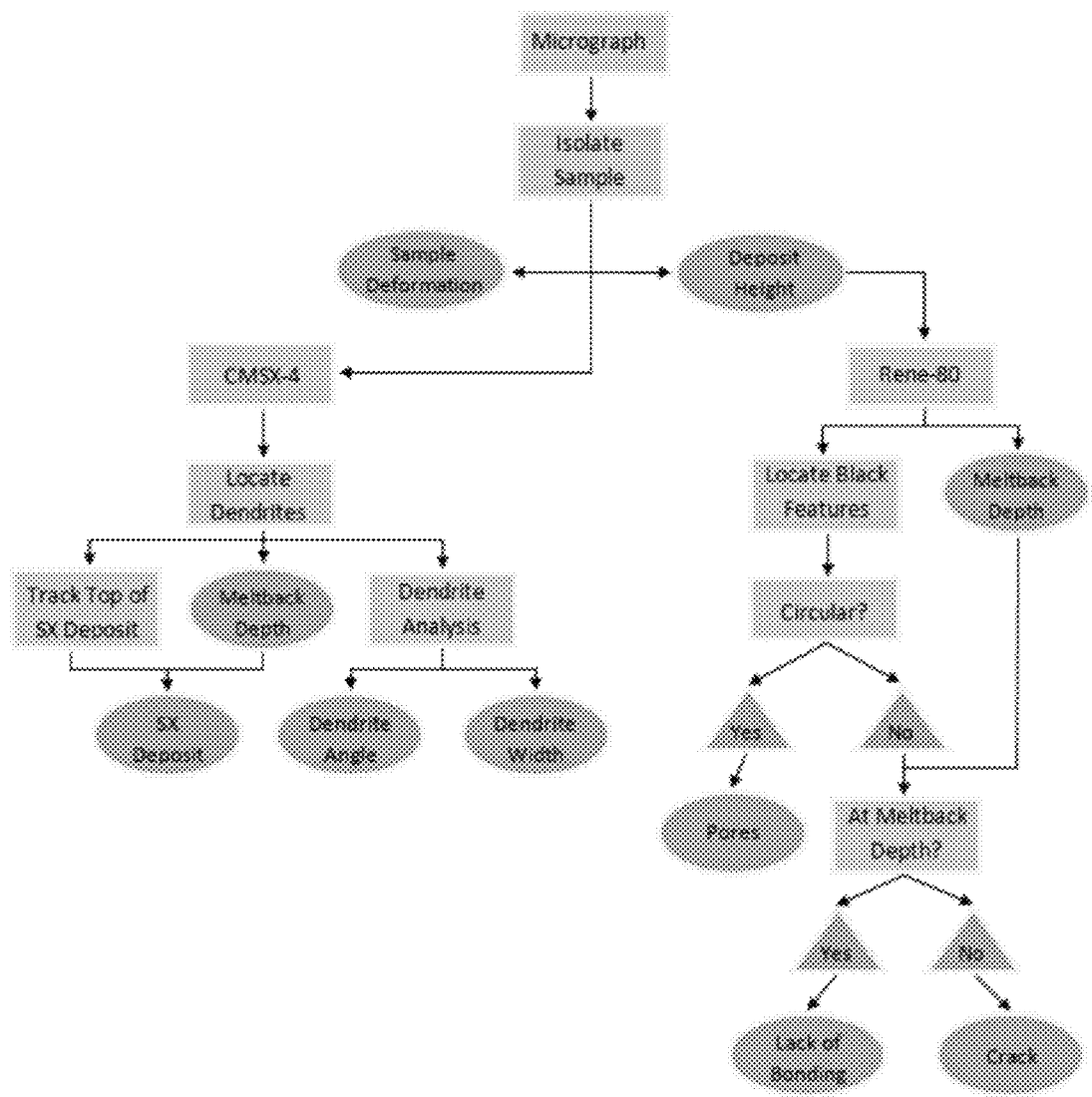
FIG. 25 is a representation of a microstructure feature recognition diagram, in accordance with some embodiments of the present invention.

Tracking the various microstructure features can be accomplished using several functions, each designed to isolate a specific characteristics found in the micrograph. Shown in FIG. 25 are steps related to tracking multiple microstructure features, shown as red ovals, for CSMX-4 and René-80 alloy samples.

Sample Isolation

For every image to be analyzed in the microstructure detection program, be it René-80 or CMSX-4 or any other material, the sample must first be isolated. The first step taken to accomplishing this goal can be to investigate the Bakelite deposit found around the sample. In this configuration, a basic assumption can be made that the image will never have the bottom left corner of the sample within fifty pixels of the bottom-left corner of the image. For most cases this is true because the deposit extends beyond the substrate at the beginning of the scan, which is shown on the left size of the image. For image capturing this can be used as a general rule of operation. As a result, the bottom-left corner of the image can be analyzed (approximately 50 pixels high and 50 pixels wide) to find the average intensity value of the Bakelite material. This number can now be associated with the Bakelite level for future investigations.

In most images, the Bakelite 2615 value tends to be vastly different from the actual samples intensity values, which can provide a clear contrast and can enable the sample to be isolated with relative ease. The need to investigate the Bakelite 2615 for each sample is related to the possibility that the microscopes settings may have been adjusted, creating a fundamentally different Bakelite 2615 average intensity value.

Once the intensity is known, however, five active contouring steps can be completed to isolate the sample along the bottom, top, left, and right sides. In some embodiments, first an active contour can be generated along the entire length of the bottom of the image. The contour can then be pushed upwards by an in-built force (e.g., the image's intensity values minus the Bakelite average intensity). This allows the contour to move upwards from the bottom of the sample to the base of the substrate with little, or no, interference. Once the contour points begin intersecting with the sample, the contour will begin to follow the base of the substrate. When iterating the contour, approximately the inner eighty percent of the line is compared to its last iteration locations. Once the inner eighty percent of the contour stabilizes at a constant location, the iterating of the active contour can be stopped. Only eighty percent (or some similar portion) of the contour is considered because the edges of the contour at either extreme of the image tend to take much longer to adhere to the sample and provide little, or no, relevance to the bottom of the sample.

Figure 26:
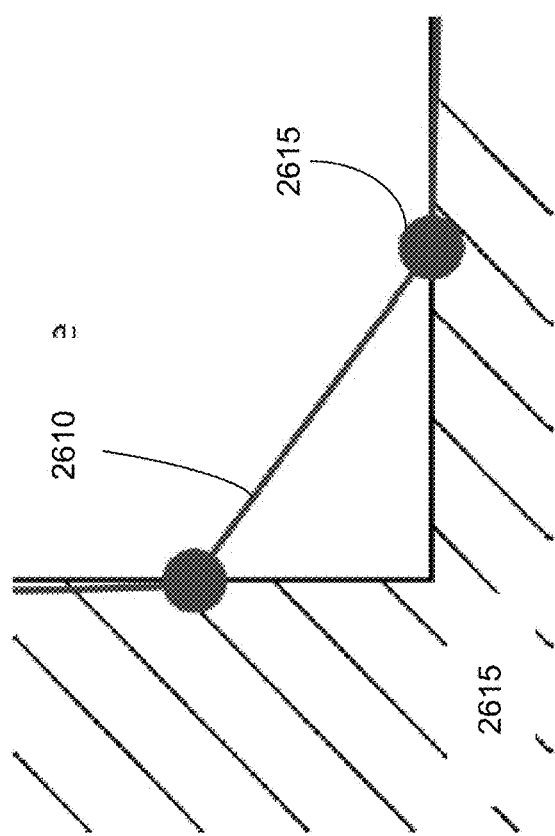
FIG. 26 is a representation of a close-up view of the active contour near the sample edge, in accordance with some embodiments of the present invention.

In some embodiments, the completed contour can then be searched for corner locations, which can be indicated, for example, by rapid vertical location changes between different points, and can be used when searching for the left and right sides of the image. As shown in FIG. 26, the first major step in the active contour 2605 previously found, denoting a corner, can be used as the lowest section when generating a contour to find the left side of the sample 2610. In some embodiments, the left and right edges can be found using a similar procedure. Once the two sides have been tracked, the bottom-left corner and bottom-right corner of the image can be more accurately described.

Figure 27:
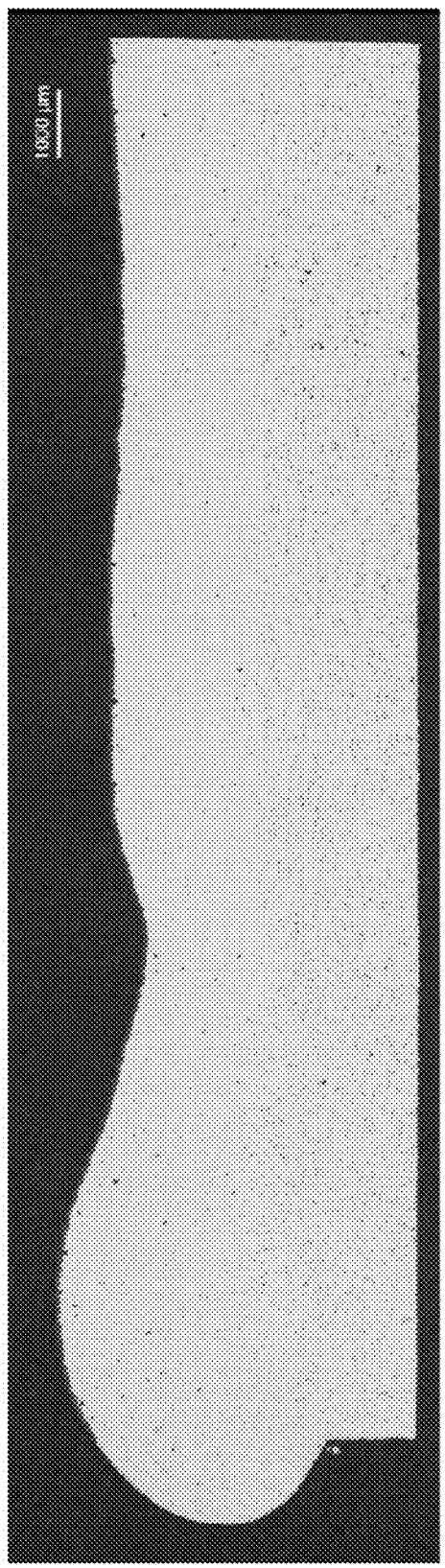
FIG. 27 is a representation of a tracked top of a sample overlaid with the image, in accordance with some embodiments of the present invention.

A second active contour can then be run along the bottom of the sample within the bounds of the left and right bottom corners of the sample to isolate the bottom of the substrate. In some embodiments, the same procedure can also used to find the top of the sample by creating a contour along the top of the image and propagating it downward. The top and bottom sample lines can be saved for later analysis—i.e., the top line denotes the total deposit height, shown in FIG. 27, while the bottom line gives the sample deformation, shown in FIG. 28.

Figure 28:
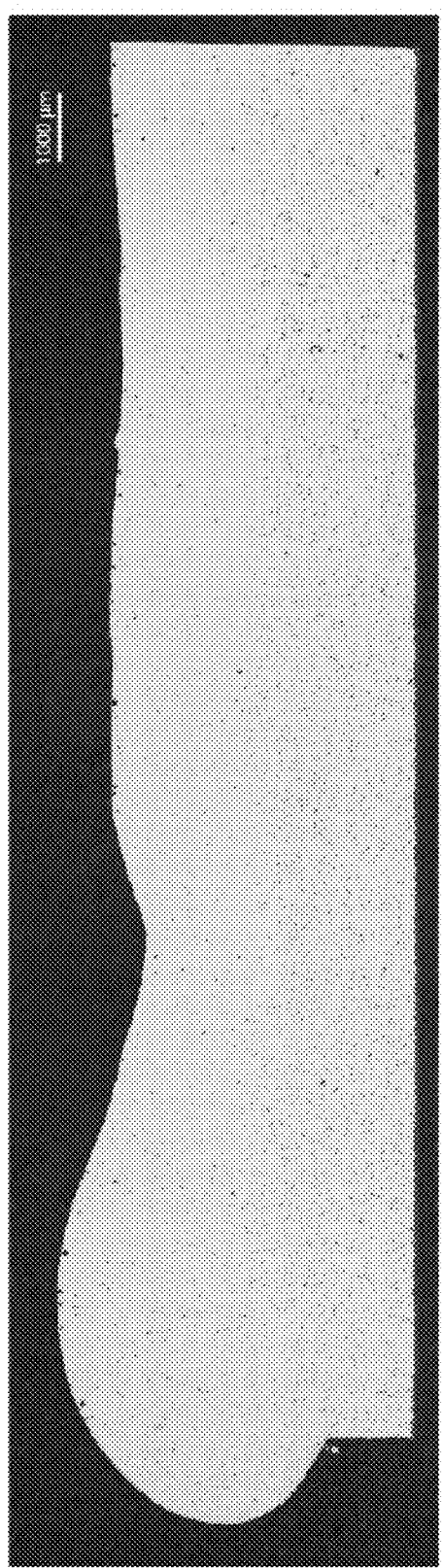
FIG. 28 is a representation of a tracked bottom of a sample overlaid with the image, in accordance with some embodiments of the present invention.

The bottom line, shown in FIG. 28, can be used to understand the amount of deformation that the sample may have undergone. By looking at the change in angle of the sample across the entire sample length, for example, it is possible to see whether any warping occurred due to excessive energy being introduced to the system. The bottom line is preferably also accurately tracked because it is the primary factor to determine the location of the original substrate height. Since the melt pool extends into the substrate by a varying amount, there is no easily visible way to determine where the substrate to powder transition point was prior to running the experiment. Using the bottom line, however, the thickness of the substrate, and the number of pixels per meter in the image (which is known), it is possible to offset the bottom line the correct amount to locate the original substrate location.

Basic [001] SX Dendrite Tracking in Single-Crystal Alloys

Figure 29:
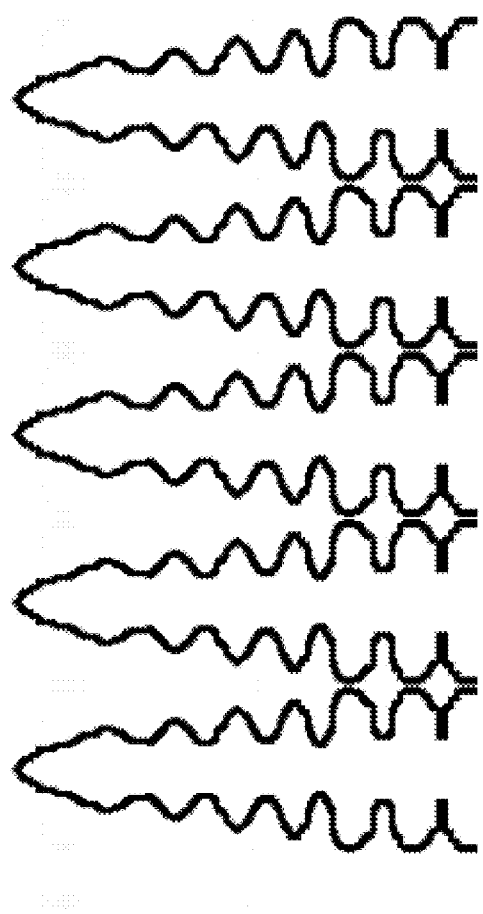
FIG. 29 is a representation of primary and secondary dendrites seen in single crystal deposits, in accordance with some embodiments of the present invention.

When a dendrite is formed in a single-crystal region, there are generally two easily visible features—the primary and secondary dendrite growths—that are shown in FIG. 29. The primary growth acts like the trunk of a tree in that it is a long vertical extension that forms in the direction of highest temperature gradient during solidification. The designation [001] indicates that these primary dendrite growths are vertically directed, which is the only acceptable orientation for current single-crystal turbine blade applications. The secondary dendrite growths, on the other hand, are shorter offshoots from the primary trunk and can be viewed as branches of a tree. The width between two secondary dendrite arms is related to the cooling rate of the metal during solidification and the thermal gradient.

To isolate the primary growths, the microstructure recognition program is preferably able to distinguish between the primary and secondary dendrites. In some embodiments, to accomplish this, the microstructure image can first be differentiated in the x-direction to highlight intensity changes that are most prevalent surrounding both sides of the single-crystal primary dendrite. This image can then be processed by searching for edges utilizing an edge detection algorithm (e.g., the Canny algorithm). The Canny edge detection algorithm can find major edges and can also find minor edges that are linked with a major edge. This type of edge detection is preferably because of the complexity of the primary and secondary dendrites. Finding only major edges along the image results in segments along the outer section of the secondary growths and segments along the primary dendrite trunks. By allowing weaker edges, these sections can be joined at locations, which enable greater representation of the image to be found.

FIG. 43a depicts the Canny Edge Detection Algorithm returning an image with thousands of lines. In some embodiments, a search can be conducted to find lines over a specific threshold, for example, which can denote a long vertical growth, or a primary dendrite. The searching method can use two maps, the Canny output, and a hysteresis map. The hysteresis map can be used to mark any pixel that has already been searched and prevent the searching algorithm to track across that location a second time. In some embodiments, the searching algorithm can run through substantially every pixel of the Canny output, starting at the top left corner of the image, until it finds a positive pixel value that indicates an edge. A separate function can be used to track the line until completion.

When searching for [001] SX lines, the search can be limited to a non-vertical angle (e.g., 45 degrees from the vertical) so that more horizontal lines are not traced. A common occurrence when tracking a Canny line is branching. This is a primary feature of Canny edge detection because it allows minor lines to be tracked provided they intersect with a major line on the image. To efficiently track each branch for a given line, the searching algorithm can track the split locations. The algorithm can then follow the leftmost branch of the sample until its end and then progress through each split back towards to top. Each line traced has both its beginning and ending points saved for later use, while a starting point containing several branches can be represented with a weighted ending point that best represents all of the splits.

Figure 30B:
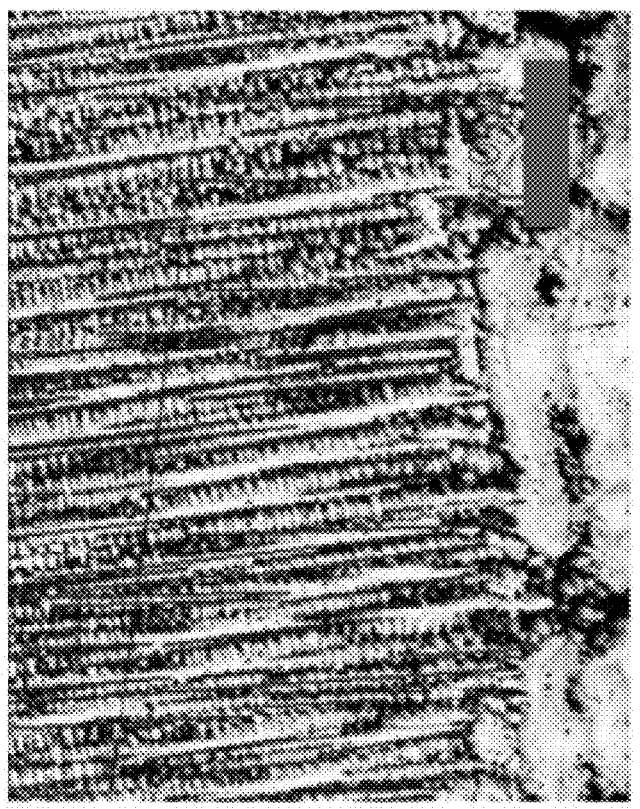
FIG. 30b is a representation of edges of dendrites found from Canny output, in accordance with some embodiments of the present invention.
Figure 30A:
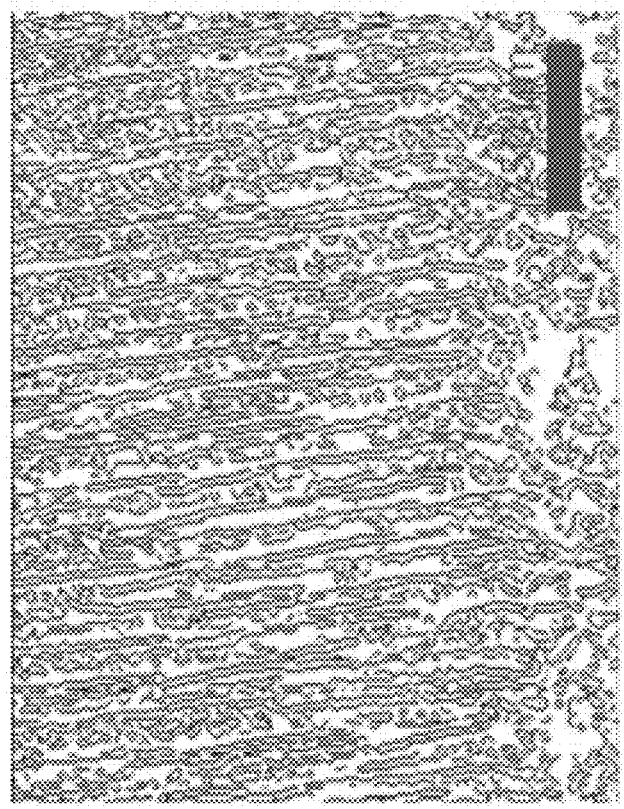
FIG. 30a is a representation of Canny detection output, in accordance with some embodiments of the present invention.
Figure 31:
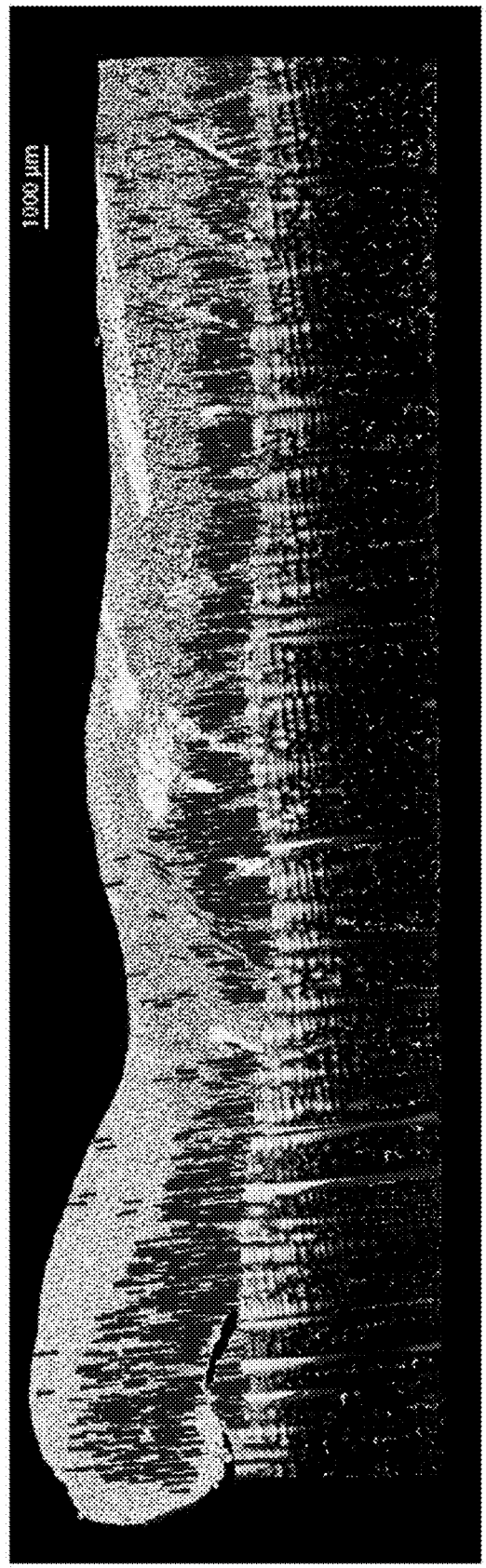
FIG. 31 is a representation of tracked line for a CMSX-4 sample using Canny edge detection, in accordance with some embodiments of the present invention.

In some embodiments, every significant line found can be highlighted and tracked throughout the image. The lines found tend towards the left side of the dendrites and typically do not extend throughout the entire dendrite length, but by utilizing a large number of tracked lines, a general consensus for every region of the columnar growths can be found. FIG. 30b shows the tracked single crystal growths for the region given in FIG. 30a. The blue lines denote dendrite growths found using the canny edge detection and the searching algorithm. Each lines starting and ending point can be saved for later analysis.

Meltback Depth Tracking in Single-Crystal Alloys

Figure 32:
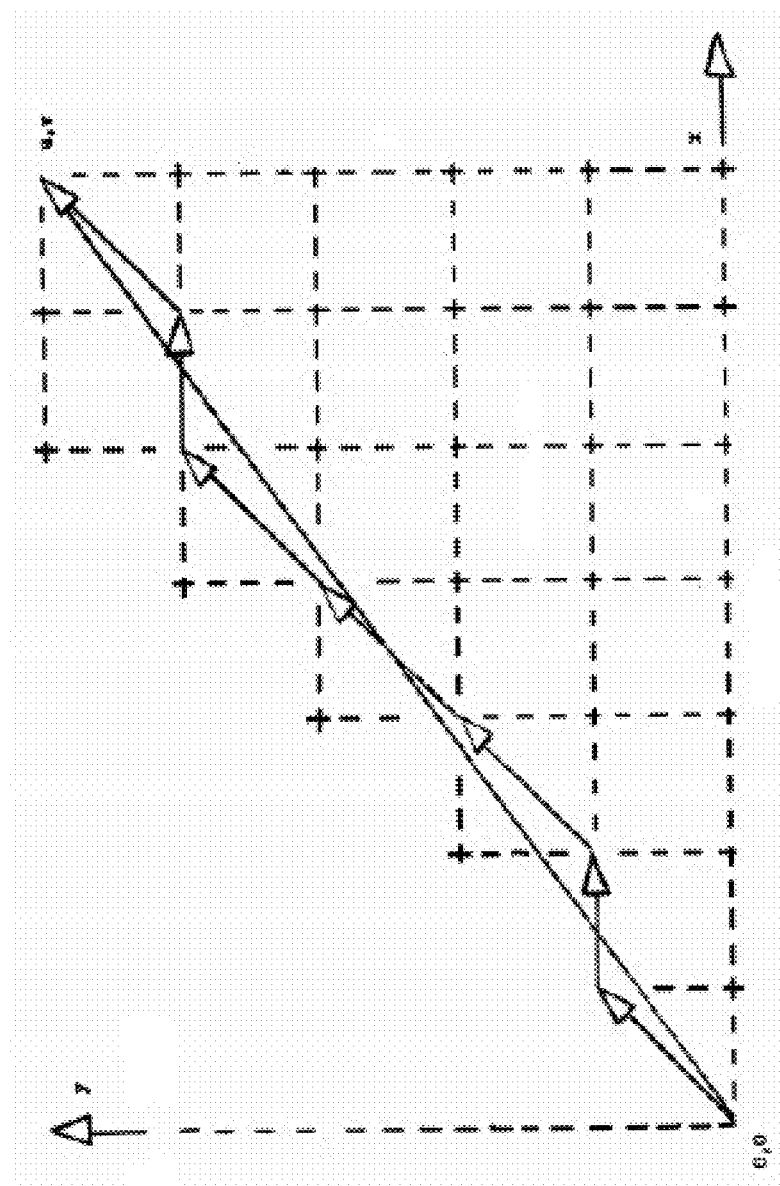
FIG. 32 is a representation of an overview of Bresenhams line algorithm, in accordance with some embodiments of the present invention.

In some embodiments, the first step in tracking the meltback depth in single-crystal alloys, such as CMSX-4, can be to create a heat map based on the dendrite edge data so that the transition point between the fine dendrites and the coarse dendrites can be accurately found. Each line found during the prior Canny edge detection step can be saved using, for example, only the beginning and final points. Bresenhams line algorithm, or other suitable algorithm, can then be used to accurately recreate a straight line using the initial and final points saved during the Canny step. The line algorithm, demonstrated in FIG. 32, uses the slope found between the two points to track the amount of error being built as the line progresses in a specified direction. When the program is recreating a shallow line, every step will accumulate an error as described in Equation 1.

$$e = \frac{dy}{dx} \quad (1)$$

Starting from the initial position described in the Canny step, each pixel being created will progress in the x direction, $x_{i+1}=x_i+1$. A total error can also be updated as shown in Equation 2. Once the error passes a threshold of 0.5, however, the y coordinate of the next point generated will increase by one, $y_{i+1}=y_i+1$. The total error will then have one subtracted from its value.

$$E_{i+1}=E_i+e \quad (2)$$

In some embodiments, the same procedure can be used for steep lines, but with the error term inverted and with the y-value of the newly created points being the direction incremented. Using this procedure the line can be created using minimal computation time and with close approximation to the original straight line. A separate function can also be created that allows for the line to be quickly found at any orientation so that it can be recalled in later programs.

In some embodiments, as the program is recreating each line, a weight can be added for the surrounding pixels. For each newly generated pixel created with the Bresenthal's Algorithm, for example, the pixels located to the left and right for a steep line are increased in value on the heat map. The new intensity value for a pixel can be determined using Equation 3, with a being the distance from the pixel in question to the Bresenthal's pixel that was just created.

$$I(x, y) = I(x, y) + \frac{1}{\sigma} \quad (3)$$

Starting at an intensity value of one for the actual line, the intensity can be reduced in direct proportion to the distance the pixel is located from the line. In some embodiments, this weighing can extend ten pixels (or other suitable distance) outside the line to enable gaps between each thin dendrite to be partially filled. This can be useful to enable the lines to better represent an entire area of the sample so that an active contour can later be used to track the meltback depth. In some embodiments, a small amount of weighting can also added to both the top and bottom of each line. The additional weight enables an active contour to better conform to the edge of the single crystal area than it would if the intensity changes quickly from close to zero (indicating no single crystal) to a high value. Once each line is recreated on the heat map, the active contour function can be called.

Figure 33:
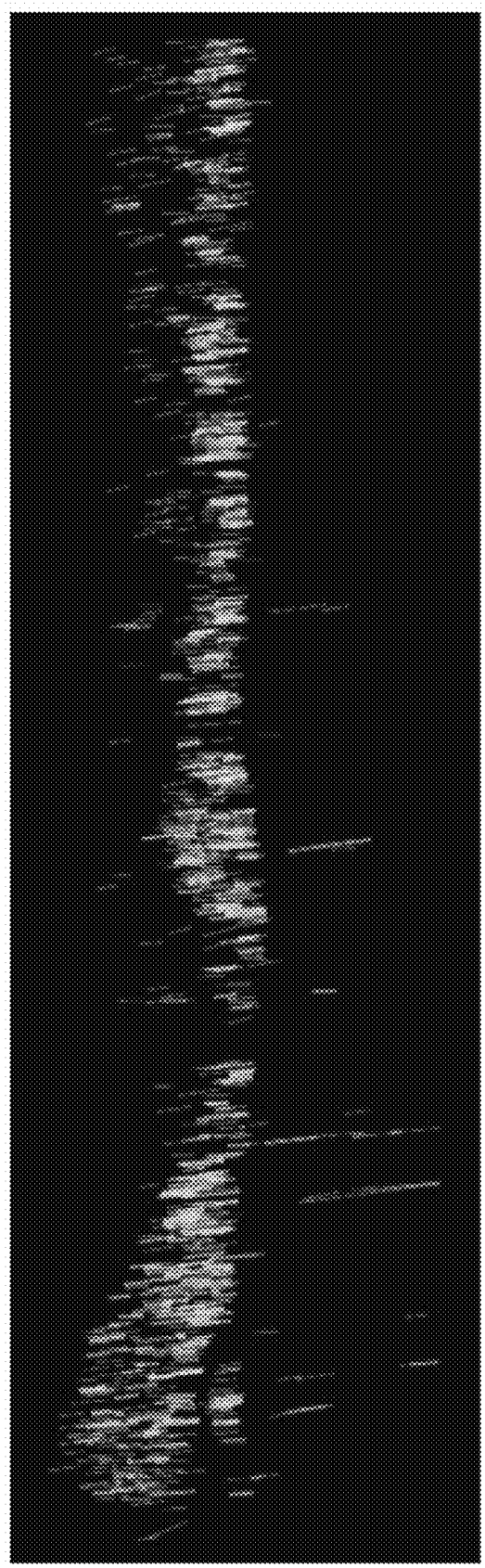
FIG. 33 is a representation of a heatmap created from edge detection to be used with meltback tracking, in accordance with some embodiments of the present invention.
Figure 34:
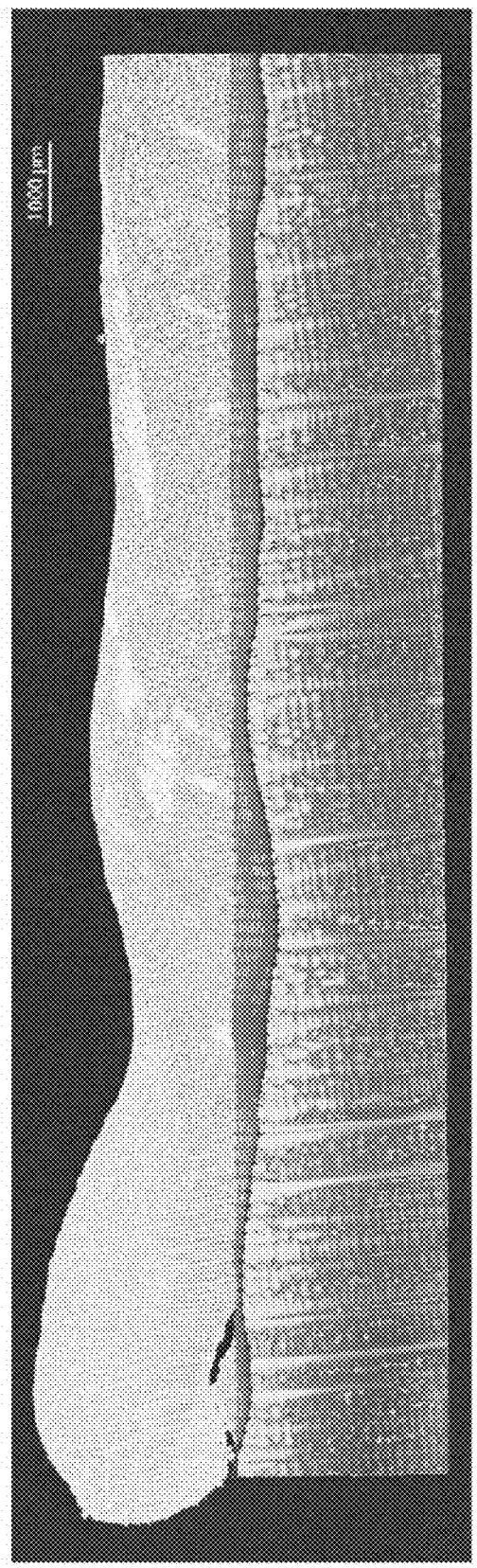
FIG. 34 is a representation of active contouring iterations when ending the meltback depth for a CMSX-4 sample, in accordance with some embodiments of the present invention.

In some embodiments, as shown in FIG. 33, the heat map can then be used as the external force. In this configuration, the initial active contour can be placed along the location of the original top of the substrate, which can be found using the bottom line and the known thickness of the substrate. By placing the contour at the original substrate/powder interaction layer it will generally be closer to the meltback depth than any other location. This minimizes the amount of runtime and also reduces the amount of local maximums in its path. As shown in FIG. 34, the active contour is able to bypass local maximums as it travels across the sample. The color of the lines shown in the figure denotes the iteration step of the active contour, with the color red denoting a later step.

Figure 35:
FIG. 35 is a representation of a meltback line when near a lack of fusion, in accordance with some embodiments of the present invention.

In some embodiments, a small upwards force can be exerted on the active contour because it is dominated by the external force of the heat map. This can enable it to better conform to the lower points found on the heat map and can create a closer approximation to the actual transition from unmelted to processed material. Another reason to include an upward force is related to the possibility of a lack of fusion in the sample, i.e., where the deposited powder is not joined with the underlying substrate. At these points, there will be little, or no, intensity found on the heat map allowing that area of the contour to rise slightly above the top of the substrate. This can enable better contrast where the meltback depth exists, though at a very shallow depth and/or where there is a lack of fusion. This rise in the contour can be seen in FIG. 35 and can be used in several instances in later analysis.

Figure 36:
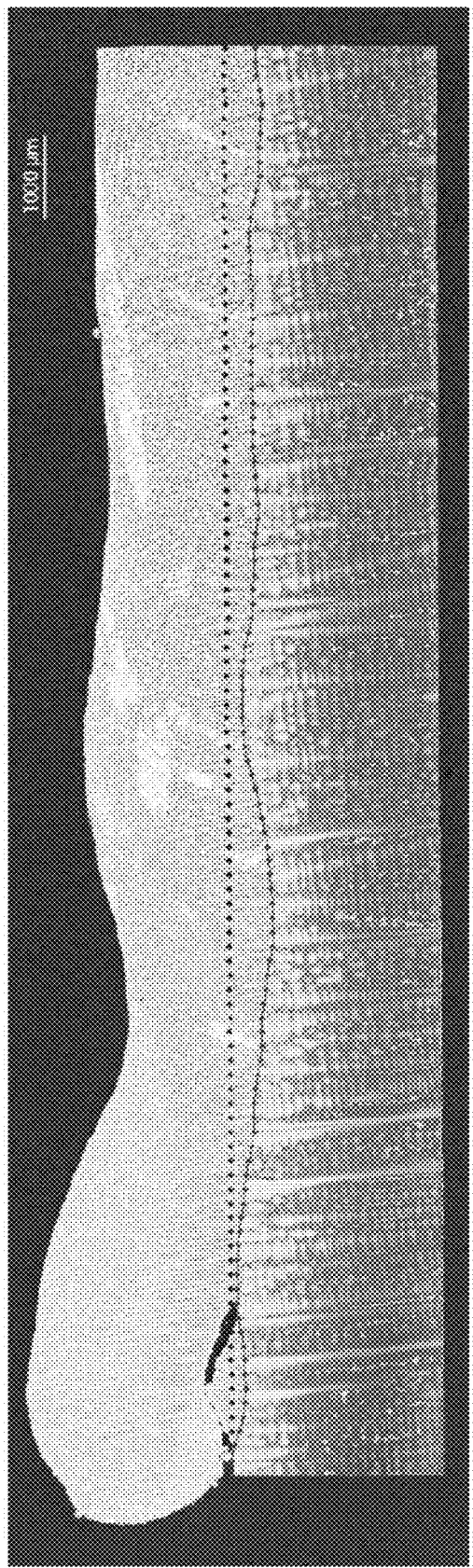
FIG. 36 is a representation of a final contour for a CMSX-4 meltback line, in accordance with some embodiments of the present invention.

In some embodiments, once the contour reaches a point where it no longer shifts in position, and the total energy of the line remains constant, or nearly so, for two subsequent iterations, the active contour can be deemed complete. Of course, other iterations can be used depending on, for example, materials, conditions, and final product specification. A final output can then be made, as seen in FIG. 36, which shows the image with the final contour drawn on it. In some embodiments, an active contour can be created from a list of points with a specific spacing, seen as dots on the figure, while the interpolated line between the points is not accessible. Using the Bresenham's algorithm along with the contour points, however, a complete line can be assembled that represents the meltback line across the entire image.

Detailed Dendrite Tracking in Single-Crystal Alloys

Generally, finding the meltback in single-crystal alloy, such as CMSX-4, samples depends on having access to a large amount of information regarding the new single-crystal deposit locations. This information does not necessarily need to be accurate with regard to each dendrite because it is the quantity of information that allows the meltback to be tracked. When finding the dendrites' angle of orientation and average primary trunk width, however, a more detailed analysis is desirable that stresses a smaller number but greater quality dendrite tracking.

A primary reason that a coarse analysis of the dendrites is used earlier in the program is due to the interference of the secondary dendrites. In other words, these small perpendicular offshoots from the primary dendrites can create interference when trying to track the primary dendrite locations. In some embodiments, therefore, the first step in performing a detailed tracking of the dendrites is to reduce, or eliminate, the effect of the secondary dendrites. To do this, the canny edge data found during the initial dendrite tracking function can be used. Using the same procedure followed previously to create straight lines between the starting and ending points of each saved edge, the image can be slightly blurred in that direction for pixels in close proximity to the line.

To do this the area around each line can be convolved with a Gaussian kernel, Equation 10, with a equal to ten. This 1-D kernel can be rotated by the angle of the line using a rotation matrix, Equation 5.

$$g(r) = \frac{1}{2\pi\sigma^2} e^{-0.5\frac{r}{\sigma^2}} \quad (4)$$

$$R = \begin{bmatrix} \cos(\theta) & -\sin(\theta) \\ \sin(\theta) & \cos(\theta) \end{bmatrix} \quad (5)$$

Finally the area of interest around the line can be convolved with the rotated kernel using Equation 6. In this configuration, the convolution can be performed within ten pixels of any point on the line in question. Of course, this can be adjusted as necessary. This procedure can be repeated for each line tracked previously, which explains why each individual line influences only a small region around it, bounding the summation terms a and b seen in the equation. Keeping each blurring attempt localized minimizes the propagation of errors caused by a poorly tracked dendrite from the earlier section.

$$h(i,j) = \Sigma\Sigma g(a,b)f(i-a,j-b) \quad (6)$$

Figure 37B:
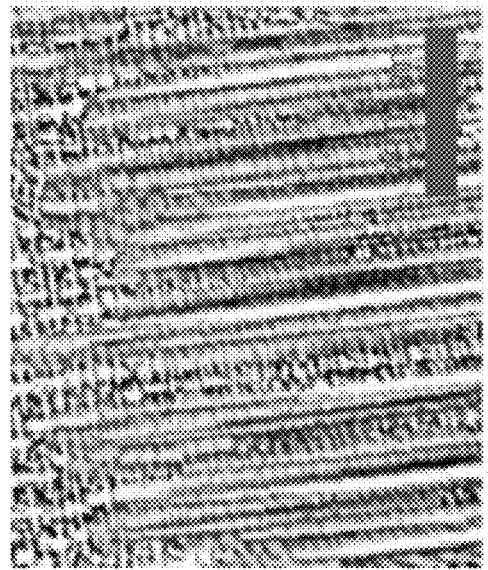
FIG. 37b is a representation of a CMSX-4 sample after sharpening and blurring is completed, in accordance with some embodiments of the present invention.
Figure 37A:
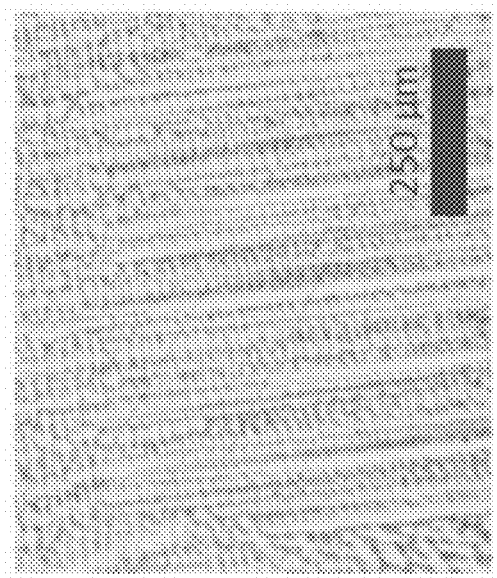
FIG. 37a is a representation of a CMSX-4 sample before sharpening and blurring is completed, in accordance with some embodiments of the present invention.
Figure 38:
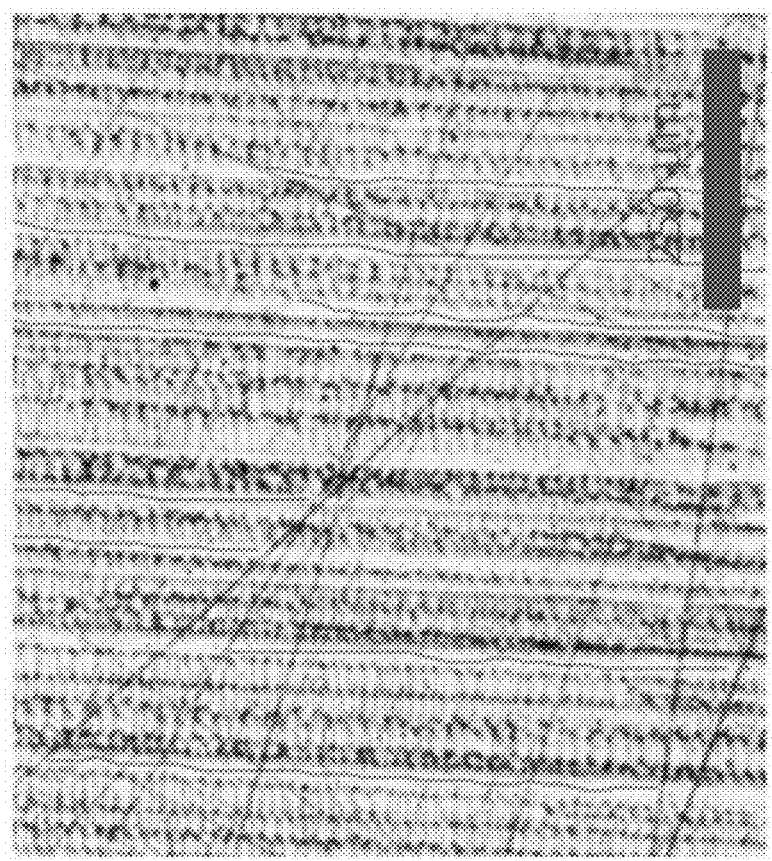
FIG. 38 is a representation of dendrites tracked using detailed analysis overlaid with CMSX-4 image, in accordance with some embodiments of the present invention.

Thus, while the initial dendrite tracking was not highly accurate, the general direction of each dendrite was found, allowing the blurring effect to diminish the secondary arms. By blurring in this direction the primary dendrites shape remains largely unaffected and the secondary dendrites intensities are lessened, as shown in FIG. 37b.

In some embodiments, after blurring the image using every traced edge, the image can then go through a closing operation, including, for example, dilation and then erosion. This can remove low value outliers and can join high intensity regions, which can help better highlight the trunks of each dendrite.

In some embodiments, the canny edge detected lines that were saved during the basic dendrite analysis can once again be recalled. In this configuration, the starting point of each line can be used as a possible location of a primary dendrite in the sample, allowing the function to have a more refined search for dendrites. A single point can be seeded at the starting location of each canny line, after which a separate procedure can be used. From the single point, the area surrounding it on the heat map can be searched for the direction holding the highest intensity. In the direction found, a new point can be generated at a predetermined distance (e.g., five pixels or approximately 15 microns) from the preceding point. This can be iterated a number of times, (e.g., five times) before the angle of the created line is determined, now referred to as α. Once the angle is found, the direction for any future points generated will be within a tolerance of the angle, as shown in Equation 7, with θ representing the angle between the investigated point in question and the starting point for the line.

$$e^{-sin(|\alpha-\theta|)} \quad (7)$$

Figure 51:
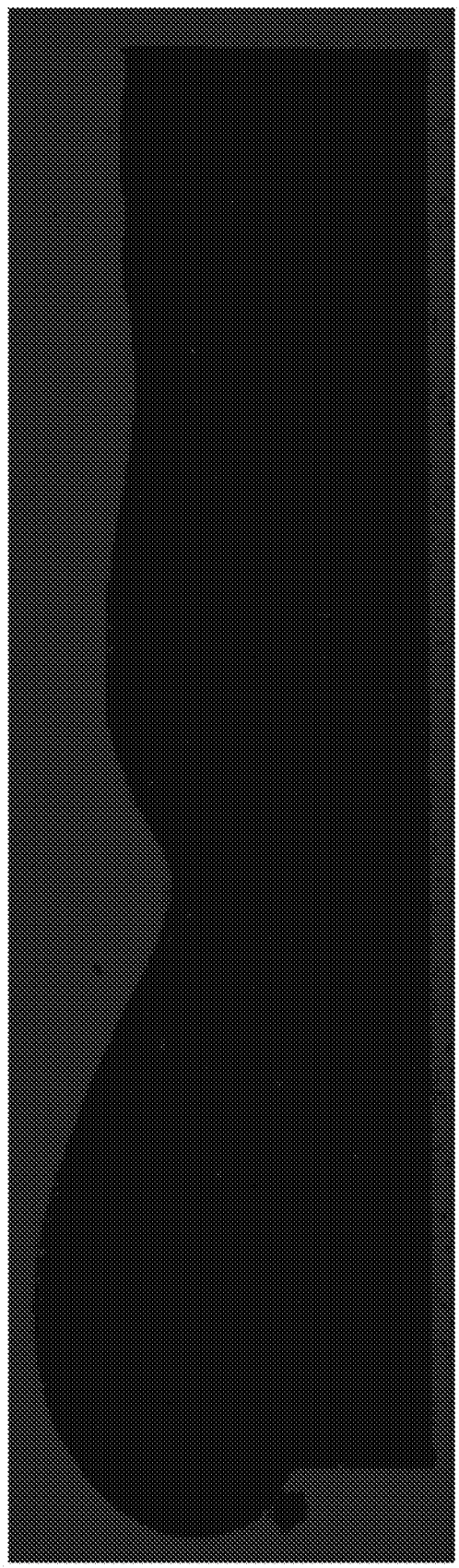
FIG. 51 is a representation of a René-80 sample after binary threshold used to locate pores and cracks, in accordance with some embodiments of the present invention.

This is desirable as primary dendrites tend to be straight features. As a result, drastic changes in angle indicate a different dendrite or a stray grain formation. Creating lines from the canny edge points and limiting their direction of growth, therefore, can limit the number of dendrites that can be tracked but both techniques are desirable to avoid the possibility of false positives. FIG. 51 depicts dendrites tracked using detailed analysis overlaid with a CMSX-4 image.

In some embodiments, when a location of high intensity direction is found and before creating a new point, the intensity level can be compared to a threshold. In this case, the threshold is high enough that if a single pixel along the length being checked is near zero, then it is not acceptable. This stops the line from jumping between two closely aligned dendrites, but also minimizes directions that have a low average pixel density. If none of the intensity summations from the five pixels, in multiple directions, are above the threshold then the line is terminated. In some embodiments, the total length of the line can be checked to see if it is long enough to have significance. If the completed line is long enough, then each point can be saved for later use.

Figure 39:
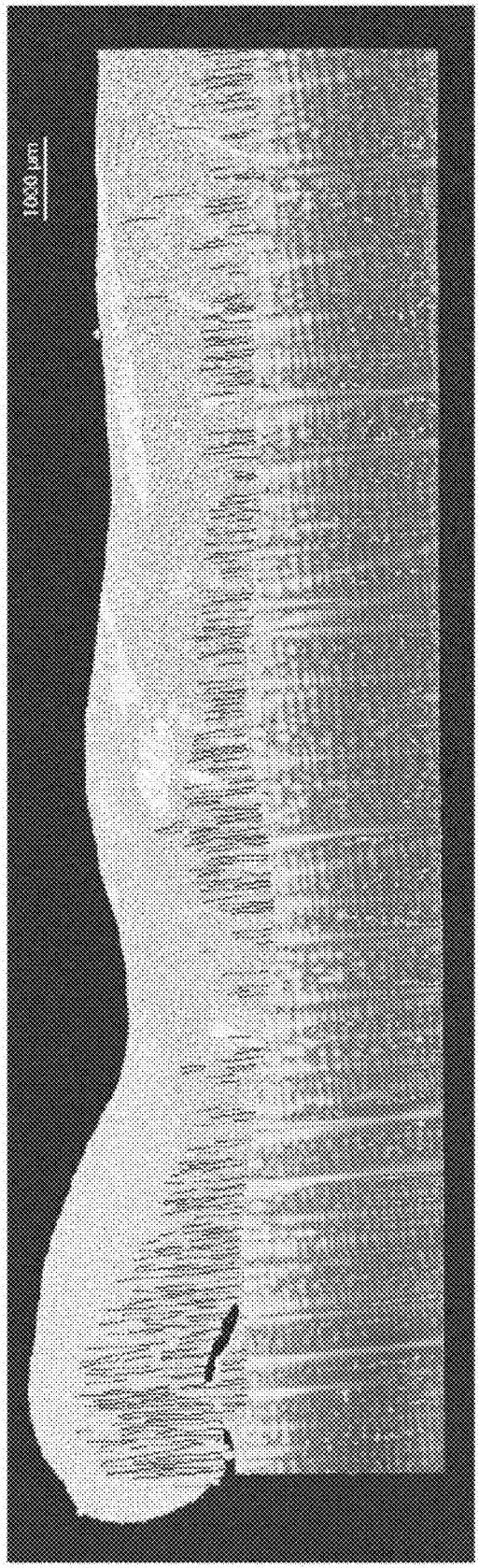
FIG. 39 is a representation of accurate dendrites shown across an entire CMSX-4 sample, in accordance with some embodiments of the present invention.

This procedure can be followed for every canny edge starting point throughout the image, though lines preferably are not formed on top of one another and do not cross paths. The final results are generally dozens to hundreds of lines located across the length of the sample with accurate tracking of the primary dendrite trunk as seen below in FIG. 39.

In some embodiments, a heat map can be generated using the starting and ending point of each accurate dendrite tracking, following the procedure used when finding the CMSX-4 meltback line. A difference between the two is that each accurate dendrite line tends to effect pixels further out than those found in the meltback procedure. This is desirable because there are fewer lines than before, as the result of the much more stringent standards. As a result, they must cover more ground. Again the intensity of a pixel is directly proportional to its proximity to the actual line so the newly added values tend to be extremely small.

Figure 40:
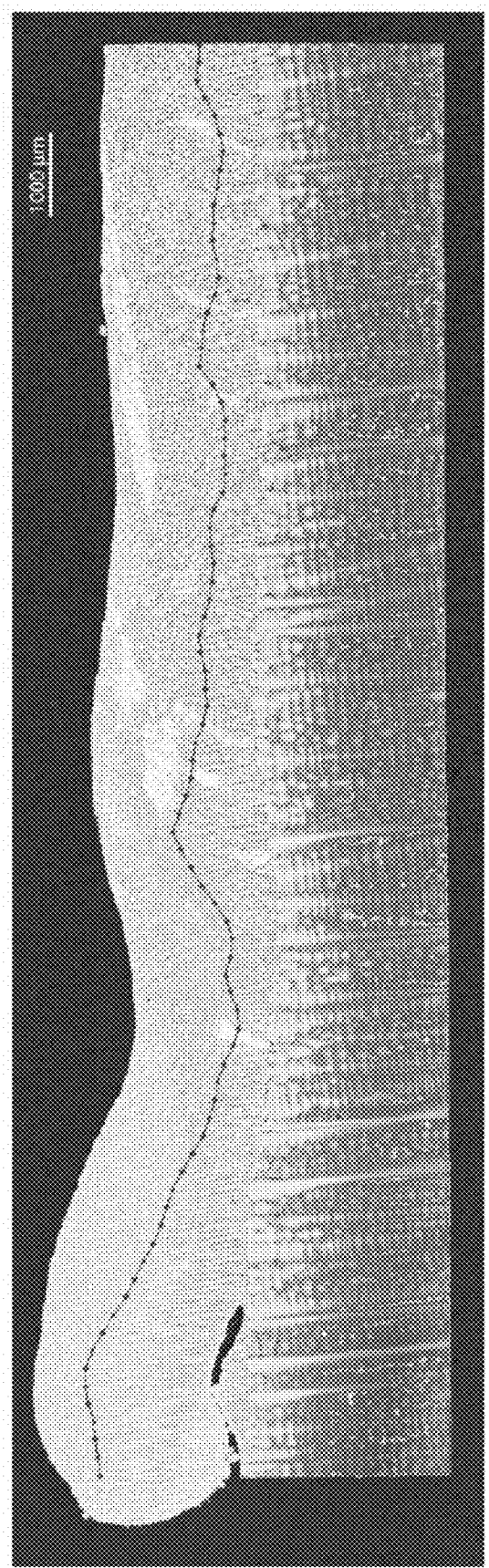
FIG. 40 is a representation of a final contour found when tracking the single crystal deposit on CMSX-4, in accordance with some embodiments of the present invention.

After following the same guidelines as when finding the meltback depth of CMSX-4, an active contour can be established along the top of the sample. This line then propagates downwards until reaching the SX termination points at the top of the tracked dendrites as seen in FIG. 40.

Figure 41:
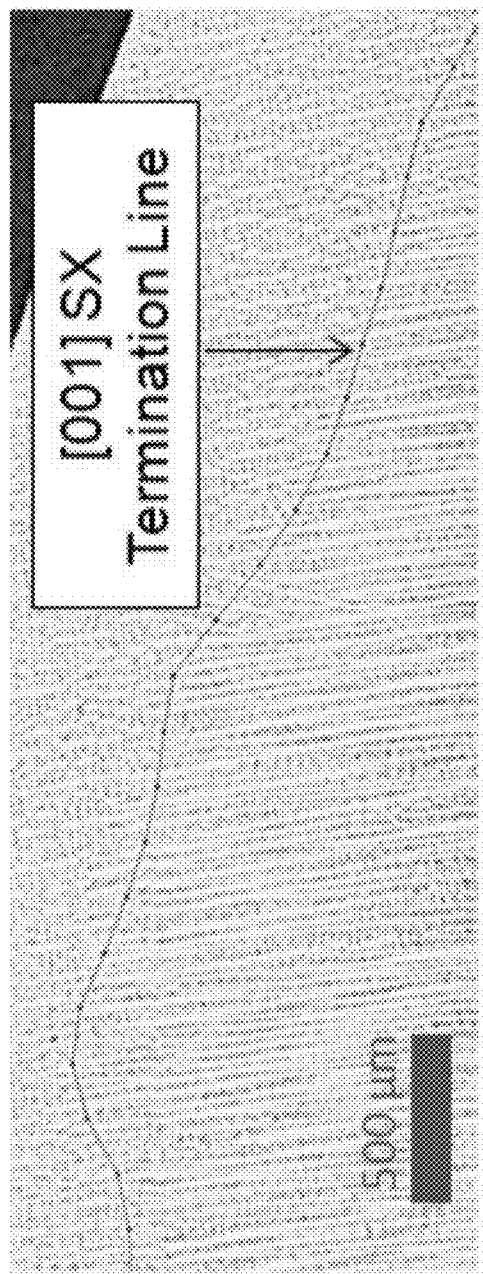
FIG. 41 is a representation of a close view of the SX termination point found with the active contouring, in accordance with some embodiments of the present invention.

It can be difficult to see the transition between the vertical single crystal growth and the equiaxed or misoriented sections when the image is small. As a result, FIG. 41 depicts a closer view of the SX termination line at a single crystal to equiaxed transition location, which shows a close approximation to the actual termination point across the region. The most problematic area of the SX height contour is the occurrence of large stray grains. A small stray grain can be seen near the center of FIG. 41, though this size it does not cause any undue issues. The system could be modified, however, to locate and track all of the stray grains of the image.

Figure 42:
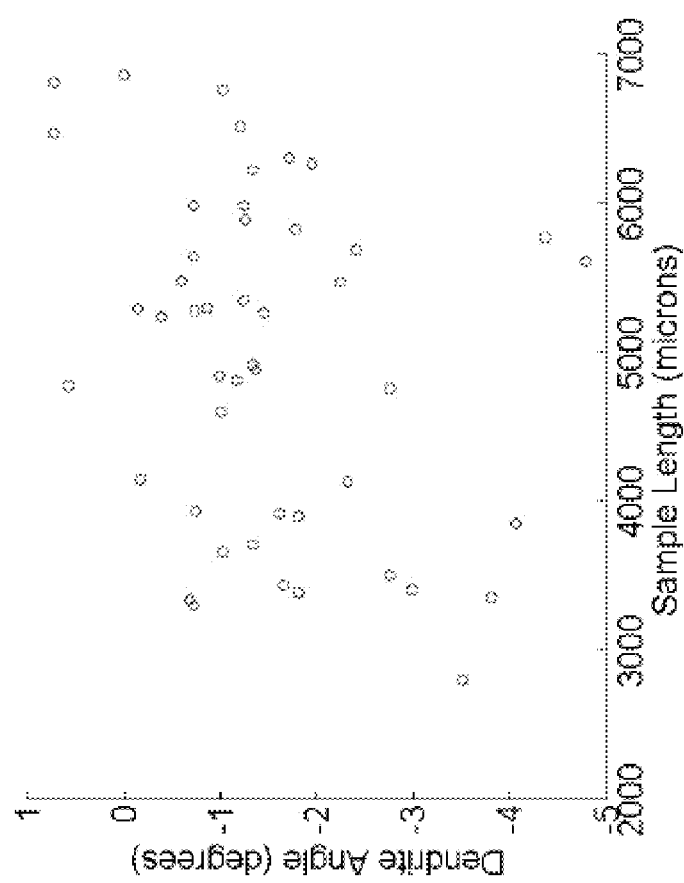
FIG. 42 is a representation of an angle of newly deposited dendrites along the sample length, in accordance with some embodiments of the present invention.

In some embodiments, the angles of the dendrites can then be found for each line generated with the location along the x-axis, the length of the sample, and the angles can be saved for further analysis. In some embodiments, only the longest dendrites tracked can be used to provide data for this microstructure feature to give a more accurate representation. The points generally terminate near the meltback line, however, as it is the angle relative to the substrate that is needed. FIG. 42 depicts a simple plot is shown with the angle of the primary dendrite being along the y-axis and the length of the sample along the x-axis.

Finally, in some embodiments, the width of the primary dendrite trunk can be found for each of the lines along their entire length. The heat map previously created can then be differentiated in the x-direction so that the transition from the dendrite trunk to the secondary growths, which were blurred in a prior step, is highlighted. For each point that was generated in the line, e.g., every five pixels, the transition from trunk to secondary growth can be found to the left and right of the point.

To accomplish this efficiently, an assumption can be made that the center dendrite trunk area is clipped, or close to it, in the image. Since the center area of the trunk spans many pixels this assumption can be shown as in Equations 8 and 9. A search can then be conducted to the left and right of the point in question looking for a pixel that has the first derivative that is not equal to zero.

$$\frac{dy}{dx} = 0 \tag{8}$$

$$\frac{d^2y}{dx^2} = 0 \tag{9}$$

In general, the interior of the dendrite trunk will have a small variation in value near its edges and this is taken into effect. In some embodiments, when a nonzero value of the first derivative pixels is located, it can be checked against a large threshold (e.g., 20) through analysis of multiple dendrite trunks. If the pixel in question is below the threshold then it is most likely not the edge of the trunk and a value can be saved that is slightly greater than the one in question as a secondary threshold. As the search continues, if a pixel in question exceeds this second threshold then it can be assumed to be the edge of the trunk. Looking at the second derivative of the heat map at that point can then determine if the termination point is on the left or right side of the trunk.

$$\frac{dy}{dx} < 0 \Rightarrow \text{Right Side Termination} \tag{10}$$

$$\frac{dy}{dx} > 0 \Rightarrow \text{Left Side Termination} \tag{11}$$

In some embodiments, the search can be made both to the left and the right of the original point from the created contour. If the search conducted to the right of the original point does not result in finding a right side termination, then the data found can be labeled as error prone and can be excluded. In some embodiments, this same analysis can be done on the left side. This check can help mitigate issues during operation.

Figure 43:
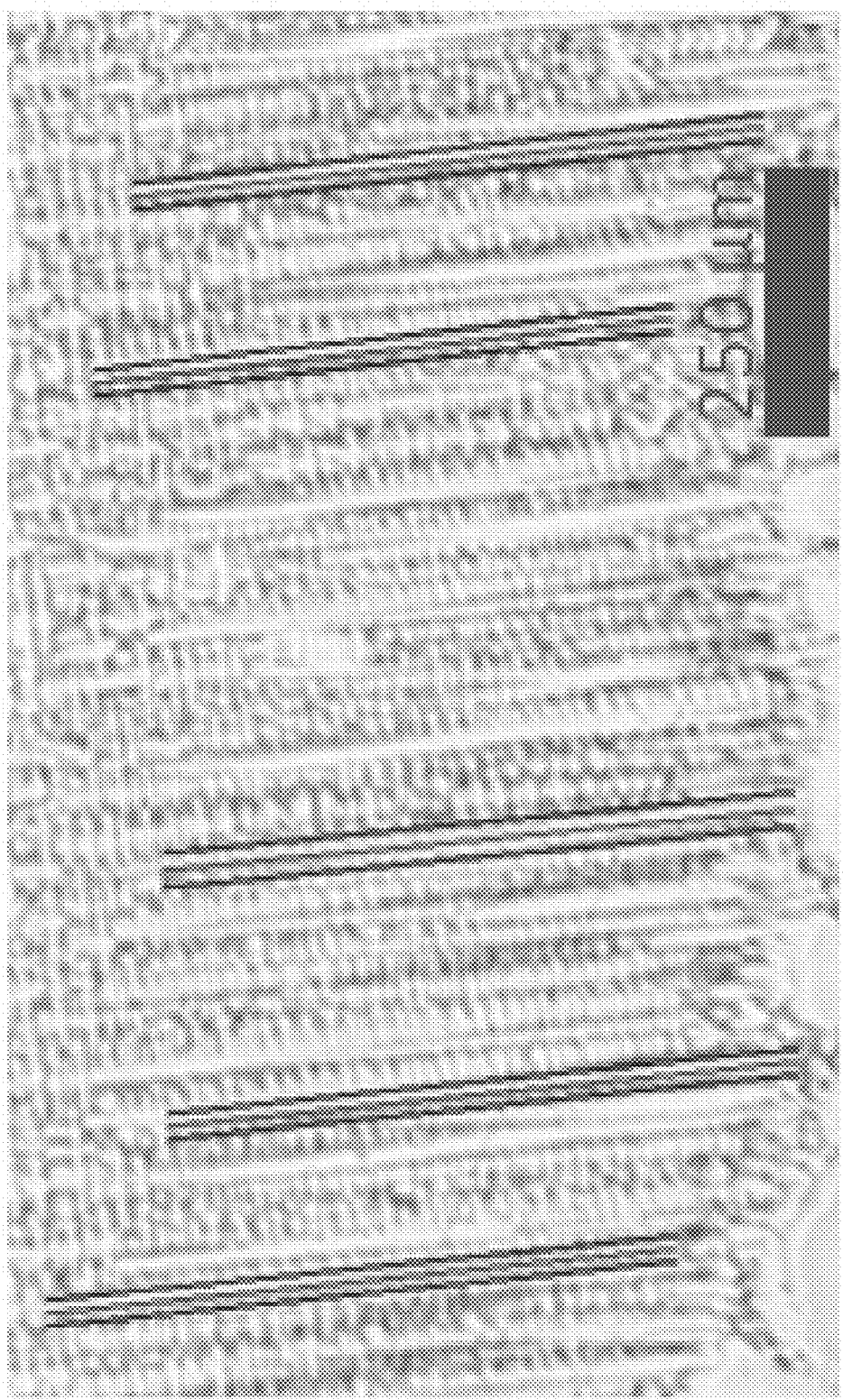
FIG. 43 is a representation of a dendrite width overlaid on a CMSX-4 image, in accordance with some embodiments of the present invention.

After completing this analysis for every point, the average can be found for the dendrite and saved relative to the location along the sample length. FIG. 43 uses the starting and ending points for the accurate dendrites to draw a straight line near the center of the primary dendrite trunk, as shown with the red line. The two blue lines are created at an offset to represent the average width along the dendrite length.

Meltback Depth Tracking in Equiaxed Alloys

Figure 44:
FIG. 44 is a representation of an initial image of René-80 microstructure, in accordance with some embodiments of the present invention.

Unlike CMSX-4, and other single-crystal superalloys, equiaxed superalloys do not generally have a clear transition from the substrate to the re-melted region (denoting the meltback line). When viewing FIG. 44 at this scale, for example, it is difficult to see where the meltback line is across the entire length.

Figure 45:
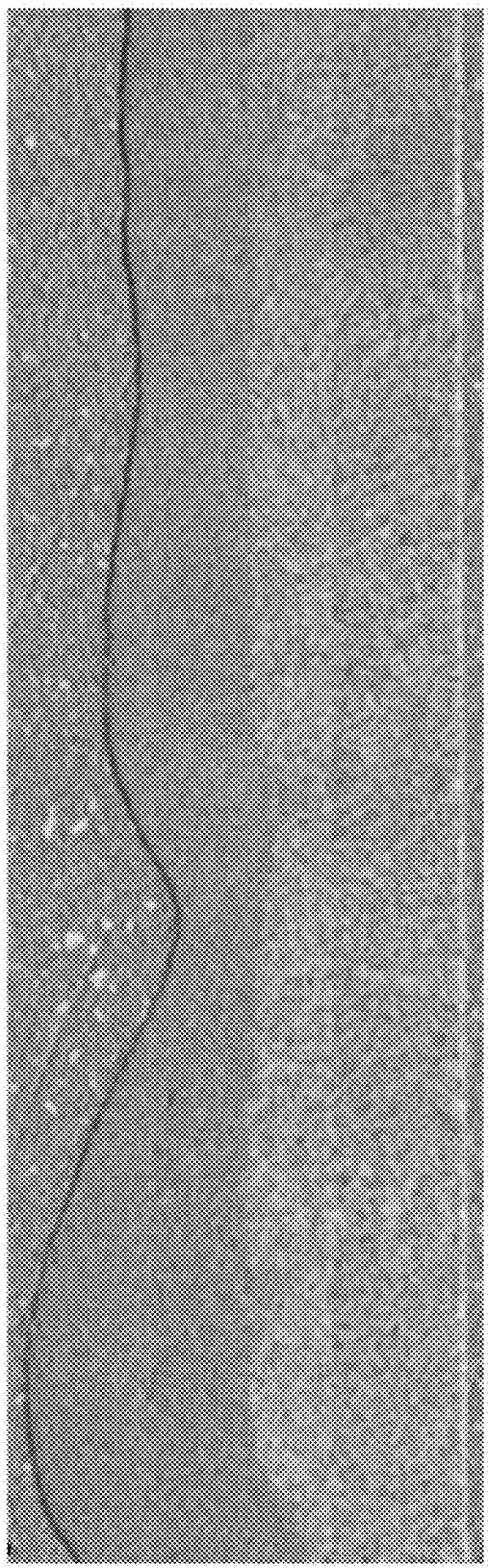
FIG. 45 is a representation of a René-80 image after averaging the pixels, in accordance with some embodiments of the present invention.

In some embodiments, therefore, several steps can be taken to better realize the transition points in the image by looking at small features found in equiaxed alloys, such as René-80, that change across the meltback line. In some embodiments, the first step can be to average each pixel of the image using an appropriate kernel (e.g., 11×11). This can be done because the deposited material has a finer amount of variation across it, but it also tends to be slightly lower in intensity than the cast section. As shown in FIG. 45, the meltback line becomes more visible though some areas are still problematic and further processing must be completed before the meltback line can be isolated.

Figure 46:
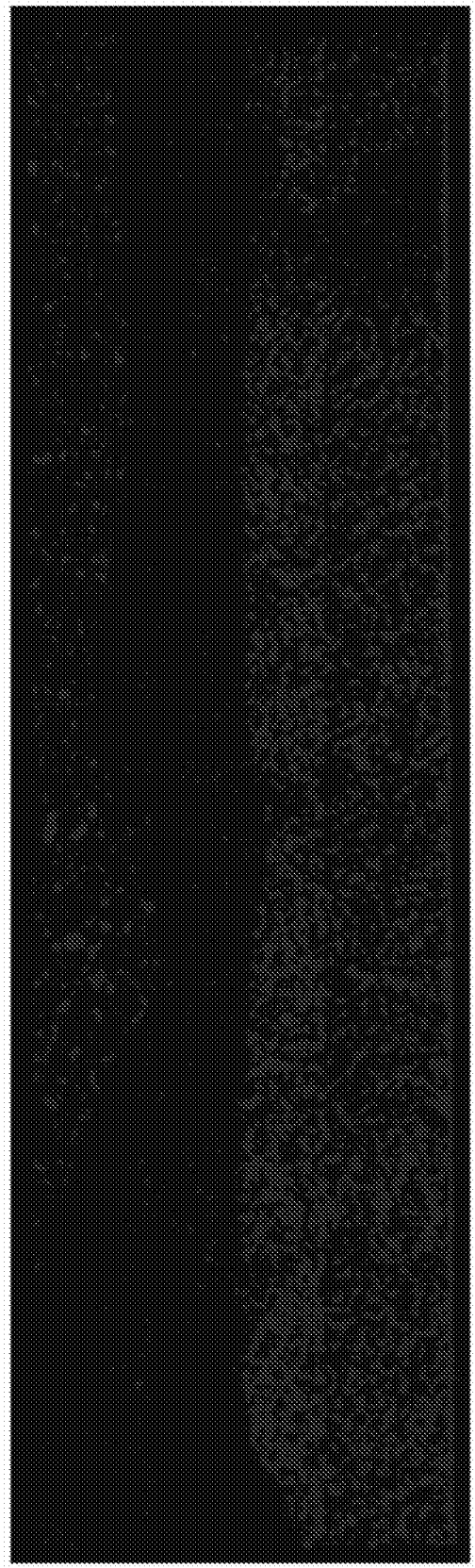
FIG. 46 is a representation of a René-80 sample after averaging and a binary threshold, in accordance with some embodiments of the present invention.

In some embodiments, searching along the bottom of the substrate and the top of the sample, using the top and bottom lines found while isolating the sample, average pixel values for the two regions can be determined. Using an intensity value between the upper and lower numbers and subtracting that amount from the image gives a starker contrast between the substrate and remelted region by making a majority of the substrate positive, while the newly deposited region becomes negative. An opening algorithm can then be used on the image to better connect separate features and fill holes found in high intensity locations. In some embodiments, the image can then be converted to a binary image, using a zero value threshold, as shown in FIG. 46. This resulting image makes the transition from the substrate to the processed section easily visible to the eye.

This data map provides a good contrast at the meltback depth, but some areas still lack values indicating a transition, specifically near the end of the sample in FIG. 46. The blue region that is located inside of the substrate along the right side the image, for example, will cause an active contour to treat it as though it is a part of the newly processed section, giving a false positive. The main difference between large blue regions in the substrate and the blue regions in the newly formed sections is that the substrate areas are still in close proximity to the red islands. Using this reasoning, therefore, an additional step can be undertaken to assess the proximity of each pixels to a zero pixel, shown in FIG. 46 as red points.

In some embodiments, a distance transform of the image can be taken using a Euclidean distance. Distance transforms of a binary image can denote each pixel, or voxel if the matrix is 3-D or larger, by the distance to the closest non-zero pixel following Equation 12. The d(p, $q_k$) term can utilize the Euclidean distance, Equation 13, to find the distance between original pixel p and potential pixel q located within image P. This can be repeated for all points k within the listed set of S and the minimum path is chosen.

$$t(p) = \min_k \{d(p, q_k) : P(q_k) = 0 \ 1 \le k \le S\} \tag{12}$$

$$\sqrt{(x_1 - x_2)^2 + (y_1 - y_2)^2} \tag{13}$$

Figure 47:
FIG. 47 is a representation of a René-80 binary plot analyzed for distance to high pixels, in accordance with some embodiments of the present invention.

This provides a template, as shown in FIG. 47, denoting each pixels distance from the closest nonzero pixel.

Figure 48:
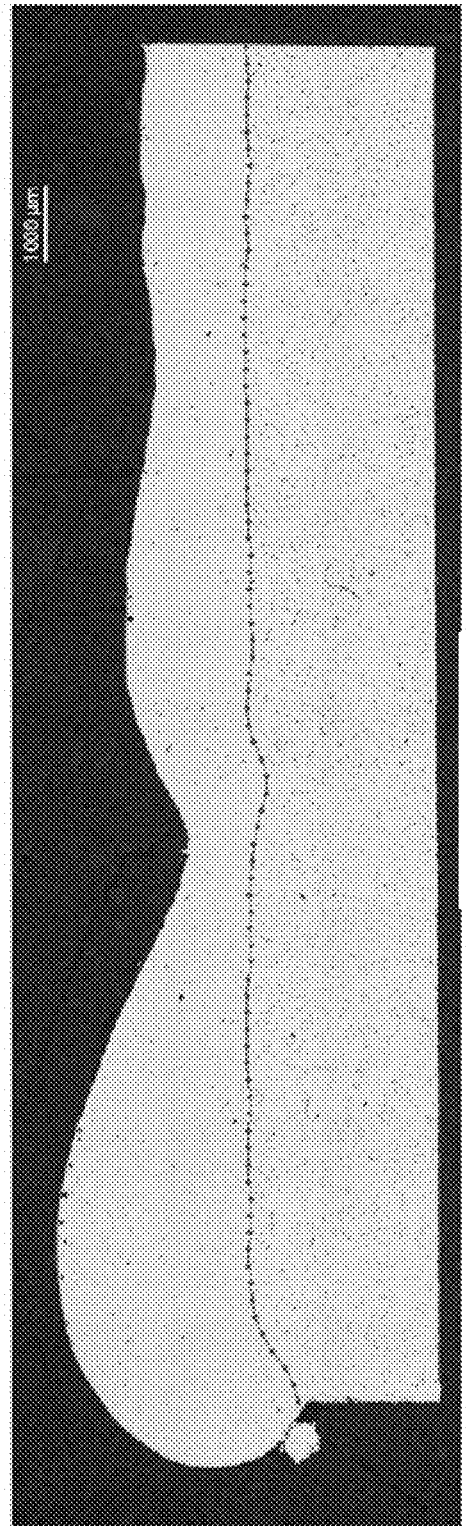
FIG. 48 is a representation of a meltback line tracked across an entire René-80 sample, in accordance with some embodiments of the present invention.

In some embodiments, overlaying the two maps, while putting greater emphasis on the binary image than the distance mapping image, can provide a detailed transition between the substrate and the remelted section of the sample, while minimizing errors found in the binary image. The meltback line can be found with a good consistency in samples as shown in FIG. 48 and, with the inclusion of the binary distance mapping, the active contour can bypass sections of local minimums.

Figure 49:
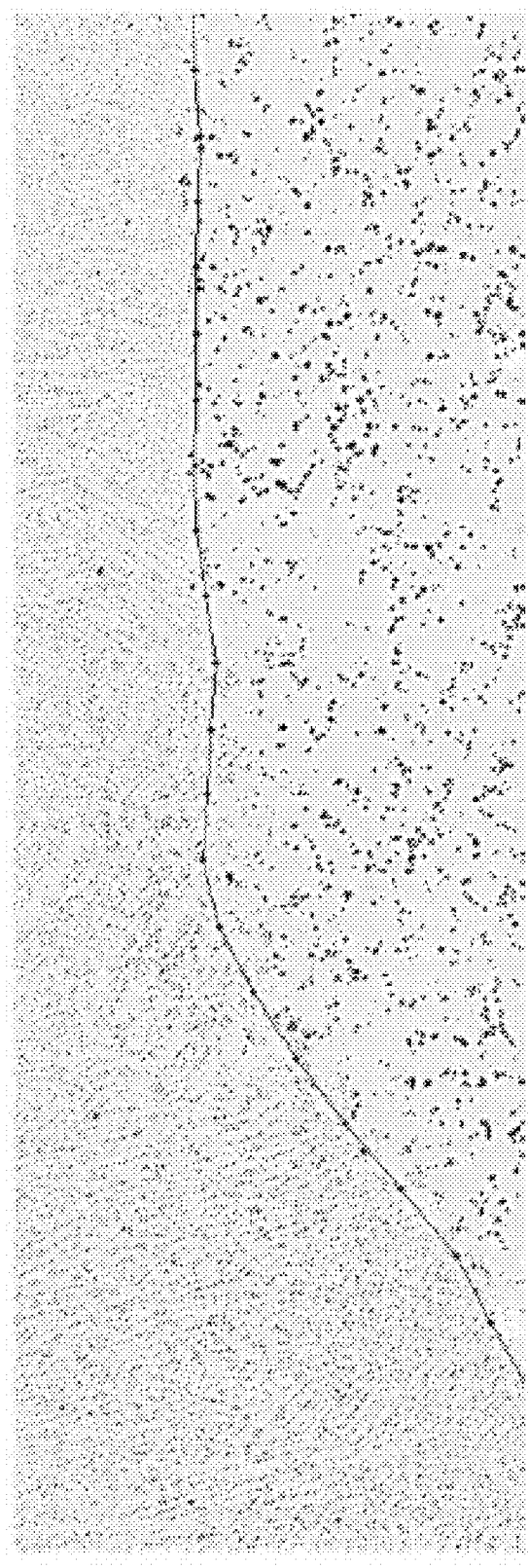
FIG. 49 is a representation of a close-up view of the René-80 meltback line, in accordance with some embodiments of the present invention.

Because it is difficult to see the meltback transition using an original, unaltered, image, a closer look can help provide a better visualization. As seen in FIG. 49, the newly processed section, on the upper portion of the image, has a larger amount of intensity variation, which is a major point of separation used to find the meltback.

Figure 50:
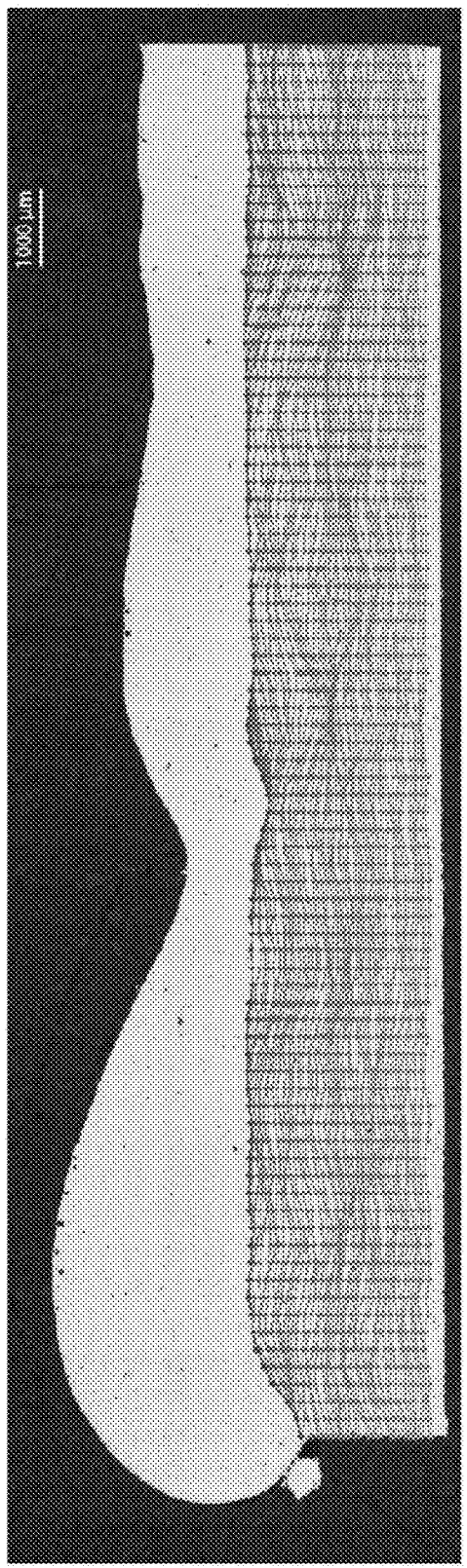
FIG. 50 is a representation of the active contour steps taken when finding the meltback depth of a René-80 sample, in accordance with some embodiments of the present invention.

In some embodiments, when finding the meltback depth, the active contour is initially created near the bottom of the substrate and then propagates upwards. FIG. 50 depicts the active contour steps that can be taken to converge to the solution viewed above. Of special note is the right side of the image in the region where the problematic area was described earlier. As can be seen the active contour was able to bypass the local maximum area. It should be noted that, if the second heat map—created using the Euclidean distance from a pixel to a high intensity pixel—had been given a larger weight, then this area would be less problematic. An unintended consequence of doing so, however, would be a less severe transition at the meltback depth.

Crack and Pore Tracking

When locating the cracks and pores, a primary feature of the image is the intensity values found in the cavities, because it is closely associated with the intensity of the surrounding Bakelite. Using a threshold on the image based on this information, therefore, a binary image can be created, as shown in FIG. 51. This can generate a near ideal situation where only the pores and the cracks, shown in red, are discernible from the sample's body.

In some embodiments, using an algorithm that tracks connected components in a binary image, a list of each section shown in red in the image above can be isolated. Substantially every pixel of the image can be searched, with each being either one or zero. When a zero value pixel is found, denoting a crack or pore, a flood algorithm can be used. A flood algorithm finds all connected points of the same characteristic, in this case zero valued pixels. From the starting pixel, each neighboring pixel can be investigated. If a searched pixel is the value of interest then it can be recorded as a pixel in the flooded section. For each new iteration, each neighboring pixel to the flood section can be checked until no additional pixels are found. For each step, the newly added pixels can also be searched for duplicates and trimmed accordingly.

In some embodiments, each listed flood section can then be searched for multiple criteria to establish its relevance and type. First the area of the component, for example, can be determined. Next the major axis of the tracked object can be called and used as the diameter of a circle when finding a theoretical area, with the radius denoted as M. By comparing the area calculated, which is representative of a perfect circle, and the actual area of the component in question, a crack can be differentiated from a pore. Cracks tend to have a long major axis, for example, extending along the length of the crack, which would create a large ideal circular area. When comparing this area to the actual crack area, the number tends towards zero in contrast to a pore that is more circular in nature which tends towards one.

$$\text{Eccentricity} = \frac{\text{Flood Area}}{\pi M^2} \quad (14)$$

Figure 52:
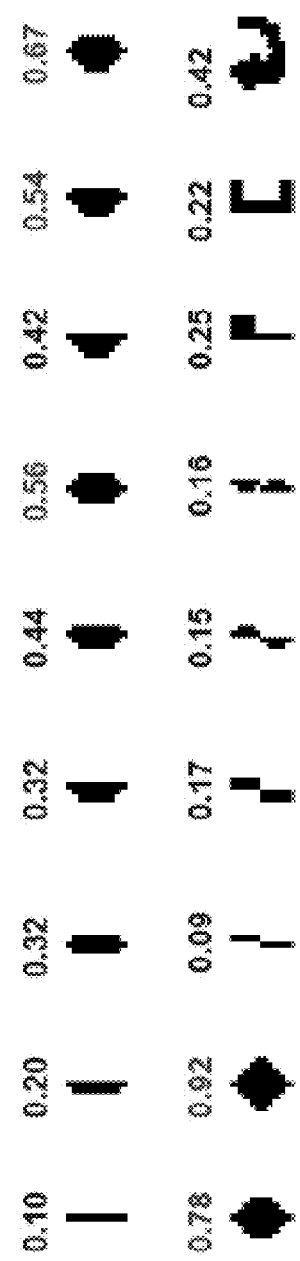
FIG. 52 is a representation of sample shapes used to isolate settings for cracks and pores, in accordance with some embodiments of the present invention.

To best determine whether an object is a pore or a crack using the method above, it can be desirable to explore a number of sample shapes. FIG. 52 depicts a group of objects that were tested. As can be seen in the image, there is a sharp contrast between circular and lined shapes. In some instances, however, there can be an issue with differentiating between the two. As a result, a system that will make problematic shapes easily viewable has been incorporated in the program. In this manner, the shape in question will have been identified as either a crack or pore at the time of the search. At this point, it is a simple matter for the experimenter to alter which list a shape is on and if corrective measures are needed.

Figure 53:
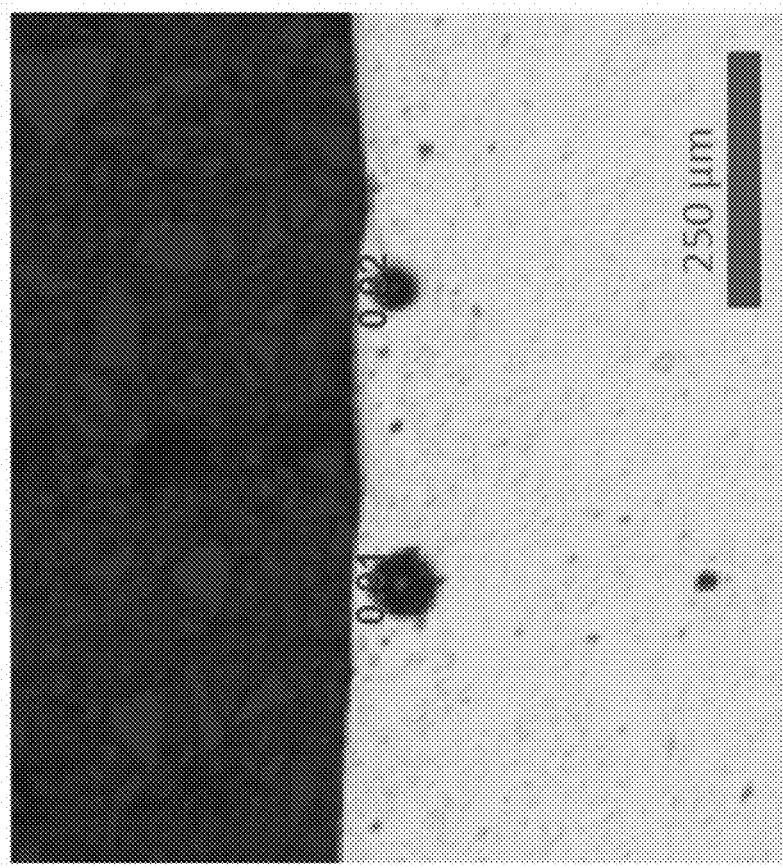
FIG. 53 is a representation of pores found on a René-80 sample with level of circularity labeled for each, in accordance with some embodiments of the present invention.

In some embodiments, after checking each component found in the image for their degree of circularity, the final results can be tabulated for later use and shown on the original image, as seen in FIG. 53. On a final output image, all of the pores are highlighted with red, the cracks are highlighted with blue, and the problematic shapes are denoted with green. As shown, the number of problematic shapes is very low relative to the total number of pores and cracks in the sample, usually being close to zero. The color system nonetheless enables quick and easy visual inspection of the operation.

The disclosed pore and crack tracking program over prior art systems is that it not only recognizes the pores and cracks, but can also track where they are relative to the meltback line. This can separate the features found in the cast section of the material and the newly formed deposit, which is of greater significance for developing the SLE process.

Data Retention

As each sample is analyzed using all of the microstructure recognition programs described above, the data is preferably organized and saved for later use. Some data is in the form of a single value, such as the power level of the laser for the sample in question, while others are vectors thousands of cells long. As a result, any attempt to organize information by samples is preferably able to contain these different types.

In some embodiments, structure arrays, which can hold various fields and data, can be used in Matlab, or similar programs, to save this information. In this manner, alloys such as CMSX-4 and René-80 can each have their own structure array to contain all of the information for each sample analyzed. As a new sample is being investigated, a new structure can be added to the structure array for that specific sample. This allows an ever increasing number of samples to be added in subsequent experiments. Table 2 depicts exemplary fields associated with each structure, the information for the sample in question, for CMSX-4 and Rene-80.

TABLE 2

CMSX-4 and Rene-80 Retained Microstructure Information.

| CMSX-4 | Rene 80 |
|---|---|
| Sample Name | Sample Name |
| Laser Power | Laser Power |
| Scanning Velocity | Repeat Velocity |
| Repeat Scans | Raster Velocity |
| Powder Thickness | Repeat Scans |
| Substrate Deformation | Substrate Deformation |
| Total Deposit | Total Deposit |
| Melt Line | Melt Line |
| Melt Depth | Melt Depth |

TABLE 2-continued

CMSX-4 and Rene-80 Retained Microstructure Information.

| CMSX-4 | Rene 80 |
|---|---|
| SX Deposit | Pore List |
| SX Angle | Crack List |
| Substrate Angle | Microns Per Pixel |
| SX Width | |
| Microns Per Pixel | |

Data Analysis

Figure 54:
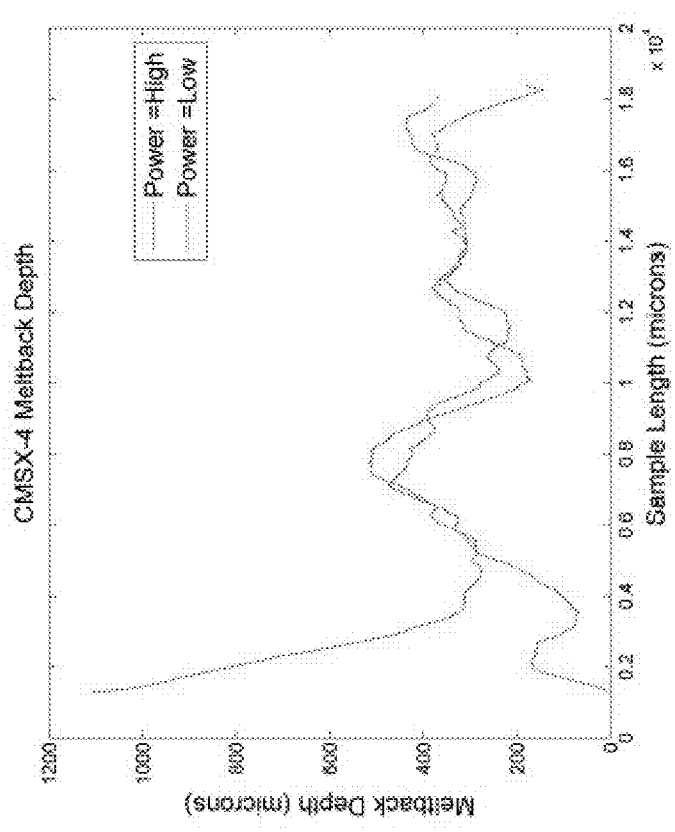
FIG. 54 is a representation of a direct comparison of two CMSX-4 samples for meltback depth, in accordance with some embodiments of the present invention.

Several methods can be utilized to interpret the information gathered in the microstructure investigation stage, the first being to better visualize the features. In the past, when comparing different samples visually to try and find relations between microstructural features and SLE settings, the only approach was to print the images onto computer paper and lay them side-by-side. Using the information saved in the Matlab structure, however, it is now possible to plot the information and, if desired, overlay multiple lines onto the same plot. Virtually any continuous feature, such as meltback depth or deposit height, can be plotted as lines to contrast these characteristics. While many samples can be plotted, some comparisons hold greater significance than others. By plotting samples that have only one SLE parameter changing between them, such as laser power, for example, the first order interaction with the feature being shown can be better visually compared. FIG. 54 shows a plot comparing two samples where the only change in settings is the laser power. As shown, this highlights where the power setting has greatest significance on meltback depth.

In some embodiments, to save time and effort, a function can be created to search through all samples of the same material (e.g., CMSX-4 or René-80) to find all of the groups of samples where a single parameter is changed. Plots like the one above can then be created for each group showing the significance of every feature. This can enable relevant information to be relayed to the experimenter, giving a greater chance for the observation of the lower order effects caused by individual parameter changes, for example.

Figure 55A:
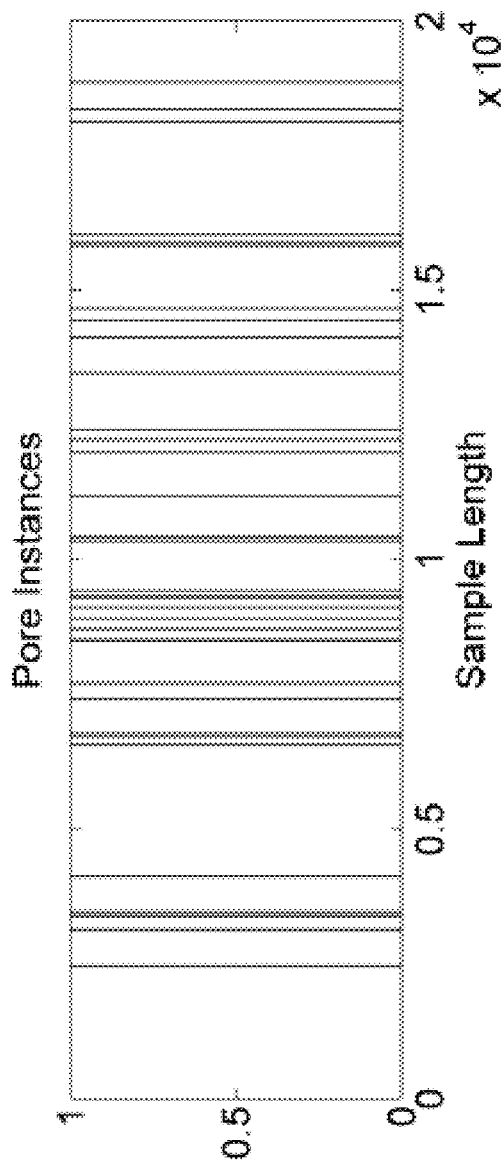
FIGS. 55a-55b are a representation of pore and crack delta plots, respectively, for a René-80 sample, in accordance with some embodiments of the present invention.
Figure 55B:
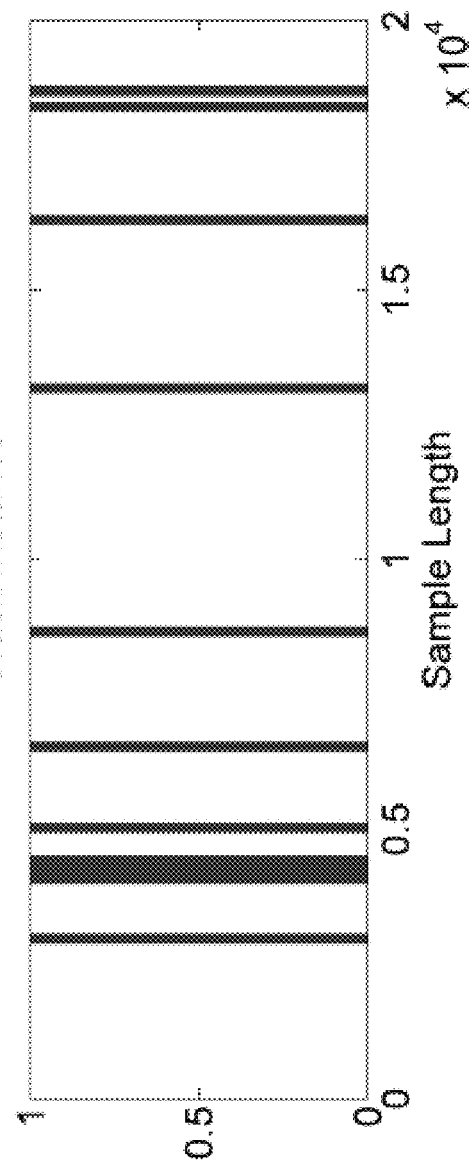

Some features cannot easily be plotted as single lines and are represented in ways that best features their occurrence. For pore and crack feature detection, for example, the output can be a list of every pore and crack along the sample. In this manner, a delta plot can be an advantageous way to visualize the information. FIGS. 55a-55b show two plots created from the same sample with each peak value indicating either a pore or a crack. These plots can also have different samples overlayed onto each other to allow for comparisons between different samples. This can provide a good representation for both the frequency of pores and cracks while also giving an indication of where they are located. Totals of each can also be easily tabulated to give the user a single value to compare different specimens.

Figure 56:
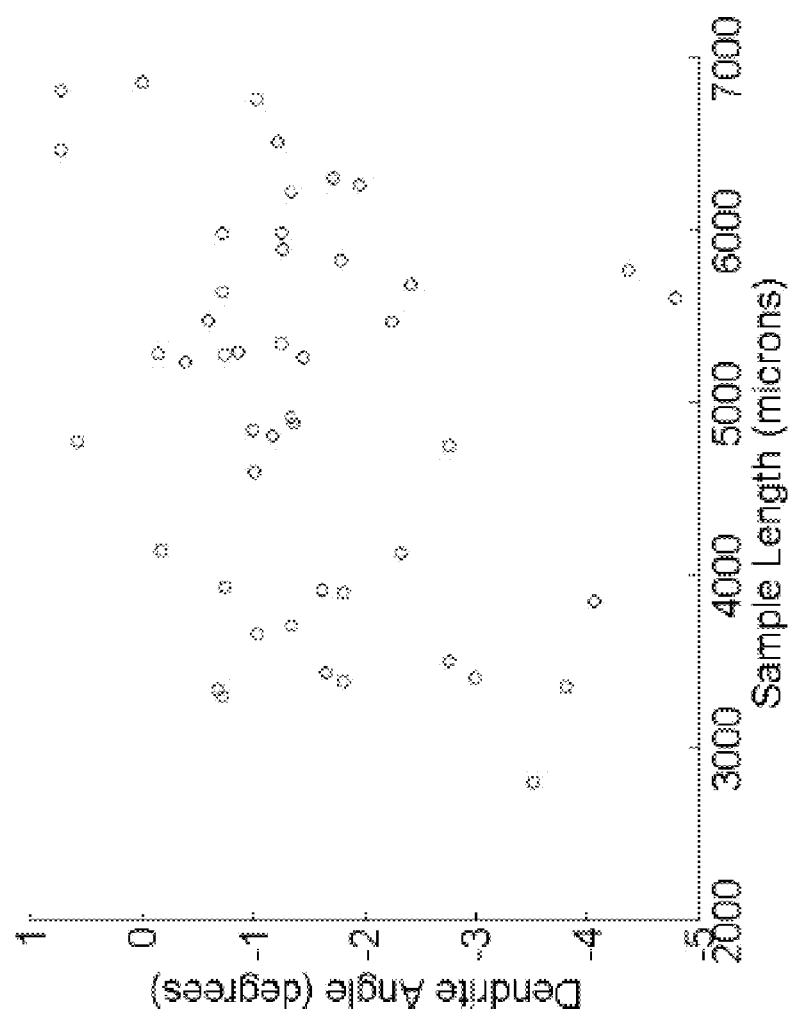
FIG. 56 is a representation of an angle of primary dendrites across a sample length, in accordance with some embodiments of the present invention.

In other embodiments, another unique feature that can be tracked is the angle of the primary dendrite in the newly formed material relative to the underlying substrate's dendrite angle. The location of each dendrite tracked can be saved in the structure array along with the angle of the dendrite at that location. Outputting a plot with the sample length along the x-axis and the angle of the dendrite on the y-axis can provide a visualization of the dendrite angles going across an individual sample, as shown in FIG. 56. It is also possible to plot a linear or quadratic fitted line for each sample's angle data, providing a simpler interpretation of the microstructure feature.

Finally, in some embodiments, the various microstructure features can undergo data fitting to find an equation that best fits the parameters to the feature in question. This can be done, for example, using two distinct steps, i.e., window types and fitting types. Each sample can have the information tracked for a feature windowed into smaller subsets for analysis. It can start, for example, as a single window, which encompasses the entire sample, and then can be increased to two, three, and four windows each of equal size.

A data fitting equation can then be found for each window. When finding this fit, a linear equation can be attempted, followed by a quadratic, and finally a combinational equation that combines effects like (power)×(scan speed), for example. In some embodiments, each of these data fitting equations can then be checked for degree of accuracy for the single window and the best choice can be saved. After this is attempted for each window in a single sample, the degree of accuracy for all of the best data fitting equations can be found and saved. This global fit can then be compared for each window size to find the equation that will provide the most accurate representation.

In some embodiments, once the ideal data fitting equations are found for a sample, the number of equations (based on the best window size) can be determined and each equations constant's can be reviewed. When performing the search for the best type of data fitting equation, all of the relevant terms are used, so when trying a quadratic equation each parameter can have a linear and squared term, to simplify the search. At this point, when only a small number of equations need to be reviewed, each term in the equation can be searched for its importance.

With a complete set of data fitting equations for each sample, a set of predicted points can be calculated along with their degree of uncertainty. Using a combination of these predictions, a global map can be created that depicts areas of interests on the process map for future trials. In some embodiments, a search can be conducted in two areas of the process map: (1) locations of high certainty for each prediction and (2) areas for medium certainty. High certainty denotes locations that are well explored and give a high confidence to the predicted value. Medium certainty predictions, on the other hand, are those that extend slightly beyond the area of testing. The best prediction can then be found for each of these certainty types and compared. If the best point is located in the medium certainty area, for example, then further exploration may be needed for the process map. As a result, a fractional factorial DOE can be created in the region of the best point found. If the best point was located in the high certainty region, however, then no further exploration is likely needed. Instead a response surface DOE can be completed to provide a detailed analysis of the area in question.

Secondary Dendrite Arm Spacing Tracking

In some embodiments, the system can be used for tracking of the secondary dendrite arms found in a single crystal deposit. The secondary dendrite arm spacing is affected by the cooling rate as the material solidifies. As a result, knowing how it changes during the process or between different samples can provide insight into how the melt pool behaves during operation. The secondary arms can be tracked, for example, using the primary dendrite trunk width information. In other words, knowing where the trunk ends, and the secondary arms begin, means that a search can be conducted just beyond the traced section. In this manner, the procedure used to better exemplify the primary dendrite arms can be modified to highlight the secondary arms instead. Blurring in a direction perpendicular to the primary dendrite angle, for example, can provide a clearer image of the secondary arms while mitigating the primary dendrites.

Stray Grain Tracking

In CMSX-4 samples, for example, it would be beneficial to track the stray grain formations (both their location and size). The number of stray grains is preferably minimized during fabrication, so gaining further insight into how they are created can prove beneficial. Stray grain formations have been a common area of research for Ni-based superalloy welding techniques and continue to hold a great deal of interest in the industry.

Most major stray grains can be found by investigating regions within the single-crystal zone that do not contain tracked primary dendrites. Instead of using a procedure to find angles close to the vertical direction, for example, steps can be taken to search at several other angles. Checking these areas for primary dendrites at irregular angles, compared to the single-crystal zone at large, can indicate stray grains. Another technique uses the fact that many stray grains are formed at the meltback line. This provides a smaller area to explore for major stray grains and can simplify the process.

Further Testing

The data analysis and fitting operations detailed above make use of substantially all the information currently available for CMSX-4 and Rene-80 parts. In some embodiments, therefore, improved analysis and further relations can be found by increasing the number of trials for each material, running the microstructure investigation program, and performing additional sets of data fitting runs. The system discussed above enables future trials to be easily included with the current information to provide an easily expanded the data set.

Void Mitigation

When investigating the voids found in René-80, for example, there was no correlation found between the laser power, scanning speeds or repeats and the resulting voids. Since the primary cause of voids is generally impurities in the melt pool causing poor resolidification, a series of experiments can be conducted to reduce void formation. By tracking how the powder is prepared, loaded onto the substrate, and the operating conditions within the chamber, for example, the data fitting program can be applied.

Additional DOE Work

Another area for future improvement is in the DOE portion of the program. Currently the program provides two types of experimental setups: fractional factorial or response surface. These two types provide the most important designs when it comes to exploring and mapping a process, but additional steps can be applied. In some cases, other types of DOE's can be used, such as a Taguchi L9, a type of fractional factorial DOE that was designed for three level factors. The system can also use an improved fractional factorial generator. Giving the system the ability to be rotated to provide more useful information, for example, while maximizing the orthogonality to the global data is one example.

Feedback Control of the SLE Process

The addition of real-time feedback control to the area of additive manufacturing has been targeted in road maps for additive manufacturing as an area of high interest due to the relative lack of research done in the area in the past and the potential impact that proper control could have on the quality of parts that are able to be manufactured via additive processes. In some embodiments, therefore, the system can include the development of a real-time feedback control system to control the SLE process and enable higher repeatability, greater uniformity, and functionally graded microstructures.

As discussed above, it is possible to develop process maps for creating high quality deposits using open loop control for SLE or other related technologies. One of the concerns when developing these process maps, however, is that it can be an expensive and time consuming process, especially when using exotic materials such as those used to produce high temperature turbine components. Additionally, current additive manufacturing processes are unable to account for disturbances or anomalies during processing, potentially leading to issues with repeatability. When producing multi-layer parts composed of hundreds or thousands of layers, however, it is critical to make sure that there are no inclusions or problematic spots in any layer. Any defects in the part will likely deem it unusable for high performance applications such as the hot section of a turbine engine.

Real-time feedback control of the SLE process, on the other hand, can increase the repeatability of the process and allow tighter control of microstructure than open loop control, while reducing the number of samples required before developing proper parameters. Real-time feedback control can address one of the primary desires in further development of the SLE process, enabling it to produce multilayer components of specified functionally graded microstructure, by making it robust to changes in geometry or disturbances during processing.

Figure 57:
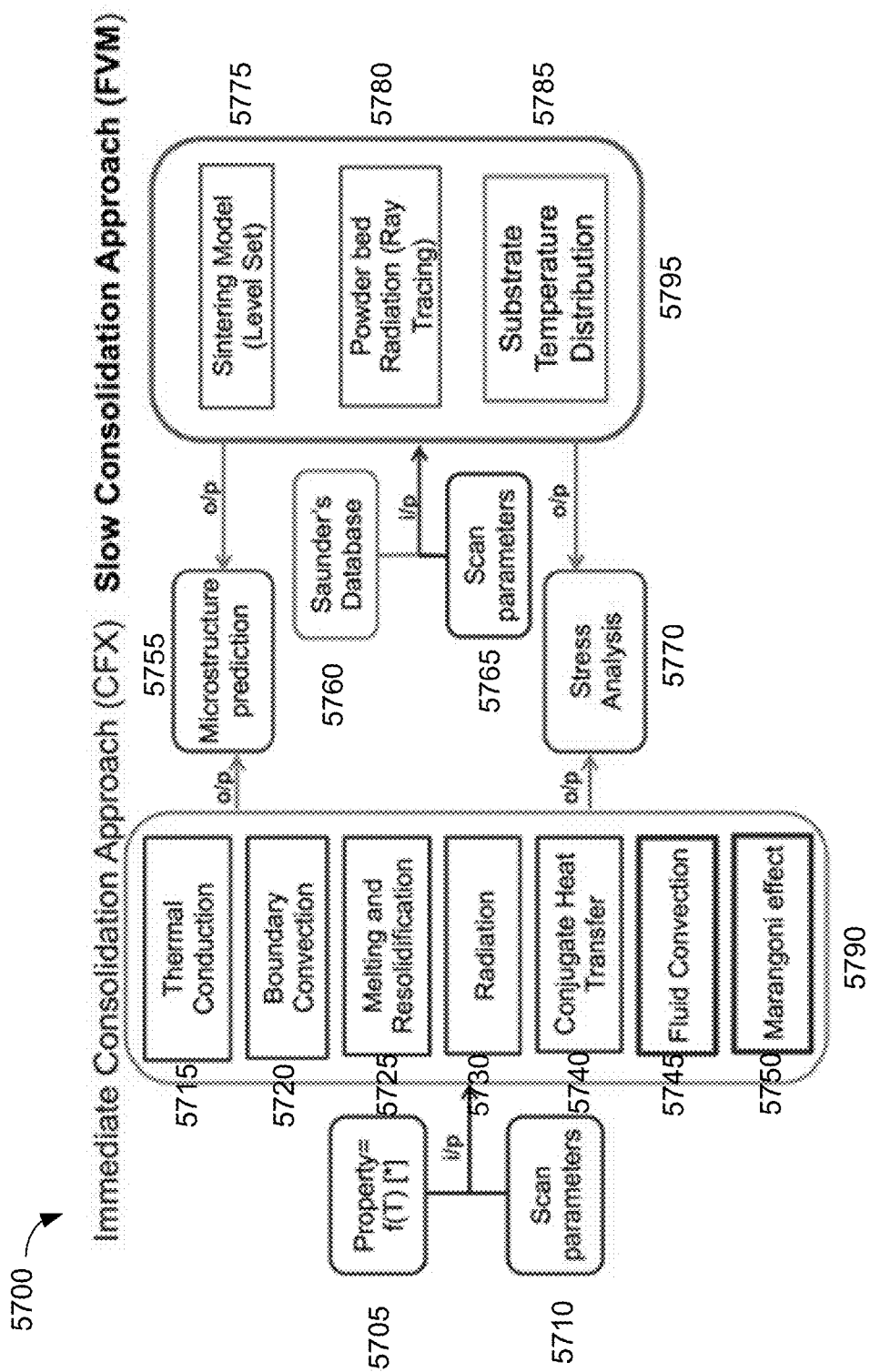
FIG. 57 is a representation of an overview of the end goal offline model being developed alongside this research for prediction of microstructures produced via SLE, in accordance with some embodiments of the present invention.

In some embodiments, these control schemes can enable the tracking of a pre-defined temperature profile generated by a complex offline model being developed for SLE. An overview of the physics-based offline model 5700 currently being developed to model the SLE process is shown in FIG. 57. The system can comprise microstructure prediction 5755 and stress analysis 5770. In some embodiments, the system 5700 can comprise a part module 5790 that relates to part properties (i.e., the object being repaired or manufactured) and a system module 5795.

The part module 5790 can comprise property 5705 and scan parameters 5710 as inputs and can track a number of process parameters including, but not limited to, thermal conduction 5715, boundary convention 5720, melting and resolidification 5725, radiation 5730, conjugate heat transfer 5735, fluid convection 5740, and the Marangoni effect 5750. These elements can act as inputs to the microstructure prediction 5755 and stress analysis 5770.

The system module 5795, on the other hand can include the sintering model 5775, powder bed radiation 5780, and substrate temperature distribution 5785 can be inputs to the system. The system module 5795 can also receive Saunder's database 5760 and Scan parameters 5765 as inputs. The system module 5795 can provide additional inputs to the microstructure prediction 5755 and stress analysis 5770

In some embodiments, a comprehensive physics-based model of the SLE process can be a combined computational fluid dynamics and finite volume analysis model that takes into account, for example and not limitation, heat transfer, fluid flow, and solidification characteristics. The model can be used to both develop predictions of what microstructure is produced under certain operating parameters, and what operating parameters will be required to create particular desired microstructural characteristics. Utilization of this comprehensive model, in conjunction with the development of a real-time control scheme to implement the parameters and temperature fields developed by this offline model, can enable the production of heterogeneous multifunctional components with functionally graded microstructure via the SLE process.

Figure 58A:
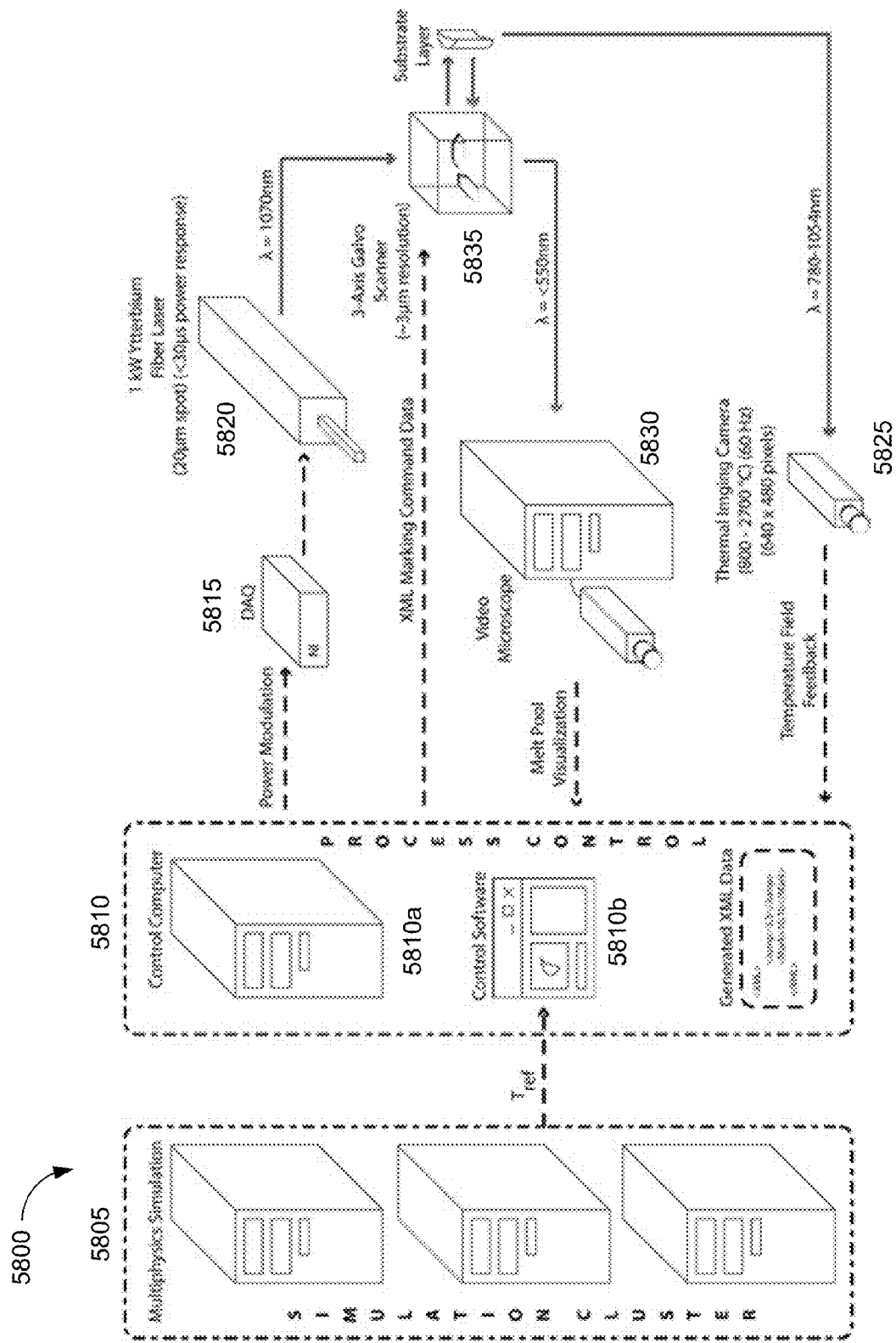
FIG. 58a is a representation of a schematic overview of the hardware and software involved in control of the SLE process, in accordance with some embodiments of the present invention.

A schematic overview of the components involved in the real-time control scheme for the SLE process is shown in FIG. 58a. The system 5800 can comprise, for example and not limitation, a multi-physics, or other suitable, simulation 5805 and a control system 5810 comprising a computer 5810a and code 5810b, a power modulator 5815, laser 5820, and one or more galvanometers 5835. The key components of the control system are the temperature feedback data provided by the thermal imaging camera 5825, the laser power control 5815 provided by the DAQ board, and the process control software 5810b implemented on the control computer 5810a that ties the system together. In some embodiments, the system 5800 can also comprise a video microscope.

Figure 58B:
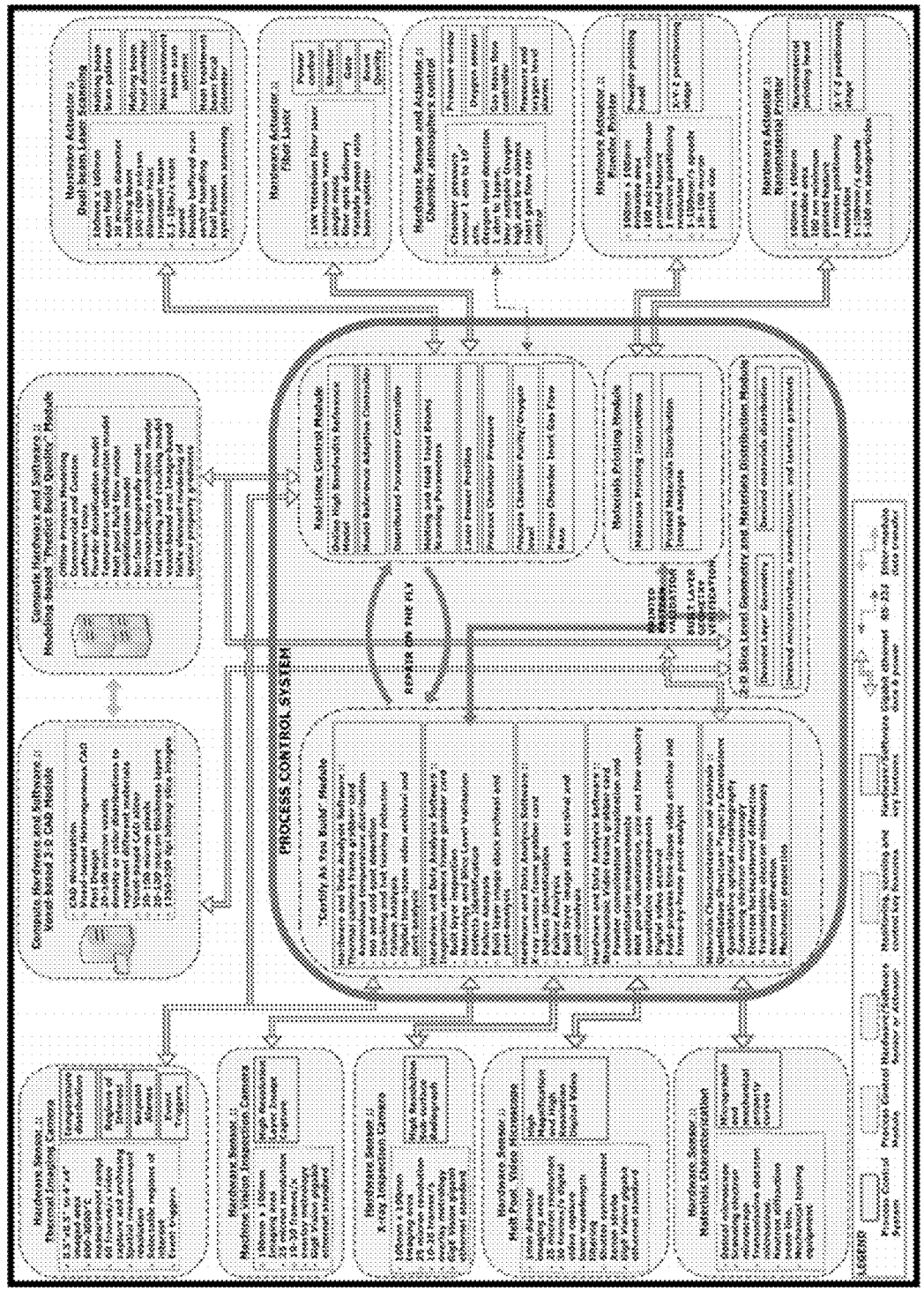
FIG. 58b is a more detailed representation of a schematic overview of the hardware and software involved in control of the SLE process, in accordance with some embodiments of the present invention.

A more detailed view of an exemplary control system is depicted in FIG. 58b. The system can include one or more of the following component types: (1) Hardware sensors (e.g. thermal imaging camera, machine vision inspection camera, X-ray inspection camera, and melt pool video microscope); (2) Hardware actuators (e.g. dual-beam laser scanning, fiber laser, powder printer, and nanomaterials printer); (3) Hardware sensor and actuator (e.g. chamber atmosphere control); (4) Compute Hardware and Software (e.g. Voxel-based 3-D CAD module, and Modeling-based "Predict Build Quality" module); and (5) Process Control System. The Process Control System in the center of FIG. 58b can itself be comprised of one or more of the following modules: (i) "Certify As You Build" Module, involving acquisition and processing of real-time signals from various hardware sensors; (ii) Real-time Control Module involving laser processing, laser scanning, and chamber atmosphere control parameters; (iii) 2-D Slice Level Geometry and Materials Distribution Module; and (iv) Materials Printing Module. Of course, additional and/or different components could be used and are contemplated herein.

In some embodiments, temperature measurements from the thermal imaging camera can provide feedback in model-based real-time adaptive control schemes to be implemented as described below. Closed loop real-time feedback control of the temperature distribution in the laser processing zone can be implemented through the real-time regulation of laser powers, scan speeds, and focal spot size of the melting and heat treatment beams, based on temperature measurements taken from a thermal imaging camera observing the laser processing zone. In addition to the thermal imaging camera, machine vision inspection, and X-ray inspection cameras may be utilized to provide feedback on build layer quality.

Furthermore, real-time visualization of the melt processing zone can be conducted through video microscopy. This will provide important feedback sensing on fluid flow in the melt and shape of solidified melt pool. The schemes of using feedback from these sensors to perform real-time layer-by-layer inspection for on-the-fly defect detection and repair is described in more detail below. Of course, the components shown are intended to be illustrative and other configurations are possible.

Sensor Development

Figure 59:
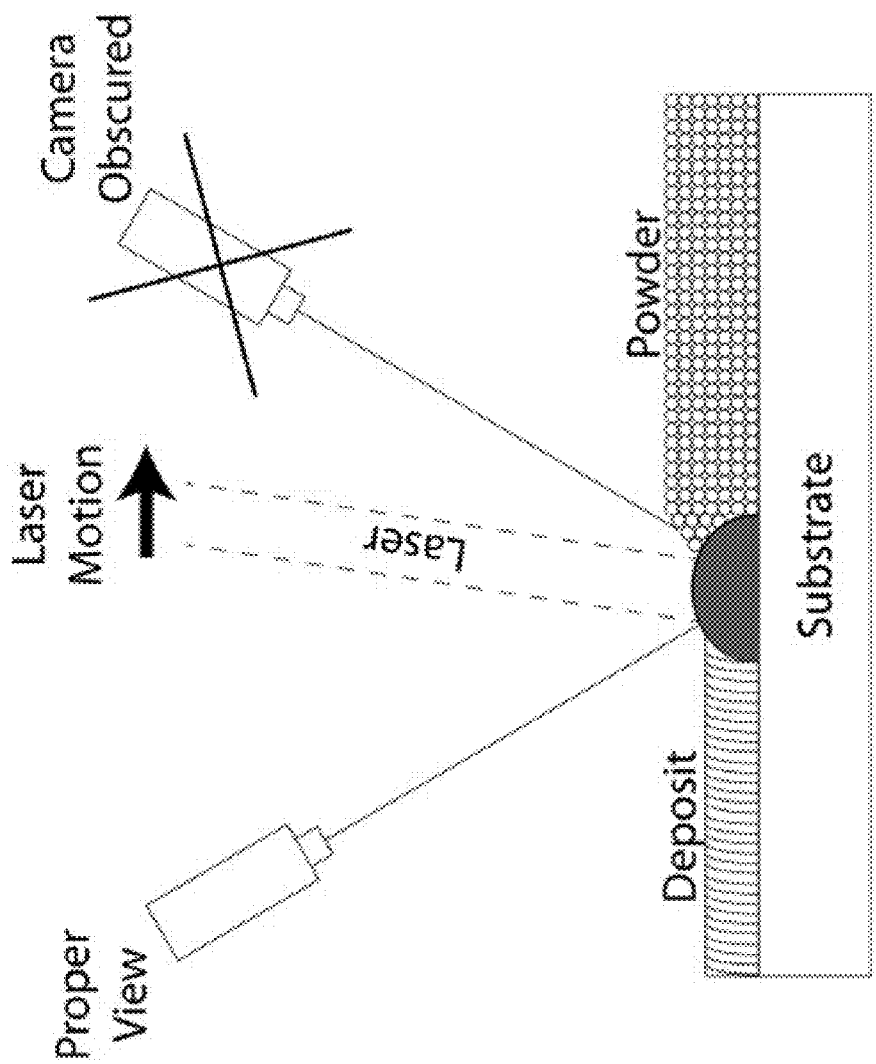
FIG. 59 is a representation of an illustration of the required thermal camera orientation for proper view of melt pool propagation with molten powder balls falling into the melt pool obscuring the view from the incorrect angle, in accordance with some embodiments of the present invention.
Figure 60B:
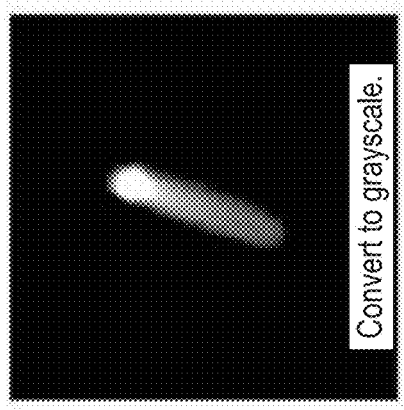
FIGS. 60a-60f are a representation of an overview of the Canny edge detection algorithm, in accordance with some embodiments of the present invention.
Figure 60C:
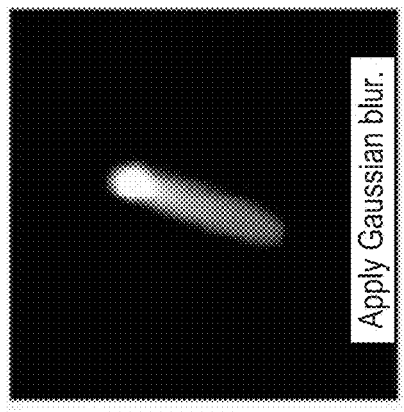
Figure 60A:
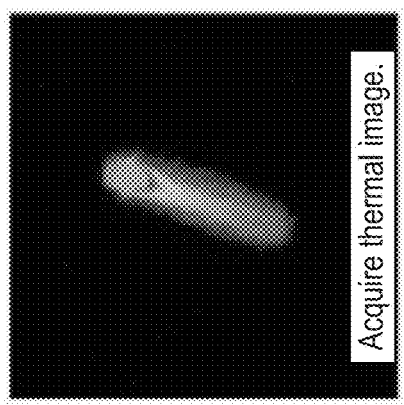
Figure 60D:
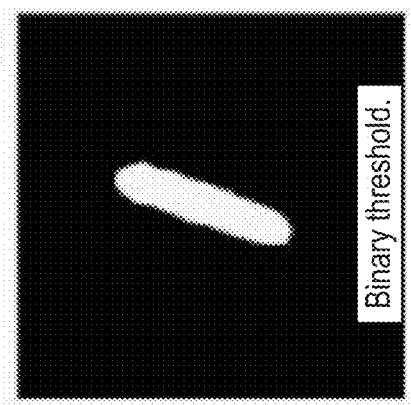
Figure 60E:
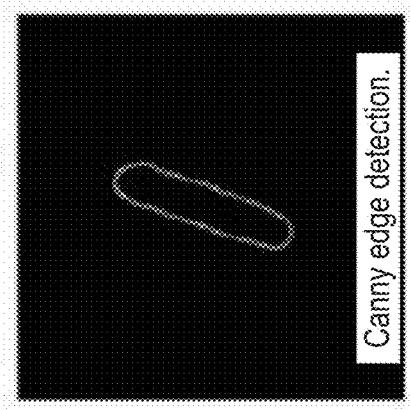
Figure 60F:
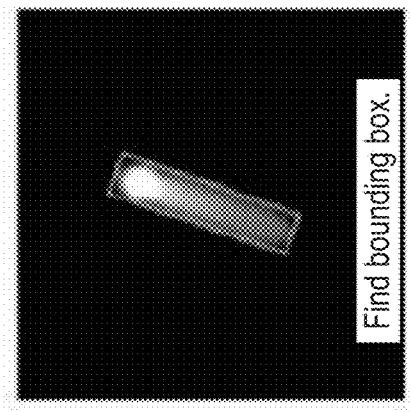

To develop a feedback control algorithm for use in the SLE process, a method to measure the size, shape, and average temperature of the melt pool during processing was needed. Using the data from the thermal imaging camera captured at a rate of 60 FPS, several strategies for detecting the melt pool during SLE processing can be explored. The first strategy involved the use of a Canny edge detection algorithm and the second strategy involved a scan line based method of connected component labeling. For proper detection of the melt pool, however, it is desirable to place the thermal camera in such a way that the unmelted powder does not obscure the view of the melt pool, as illustrated in FIG. 59. If the camera view is obscured by the molten powder balls, an inaccurate melt pool surface temperature is generally measured.

Canny Edge Detection Algorithm

The Canny edge detection algorithm involves several steps, an overview of which is illustrated in FIGS. 60(1)-(6). The first set of operations is common between both the Canny edge detection and connected component labeling algorithms. The first step is to import the image and convert to grayscale if it is not already grayscale. A Gaussian blur can then be applied to the image to filter any small specs of noise. The grayscale image can then be converted to a black and white image using a binary thresholding operation. Values above the melt pool temperature (or other temperature of interest) can then be converted to white and values below the melt pool temperature can be converted to black. This is the main operation that enables the isolation of the melt pool in the image and creates a distinct "blob."

The next set of steps implements the Canny algorithm. First, the Sobel operator can be applied to approximate the image gradient and isolate high frequency areas or borders detected in the image. The Sobel operator is described in Equation 15:

$$G_x = \begin{bmatrix} -1 & 0 & +1 \\ -2 & 0 & +2 \\ -1 & 0 & +1 \end{bmatrix} * A \qquad (15)$$

and $$G_y = \begin{bmatrix} -1 & -2 & -1 \\ 0 & 0 & 0 \\ +1 & +2 & +1 \end{bmatrix} * A$$

where A is the source image, * denotes the 2-dimensional convolution operation, and $G_x$ and $G_y$ are two images with the horizontal and vertical derivative approximations. The horizontal and vertical derivative approximations can then be combined into a resulting overall gradient approximation, G, using Equation 18.

$$G = \sqrt{G_x^2 + G_y^2} \qquad (16)$$

The gradient direction at each point, $\Theta$, can then be calculated using Equation 17.

$$\theta = a\tan\left(\frac{G_y}{G_x}\right) \qquad (17)$$

In some embodiments, a non-maximum suppression algorithm can then be run using the calculated image gradient data, which searches through the image and determines whether the gradient at each point is at a local maximum in the gradient direction. This algorithm can isolate the boundaries of objects in the image as a set of edge points. The non-maximum algorithm can then check each point and determine whether the gradient is a maximum by comparing the gradient value in the gradient direction $\Theta$ to the gradient value in the perpendicular directions at that point. In some embodiments, if the gradient value in direction Θ at that point is larger, then it can be marked as a local maximum point.

Once a set of edge points is calculated, the edges can be traced through these points using, for example, hysteresis thresholding. Points that are in areas of high intensity gradients can be connected to the nearest point using, for example, a high gradient threshold that outlines the majority of the blob with relatively low uncertainty. Any gaps in the outline can then be filled in using a higher uncertainty lower gradient threshold. Once a full contour is formed, a rectangular bounding box can be formed around the object and used as a mask on the original image. The average original image value inside of this mask can then be calculated and converted to an average temperature measurement to use in the real-time control scheme.

Example

The Canny edge detection algorithm was run on several trial processing applications and found to have a computation time on the order of 100-150 ms for a 640×480 pixel thermal image on a modern Intel Core2Duo CPU. This computation time lowered the usable rate of the thermal imaging camera from 50-60 FPS to approximately 30 FPS. Although the thermal imaging camera would typically be used at a limited rate of 30 FPS in the real-time control algorithms, the Canny edge detection algorithm used relatively large amounts of CPU resources and limited the available computational power that could be used in the real-time controller itself. In some embodiments, therefore, due to these constraints, a more efficient blob detection algorithm can be used, as described below.

Connected Contour Labeling Algorithm

A second blob detection algorithm operated in linear time and was based upon the work of Chang, Chen, and Lu and Liñán.[1] The algorithm operates by sending scan lines or rays from left to right across the image for each row from top to bottom. When a scan line intersects an object, the contour is traced around the object and the object is labeled. An overview of this algorithm is shown in FIGS. 61*a*-61*d*.

[1] Chang, F., Chen, C., and Lu, C., "A linear-time component-labeling algorithm using contour tracing technique," Computer Vision and Image Under-standing, vol. 93, no. 2, pp. 206-220 (2004); Liñán, C. C., "cvBlob", available at http://cvblob.googlecode.com.

Figure 61D:
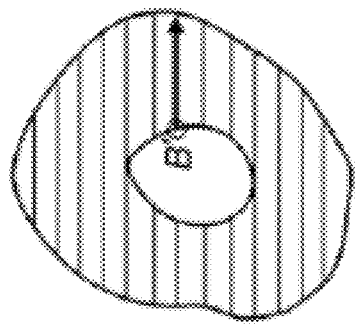
FIGS. 61a-61d represent an overview of the connected component labeling algorithm, in accordance with some embodiments of the present invention.
Figure 61C:
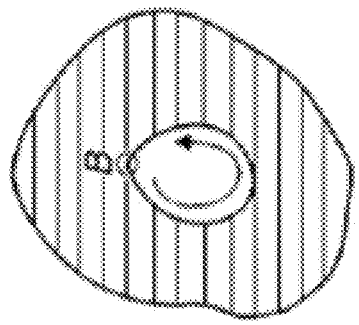
Figure 61B:
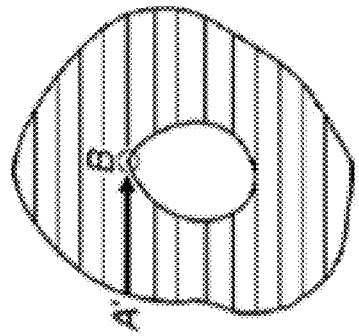
Figure 61A:
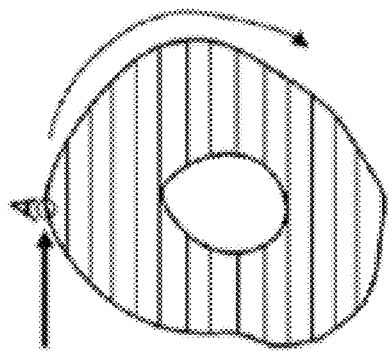

This connected component labeling algorithm can be specifically tailored for operation on binary images and, as such, can be used on the binary thresholded images discussed above for isolating the melt pool. In other words, once a binary image is provided, the algorithm operates in four major steps to produce a similar image that locates that accurately located the melt pool. FIG. 61*a* illustrates the point at which a scan line encounters a white object at point A for the first time and subsequently traces around the object until point A is once again reached. The contour tracer operates as shown in FIG. 62.

Figure 64:
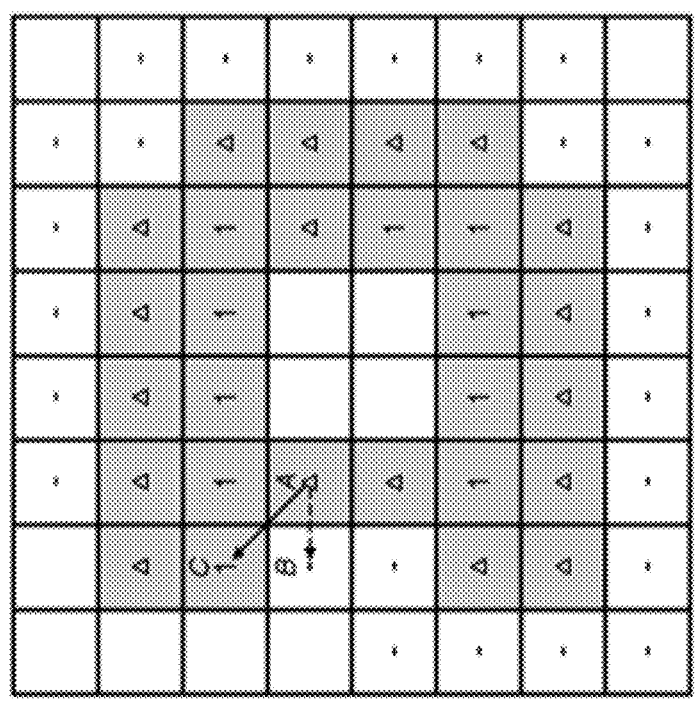
FIG. 64 is a representation of an identification of a black object on a white background, in accordance with some embodiments of the present invention.

In some embodiments, the contour tracing algorithm can start at point S and can label the following point as T. It can then proceeds to point T and label the next point U, and so on. The algorithm does not finish until two conditions hold: (1) the current point is once again S, and (2) the next point is once again T. For the example, in FIG. 62, the traced contour is STUTSVWS. A blob component has additional complexity in that it (1) does not have a single stripe to traverse and (2) the border between internal and external has to be additionally identified. The identification of internal and external points can be done as shown in FIGS. 63 and 64.

Figures 62, 63A, 63B:
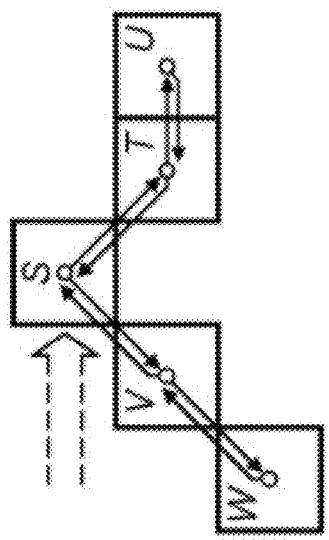
FIG. 62 is a representation of a contour tracing example illustrating traced contour of STUTSVWS, in accordance with some embodiments of the present invention.
FIGS. 63a and 63b are a representation of an illustration of clockwise pixel search for a black object on a white background, in accordance with some embodiments of the present invention.

FIGS. 63*a*-63*b* illustrate how points around a point P can be indexed. When labeling a new contour starting at point P, the next point on the contour can first be checked in index 7. This is because it is known from previous scan lines that the point above P is outside of the blob to be labeled. If point 7 is not found to be inside the blob, points can then be checked in a clockwise sequence around P until the next point is found. If no point is found around P, then P is an isolated blob. FIG. 63*b* illustrates the case in which a previous contour point had already been found at index 3, in which case the initial position for finding the next pixel can be set to index 5 (because index 4 must already have been explored). As the contour is traversed, pixels can be labeled as illustrated in FIG. 64. The final contour can then be indicated by the pixels labeled A. The algorithm is also capable of finding internal components, but in the SLE process, the melt pool is typically a single solid component or blob. Any internal components can be labeled using the last three steps in FIG. 61 (i.e., 61*b*-61*d*). This algorithm can be set to only visit each pixel a finite number of times and runs in linear time.

This connected component labeling system is extremely efficient and is capable of detecting the melt pool and calculating the average melt pool temperature in a time on the order of 5-10 ms, which does not limit the frame rate of the thermal camera. Additionally, the computation time is stable and does not require excessive CPU resources. This leaves ample processing power that can be use by the real-time control scheme. Due to its improved performance over the Canny algorithm, this second connected component labeling algorithm can be used for real-time control trials, as discussed below. An illustration of the detected melt pool is shown in FIG. 65 with the major axis perpendicular to the direction of motion indicated. Size, eccentricity, and average temperature can all be quickly computed for the detected component.

Setting the binary thresholding value allows for detection of different isotherms can also provide information that can be utilized in additional control schemes. One current limitation of the connected component labeling algorithm is the false extension of the melt pool when a significant buildup of molten powder particles build up in front of the melt pool without falling into the melt pool. This source of noise in the signal occurs when laser power is too low, resulting in the melt pool instability as described above, as well as later in the system identification portion of the system. FIGS. 66*a* and 66*b* show contrasting images of the powder falling into the melt front.

As the figures show, the accumulation of molten powder balls at the front of the melt pool causes the detected melt pool to significantly expand in size, resulting in additional noise in the recorded temperature signal. This melt pool instability can also often result in non-uniform deposits due to a cyclical starvation of powder that occurs after the built up molten balls finally fall into the melt pool leaving less powder in front of the melt.

Model Development & System Identification

Figure 67:
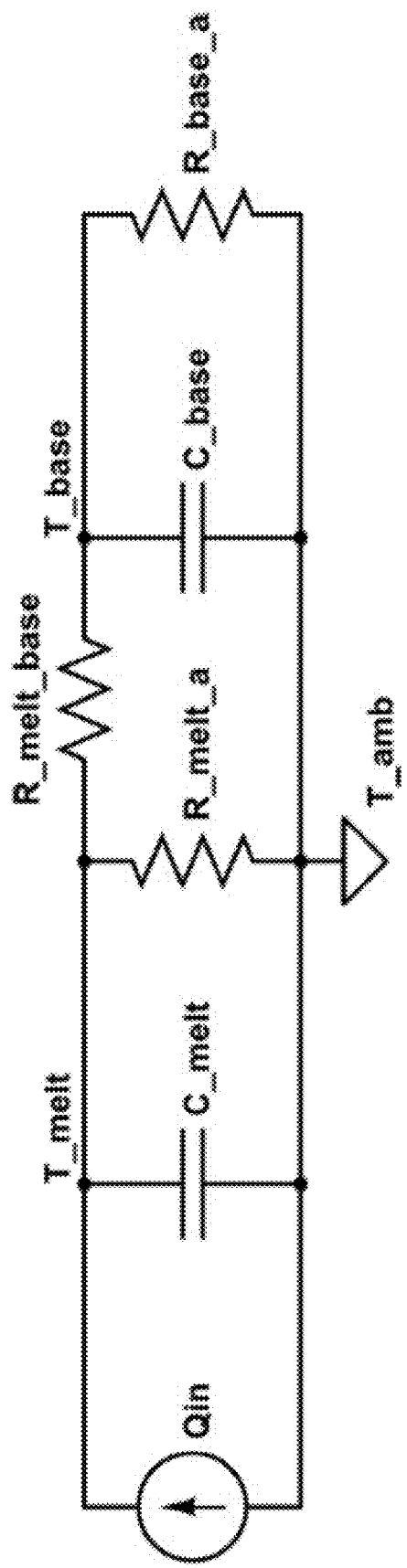
FIG. 67 is a representation of a simplified lumped capacitance thermal model of the SLE process, in accordance with some embodiments of the present invention.

A simplified dynamic thermal model of the SLE process can be used for both computational simulation of the control schemes and as a basis for the MRAC control scheme. The simplified dynamic model developed was based upon a lumped capacitance model of the system as illustrated in FIG. 67.

$Q_{in}$ is a current source representing the input laser power, $T_{melt}$, $T_{base}$ and $T_{amb}$ represent the temperature of the melt pool, base substrate, and ambient atmosphere respectively, $R_{melta}$, or $R_{1A}$ is the thermal resistance between the ambient atmosphere and the melt pool, $R_{meltbase}$ or $R_{12}$ is the thermal resistance between the melt pool and base substrate, $R_{basea}$ or $R_{2A}$ represents the thermal resistance between the base substrate and ambient atmosphere, and $C_{melt}$ or $C_1$ and $C_{base}$ or $C_2$ represent the thermal capacitance of the melt pool and base substrate respectively. Using this thermal model, the following transfer function can be developed:

$$\frac{1}{R_{12}}X(s) = \left[C_1 s + \frac{1}{R_{1A}} + \frac{1}{R_{12}}\right]Y(s) - U(s) \quad (18)$$

$$\left[C_2 s + \frac{1}{R_{2A}} + \frac{1}{R_{12}}\right]X(s) = \frac{1}{R_{12}}Y(s) \quad (19)$$

Where X(s) is the substrate temperature. Combining these equations yields:

$$R_{12}^2\left[C_2 s + \frac{1}{R_{2A}} + \frac{1}{R_{12}}\right]\left[\left[C_1 s + \frac{1}{R_{1A}} + \frac{1}{R_{12}}\right]Y(s) - U(s)\right] = Y(s) \quad (20)$$

Simplifying gives the final transfer function relating input laser power, U(s) to output melt pool temperature, Y(s):

$$\frac{Y(s)}{U(s)} = \frac{C_2 s + \frac{R_{12} + R_{2A}}{R_{12}R_{2A}}}{C_1 C_2 s^2 + \left[\frac{C1(R_{2A}+R_{12})}{R_{2A}R_{12}} + \frac{C2(R_{1A}+R_{12})}{R_{2A}R_{12}}\right]s + \left[\frac{R_{2A}+R_{12}}{R_{2A}R_{12}}\right]\left[\frac{R_{1A}+R_{12}}{R_{1A}R_{12}}\right] + \frac{1}{R_{12}^2}} \quad (21)$$

As can be seen, this transfer function is a second order representation of the system, with one zero and two poles, and an output representing the temperature of the melt pool. This continuous time model can be transformed into a discrete time z-domain representation using any of the standard techniques in literature, but it will remain the same order after transformation.[2] Prior literature on control in reasonably similar welding processes also indicates that the heating and cooling experienced during welding operations can be described as a second order system. Due to the difficulty in determining exact values for the capacitances and resistances seen during processing, however, a grey box approach can be used to determine the transfer function parameters to be used for simulation purposes. On the basis of this second order model, a set of system identification experiments can be run to determine the parameters of the simplified model.

[2] Ogata, K., Discrete-time control systems, vol. 8, Prentice-Hall, Englewood Cliffs, N.J. (1995).

Figure 68A:
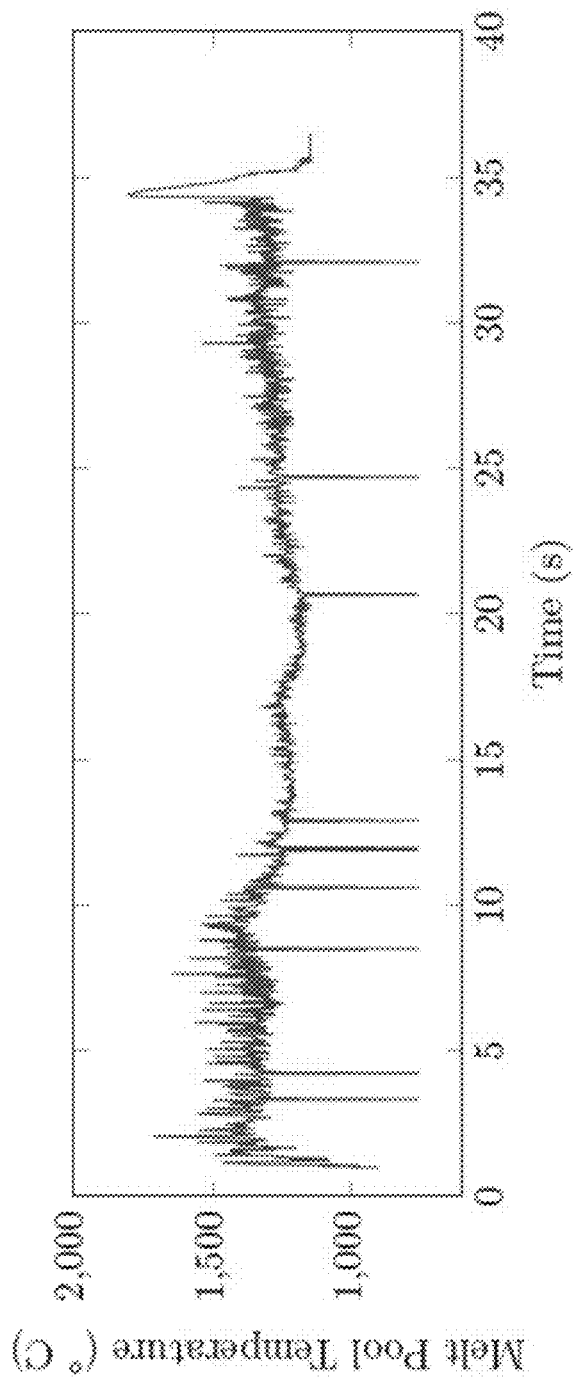
FIGS. 68a and 68b are a representation of the melt pool temperature and input voltage, respectively, for a step response of the SLE process with 450 repeat scans at 450 W laser power, in accordance with some embodiments of the present invention.
Figure 68B:
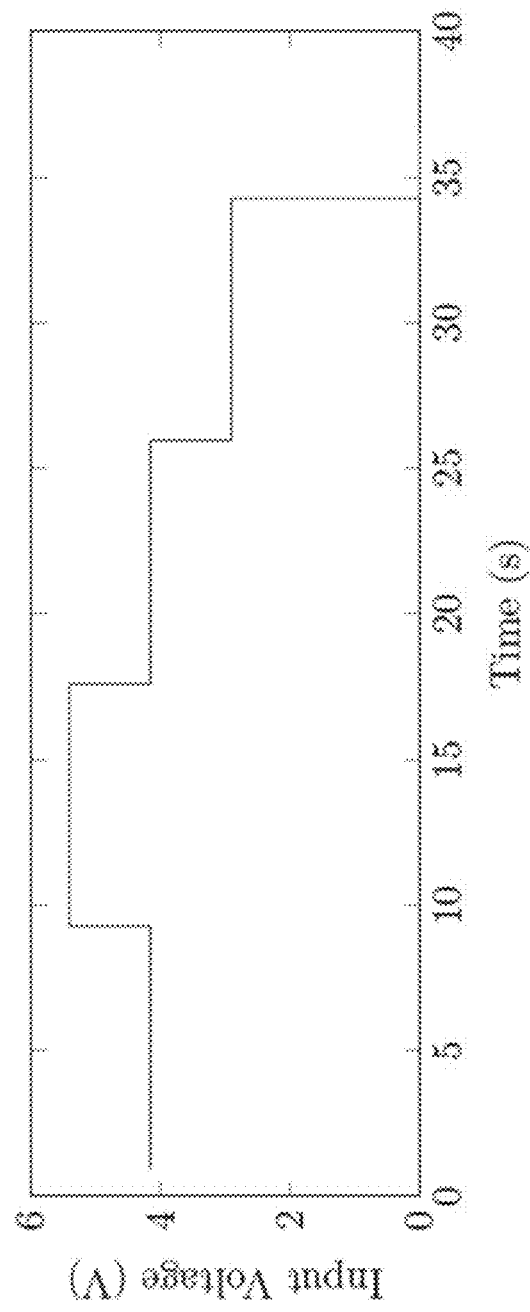

System identification can be conducted in the time domain using a series of step inputs, as illustrated in FIGS. 68a-68b. Identification of the second order system model can be done by analyzing the temperature response of the step input in laser power and using an autoregressive model with external (ARX) input modeling algorithm as described by Ljung to determine the model matching the input to the output data.[3] An illustration of the input voltage and output temperature measurement for the step input used is shown in FIG. 68.

[3] Ljung, L., System Identification, Wiley Online Library (1999).

As shown, the measured temperature data indicates that the signal gets noisy when the laser power drops to a low value. This signal noise is due to melt pool instability caused by the low laser power. In other words, when the laser power is too low, the melt pool becomes discontinuous and does not adequately gather powder from the front, resulting in the molten ball buildup. These particles can then be seen by the thermal camera and detected as a part of the melt pool by the connected component labeling algorithm, causing a significant change in size and temperature of the detected melt pool as the balls of molten powder accumulated and then fall into the melt pool.

To avoid noise caused by melt pool discontinuity, a lower control saturation limit of 2V (or approximately 200 W) was set for all control trials. Additionally, an upper saturation limit of 6V (or approximately 600 W) was set by the limitations inherent to the mirrors inside of the galvanometer scanner—i.e., above this threshold, there is a risk of damaging the scanner window or minor coatings.

Figure 69:
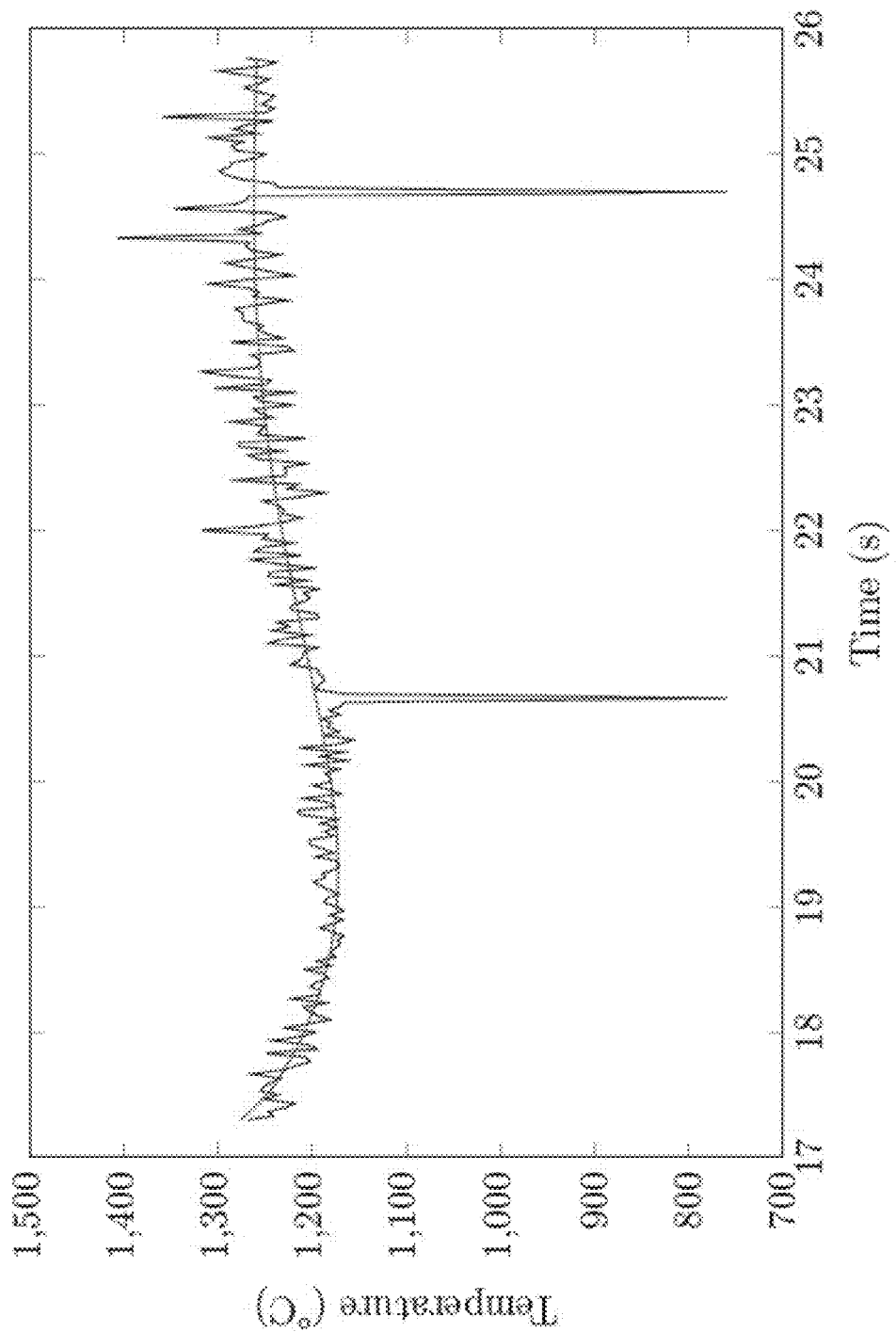
FIG. 69 is a representation of a comparison of the simulated transfer function output, in accordance with some embodiments of the present invention.

Additionally, several sharp drops can be seen in the temperature response. Each of these nine drops represent a time step for which no melt pool was detected, likely due to a flame, excess smoke, or another anomaly impeding the view of the thermal camera. To alleviate any issues with dropped frames and remove excess noise, a short finite impulse response (FIR) moving average filter can be implemented in the control schemes. The transfer function resulting from ARX modeling of the step response in FIG. 68 with one unit of time delay is listed in Equation 22. A comparison between the response of this transfer function and a portion of the step response are plotted against one another in FIG. 69.

$$\frac{Y(z)}{U(Z)} = z^{-1}\frac{0.1501 z^{-1}}{1 - 1.978 z^{-1} + 0.9783 z^{-2}} \quad (22)$$

This transfer function model can be used for development of the control schemes via simulation and can provide PID gains to be used during experimentation. One additional key result of this step response is the indication of an increase in temperature towards the end of each step. This increase is due to the buildup in substrate heat as the scanning proceeds, and it can cause a significant change in the heat transfer characteristics of the process during scanning.

Real-Time Control Schemes

Embodiments of the present invention can also comprise two control schemes, one traditional PID control scheme, and a second model reference adaptive control (MRAC) scheme. An overview of the control inputs, feedback signals, potential disturbances, and noise sources are listed in Table 10.

TABLE 10

Overview of control parameters and signals.

| Controllable Parameters | Feedback Signals | Disturbances | Noise Sources |
|---|---|---|---|
| Laser Power | Melt pool temperature | Excess powder falling into melt | Thermal camera uncertainty |
| Scan Speed | Melt pool size | Laser power fluctuation | Flames |
| Scan Pattern | Melt pool shape | Inclusions | Smoke |
| | | Substrate variation | Melt pool instability |
| | | Powder variation | Emissivity fluctuation |
| | | | Dropped camera frames |

In some embodiments, the system can be treated as a single-input single-output (SISO) system, with laser power as the only controllable input and average melt pool temperature as the only system output. Embodiments of the present invention can utilize more of the controllable inputs of feedback signals. Generally, due to performance constraints, PID control alone does not provide sufficient control, though this is somewhat setup dependent. In some embodiments, therefore, a simplified MRAC control scheme can be implemented. Both control schemes can operate in the discrete time domain—i.e., due to the 60 Hz limitation of the thermal imaging sensor.

PID Control

Figure 70:
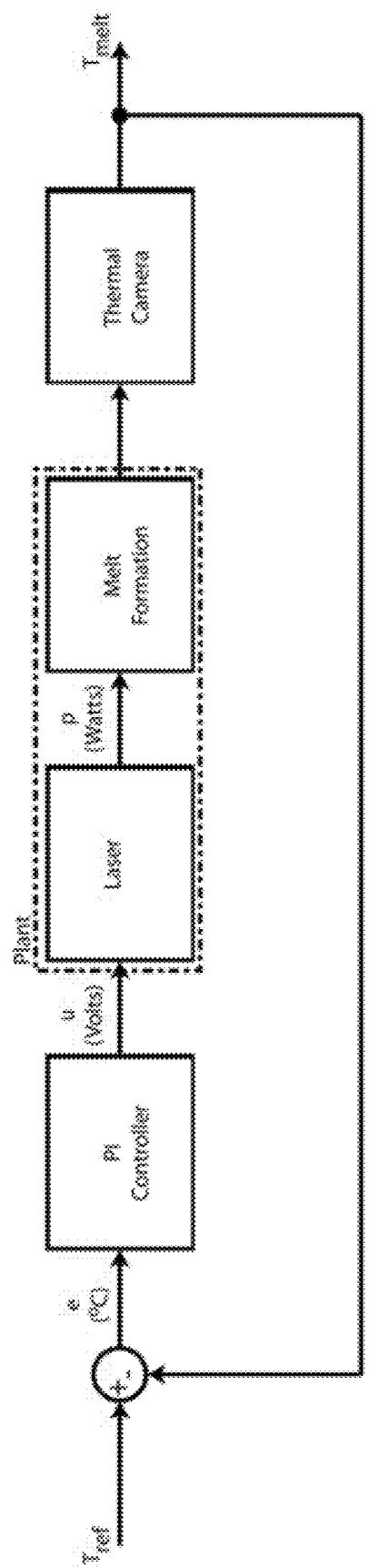
FIG. 70 is a representation of an overview of the PI control scheme, in accordance with some embodiments of the present invention.

An overview of the PID control scheme is depicted in FIG. 70. To account for signal noise in the system, the derivative term can be discounted to limit extreme amounts of actuation that could be caused by the highly fluctuating noise. A discrete PI controller can then be developed as follows starting with the general transfer function form of the discrete PID controller with proportional, integral, and derivative gains taken as $K_p$, $K_i$, and $K_d$ respectively:

$$\frac{U[z]}{E[z]} = K_p + K_i \frac{T_s}{2} \frac{z+1}{z-1} + K_d \frac{z-1}{zT_s} \tag{23}$$

$$\frac{U[z]}{E[z]} = \frac{\left(K_p + K_i \frac{T_s}{2} + \frac{K_d}{T_s}\right)z^2 + \left(-K_p + K_i \frac{T_s}{2} - \frac{2K_d}{T_s}\right)z + \frac{K_d}{T_s}}{z^2 - z} \tag{24}$$

Taking $$a = \left(K_p + K_i \frac{T_s}{2} + \frac{K_d}{T_s}\right) \tag{25}$$

$$b = \left(-K_p + K_i \frac{T_s}{2} - \frac{2K_d}{T_s}\right) \tag{26}$$

$$c = \frac{K_d}{T_s} \tag{27}$$

gives $$U[z]=z^{-1}U[z]+aE[z]+bz^{-1}E[z]+cz^{-2}E[z] \tag{28}$$

$$u[k]=u[k-1]+ae[k]+be[k-1]+ce[k-2] \tag{29}$$

Figure 71:
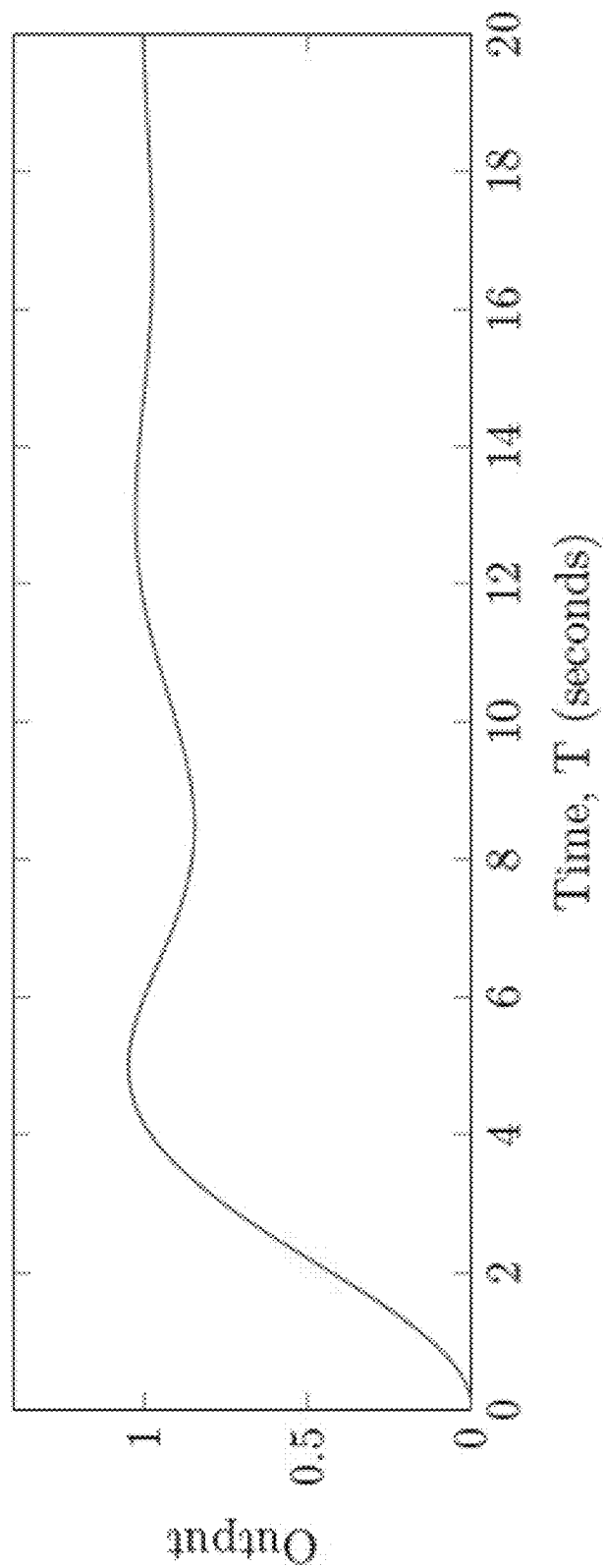
FIG. 71 is a representation of a step response of applying the PI controller to the transfer function, in accordance with some embodiments of the present invention.

In this form, u at the current timestep, u[k] is solely determined by the prior input u[k−1], the current error, e[k], and the prior two errors, e[k−1] and e[k−2] which can be easily implemented in the control software. The control signal can also be modified to add saturation limits at 2 volts and 7 volts. The 2 volt lower limit generally maintains enough input power to form a continuous and stable melt pool, while the 7 volt upper limit prevents damage to the galvanometer scanner as a result of the input laser power being too high. The gains for the PI control scheme can be developed using a suitable software package (e.g., the MATLAB PID Tuner tool) on the identified system model. FIG. 71 shows the step response of the developed controller.

In practice, the gains chosen for this controller can be based on the identified system model. Experimentally, although the gains were within the proper range of controller gains to control the actual process, the chosen gains resulted in a sub-optimal response. This can result when the identified system does not exactly match the actual system. As discussed below, the PI controller developed herein properly tracked a reference melt pool temperature for several different temperatures, but the performance required additional tuning. To avoid the significant time and material investment required to tune the PID gains for optimal performance, however, a second, adaptive control algorithm can be used.

Adaptive Control Scheme

Figure 72:
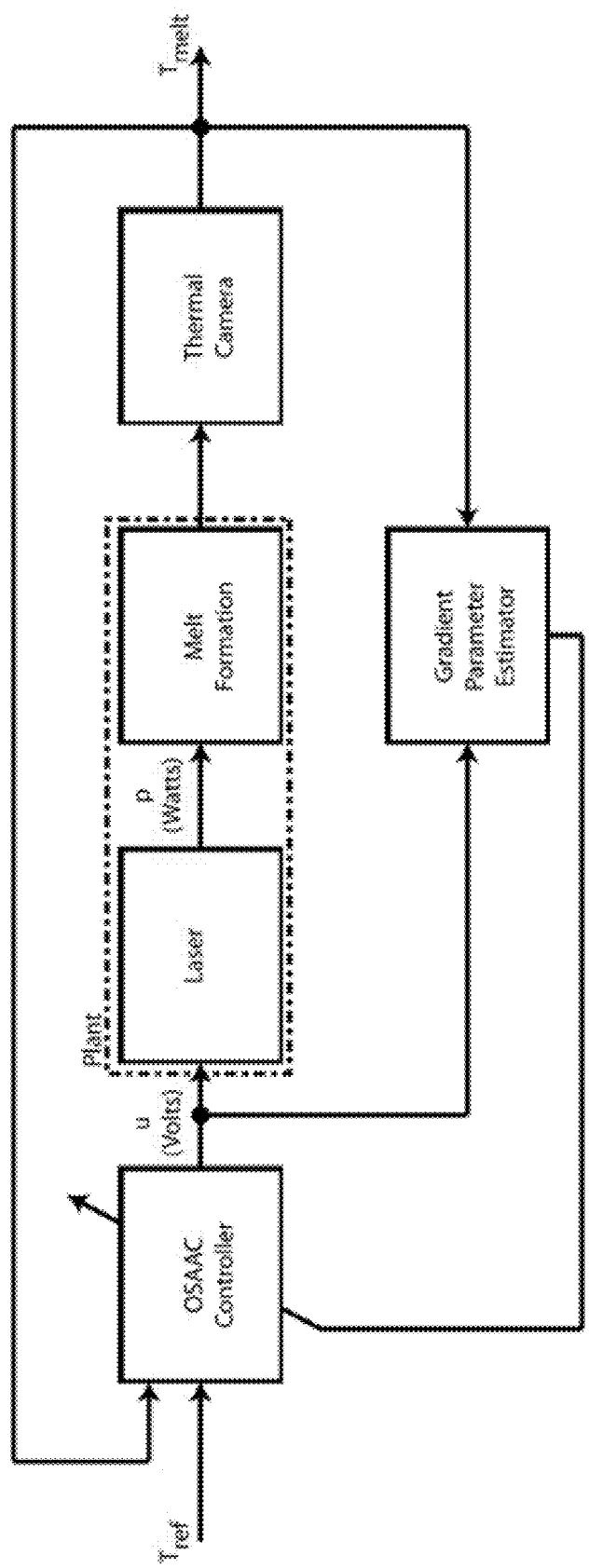
FIG. 72 is a representation of an overview of the OSAAC scheme, in accordance with some embodiments of the present invention.

Due to the relatively high number of experiments required to tune the above-mentioned PID controller, as well as relatively poor performance in some cases, embodiments of the present invention can also comprise a second controller based on a model reference adaptive control (MRAC) scheme. The particular form of MRAC chosen was the "one step ahead adaptive control scheme" (OSAAC). An overview of the OSAAC scheme is shown in FIG. 72.

In some embodiments, the OSAAC scheme used is basically a special case of the general model reference adaptive controller that achieves perfect tracking and can be used in discrete time systems when the time delay d in the system is known and the reference input is known more than d time steps in advance. In the case of real-time control of the SLE process, the reference temperature can be determined prior to experimentation using the robust offline model.

As such, the entire reference temperature profile is available for use during processing. For these reasons, a one step ahead adaptive controller can be used for the SLE process. In some embodiments, this can provide improved control out of the model reference adaptive family of controllers. The OSAAC scheme is an idealized form of the general direct MRAC scheme, where the poles of the reference model are taken as zero. In discrete time this represents the fastest stable response.

In some embodiments, the controller can be developed such that the output of the system, $Y_p$ can be put in the form of parametric model with an unknown parameter vector, $\theta_p$ and a vector containing a sequence of known values, $\phi p$ as in Equation 30.

$$y_p(k)=\theta^T \phi_p(k-n^*) \tag{30}$$

In some embodiments, development of the simpler one step ahead control scheme can begin by taking the plant, in this case the second order SLE process model, and putting it into discrete auto-regressive moving average form (DARMA).[4] This one step ahead control scheme can then be altered to incorporate adaptation for unknown plant parameters. In some embodiments, the development of the one step ahead controller can begin as follows, given a plant $Y_p$:

[4] Goodwin, G. C. and Sin, K. S., Adaptive Filtering Prediction and Control, Dover Publications (2009); Ioannou, P. and Fidan, B., Adaptive Control Tutorial, Society for Industrial Mathematics, Vol. 11 (2007).

$$y_p = \frac{\overline{Z}_p(z)}{R_p(z)} u_p \tag{31}$$

Where $\overline{Z}_p(z)=b_m z^m+b_{m-1}z^{m-1}+ \ldots +b_1 z+B_0$, $R_p(z)=z^n+a_{n-1}z^{n-1}+ \ldots +a_1 z+a_0$ and n>m. Letting $q^{-1}=z^{-1}$ be the shift operator we can define $$A(q^{-1}) \triangleq z^{-n}R_p(z)|_{z^{-1}=q^{-1}}=1+a_{n-1}q^{-1}+ \ldots +a_1 q^{-n+1}+a_0 q^{-n} \tag{32}$$

$$B(q^{-1}) \triangleq z^{-n}\overline{Z}_p|_{z^{-1}=q^{-1}}=q^{-n}q^m(b_m+b_{m-1}q^{-1}+ \ldots +b_0 q^{-m})=q^{-n^*}\overline{B}(q^{-1}) \tag{33}$$

Where $\overline{B}(q^{-1})=b_m+b_{m-1}q^{-1}+ \ldots +b_0 q^{-m}$ and $n^*=n-m$ is the relative degree of the plant. Using these relations, the plant can be represented as the DARMA model:

$$A(q^{-1})y_p(k)=q^{-n^*}\overline{B}(q^{-1})u_p(k) \tag{34}$$

Which can then be put into the predictor form as follows:

$$y_p(k+n^*) = \alpha(q^{-1}y_p(k)) + \beta(q^{-1})u_p(k) \quad (35)$$

where $$\beta(q^{-1}) = b_m + \beta_1 q^{-1} + \ldots + \beta_{n-1} q^{-n+1} = f(q^{-1})\overline{B}(q^{-1}) \quad (36)$$

$$\alpha(q^{-1}) = \alpha_0 + \alpha_1 q^{-1} + \ldots + \alpha_{n-1} q^{-n+1} \quad (37)$$

and $$f(q^{-1}) = 1 + f_1 q^{-1} + \ldots + f_{n^*-1} q^{-n^*+1} \quad (38)$$

are the unique polynomials satisfying the equation $$f(q^{-1})A(q^{-1}) + q^{-n^*}\alpha(q^{-1}) = 1 \quad (39)$$

whose coefficients are computed as:

$$f_0 = 1 \quad (40)$$

$$f_i = -\sum_{j=0}^{i-1} f_j a_{n-i+j}, \, i = 1, \ldots, n^* - 1 \quad (41)$$

$$\alpha_i = -\sum_{j=0}^{n^*-1} f_j a_{n-i-n^*+j}, \, i = 1, \ldots, n - 1 \quad (42)$$

where $a_j = 0$ for $j < 0$.

Taking the predictor form from above, the parametric model can be constructed:

$$y_p(k+n^*) = \theta^{*T} \phi_p(k) \quad (43)$$

where $$\phi_p(k) = [y_p(k), y_p(k-1), \ldots, y_p(k-n+1), u_p(k), u_p(k-1), \ldots, u_p(k-n+1)]^T \quad (44)$$

For known plant parameters the parameter vector, $\theta(k)$, is then:

$$\theta^* = [\alpha_0, \alpha_1, \ldots, \alpha_{n-1}, b_m, \beta_1, \ldots, \beta_{n-1}]^T \quad (45)$$

Taking the predictor form, the control law $u_p(k)$ can be developed with the objective of driving the output of the plant, $Y_p(k)$ to track the reference signal, $Y_m(k)$:

$$\beta(q^{-1})u_p(k) = y_m(k+n^*) - \alpha(q^{-1})y_p(k) \quad (46)$$

This yields the control law:

$$u_p(k) = \frac{1}{b_m}(y_m(k+n^*) - \alpha(q^{-1})y_p(k) - \overline{\beta}(q^{-1})u_p(k-1)) \quad (47)$$

where $$\overline{\beta}(q^{-1}) \triangleq (\beta(q^{-1}) - b_m) \quad (48)$$

Choosing this control law results in perfect tracking after n*time steps:

$$y_p(k+n^*) = y_m(k+n^*) \quad (49)$$

This control form can be modified as follows for adaptation of unknown plant parameters:

$$u_p(k) = \frac{1}{\hat{b}_m + \lambda}\left(y_m(k+n^*) - \hat{\alpha}(q^{-1}, k)y_p(k) - \hat{\overline{\beta}}(q^{-1}, k)u_p(k-1)\right) \quad (50)$$

where $$\hat{\alpha}(q^{-1}, k) = \hat{\alpha}_0(k) + \hat{\alpha}_1(k)q^{-1} + \ldots + \hat{\alpha}_{n-1}(k)q^{-n+1} \quad (51)$$

$$\hat{\overline{\beta}}(q^{-1}, k) = \hat{\beta}_1(k) + \hat{\beta}_2(k)q^{-1} + \ldots + \hat{\alpha}_{n-1}(k)q^{-n+2} \quad (52)$$

The constant term $\lambda > 0$ can be added to weigh down the influence of the previous input $u_p(k-1)$, which can limit excessive amounts of control effort that could otherwise occur when trying to drive the system to perfect tracking. The parameter vector is:

$$\theta(k) = [\hat{\alpha}_0(k), \hat{\alpha}_1(k), \ldots, \hat{\alpha}_{n-1}(k), \hat{b}_m(k), \hat{\beta}_1(k), \ldots, \hat{\overline{\beta}}_{n-1}(k)]^T \quad (53)$$

The parameter vector can then be estimated using one of several algorithms, including gradient, projection, or least squares algorithms. In some embodiments, a gradient algorithm can be used, resulting in the following update equations:

$$\epsilon(k) = \frac{y_p(k) - \theta^T(k)\phi_p(k-n^*)}{m_s^2(k-n^*)} \quad (54)$$

$$\overline{\theta}(k+1) = \overline{\theta}(k) + \gamma\epsilon(k)\overline{\phi}_p(k-n^*) \quad (55)$$

$$\overline{b}_m(k+1) = \hat{b}_m(k) + \gamma\epsilon(k)\phi_{n-m}(k) \quad (56)$$

$$m_s^2(k) = 1 + \phi^T(k)\phi(k) \quad (57)$$

where $\gamma$ can be a chosen constant adaptive gain vector. Using these updated equations and the weighted adaptive control law in Equation 50, the OSAAC scheme can be implemented in the C# software with an unknown parameter vector that represented the single zero and two poles of the modeled transfer function for the SLE process. A suitable numerical program can be used (e.g., The Math.net Numerics package) to efficiently implement the linear algebra operations required for the calculation of the update laws and control input signal.[5]

[5] "Math.net numerics," March 2013.

Sampling Rate

Figure 73:
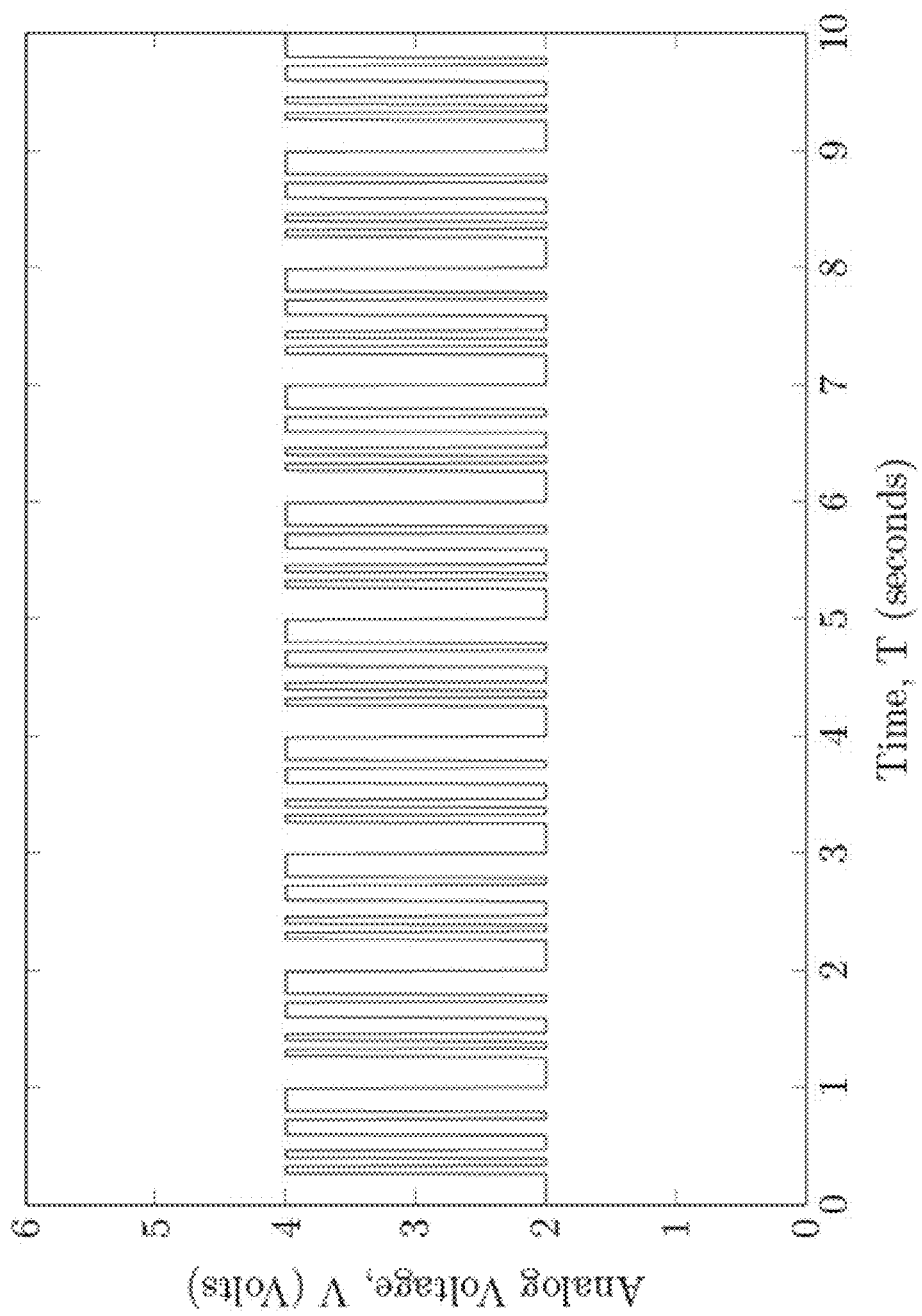
FIG. 73 is a representation of an example pseudorandom binary signal of approximately 5 Hz used for determining system bandwidth requirements, in accordance with some embodiments of the present invention.

In some embodiments, the control system sampling rate to use can be determined and justified through the use of several pseudorandom binary signal inputs, one of which is illustrated in FIG. 73.

Figure 74A:
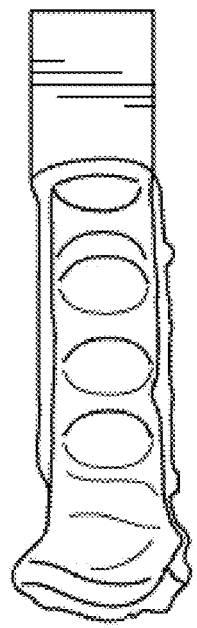
FIG. 74a is a representation of an image of a René-80 sample run with varied frequency laser image with an approximately 5 Hz pseudorandom signal, in accordance with some embodiments of the present invention.
Figure 74B:
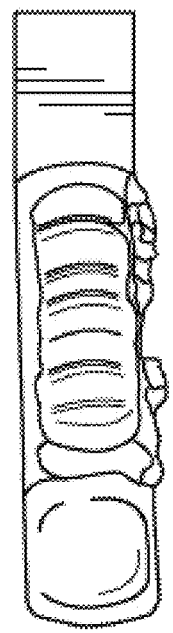
FIG. 74b is a representation of an image a René-80 sample run with varied frequency laser image with an approximately 20 Hz pseudorandom signal, in accordance with some embodiments of the present invention.
Figure 74C:
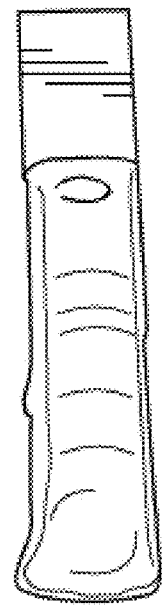
FIG. 74c is a representation of an image of a René-80 sample run with varied frequency laser image with an approximately 30 Hz pseudorandom signal, in accordance with some embodiments of the present invention.

When using a higher frequency pseudorandom signal, such as one at approximately 30 Hz, the resulting deposit quality can be somewhat independent of the signal. At high frequencies, the deposited material looks as though it has been deposited at an average value of the two extreme values in the pseudorandom signal. FIGS. 74a-74c illustrate sample runs with different frequency pseudorandom signals, demonstrating that running at high frequency resulted in a more uniform deposit that would be produced at the average power of the signal.

For this reason, a signal of approximately 30 Hz can be used as the sampling period for the thermal camera and control system. At this frequency, the system creates high enough bandwidth to saturate the limit on deposit quality that could be achieved via SLE, but low enough to allow for overhead room on the control computer to detect the melt pool and algorithmically generate the input control signal.

Experimental Results

Control trials were used to determine whether it was feasible to control the melt pool temperature of the SLE process by using a thermal imaging camera and modulating the laser power. As such, the initial scan speed and number of repeat scans were fixed at values that produced a good set of results from the prior open loop DoE analysis run on René-80, as described above. In this case, the scan speed was set to 450 mm/sec and the repeat scans to initiate the melt pool were also set at 450 mm/sec. In all trials, the repeat scans were allowed to complete at 450 W power and initiate the melt pool before the controller was turned on. Limitations on the lower temperature bounds of the thermal camera prevented feedback control during the repeat scans. In some embodiments, implementation of a thermal camera supporting a lower temperature range would enable precise feedback control of the repeat scans as well.

The first set of feedback control trials were attempted using the PI controller. The results of two of these trials are shown in FIGS. 75a-75c and 76a-76c. As shown, the PI gains chosen were able to track the set reference temperature for both cases, but the second trial shows an extremely slow response and high average error for the PI gains that were chosen by simulation. The settling time in the case of the second trial was approximately 12 seconds. This settling time was somewhat expected due to the simulated responses for the PI controller applied to the identified model earlier in this chapter. Additional more aggressive tuning of PI gains may have improved performance, but determination of these PID gains may require a significant number of trials.

The simulated PI controller also indicated that determination of proper gains that resulted in fast response, low overshoot, and short settling time are difficult to obtain for this system using the PI controller. The gains used for the implemented controller were chosen because they displayed a good trade-off between each of those metrics. Even in the case of this idealized simulated controller, the settling time was relatively unacceptable when considering that processing of a full sample ends within 30 seconds. Due to the high cost of each experimental trial, the adaptive control scheme was explored.

Figure 77:
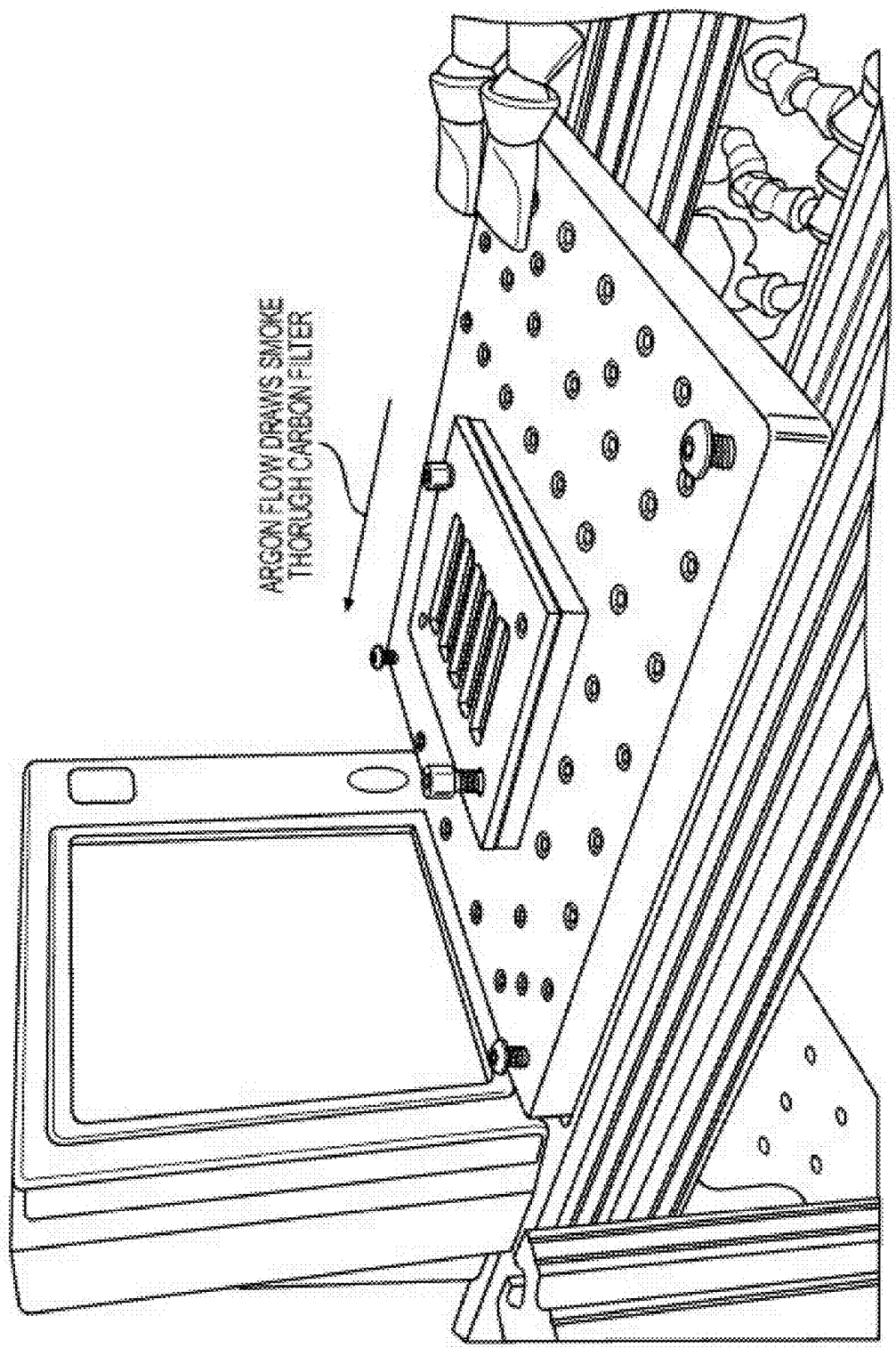
FIG. 77 is an image of a smoke extractor system, in accordance with some embodiments of the present invention.

Before the adaptive control scheme trials, it was determined that the several instances of scanner window damage that had occurred in the past were due to smoke accumulation on the window during processing. To avoid additional downtime, a smoke extraction system was implemented before experimentation of the adaptive feedback trials continued, as shown in FIG. 77.

Figure 78:
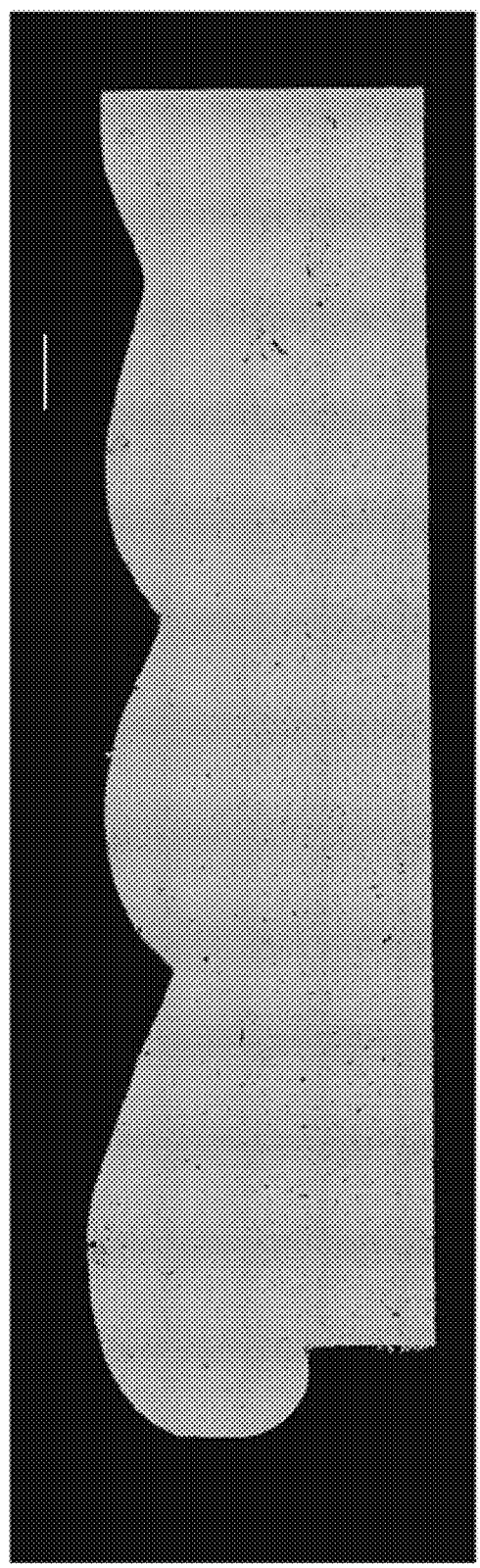
FIG. 78 is a representation of a micrograph of a sample run with the smoke extractor system in place, in accordance with some embodiments of the present invention.

The additional convective currents formed above the melt pool associated with this smoke extraction system caused a significant alteration in the quality of deposits that could be produced via SLE. An example of an open loop deposit at previously identified ideal processing parameters discussed above, but now used with the smoke extractor in place is shown in FIG. 78. A similar waviness was also found in the detected average melt pool temperature during processing of this sample, as illustrated in FIGS. 79a-79c. Despite the issues found during open loop trials with smoke extraction in place, closed loop adaptive control trials were nonetheless conducted with the smoke extractor in place to prevent additional scanner damage.

Figure 80:
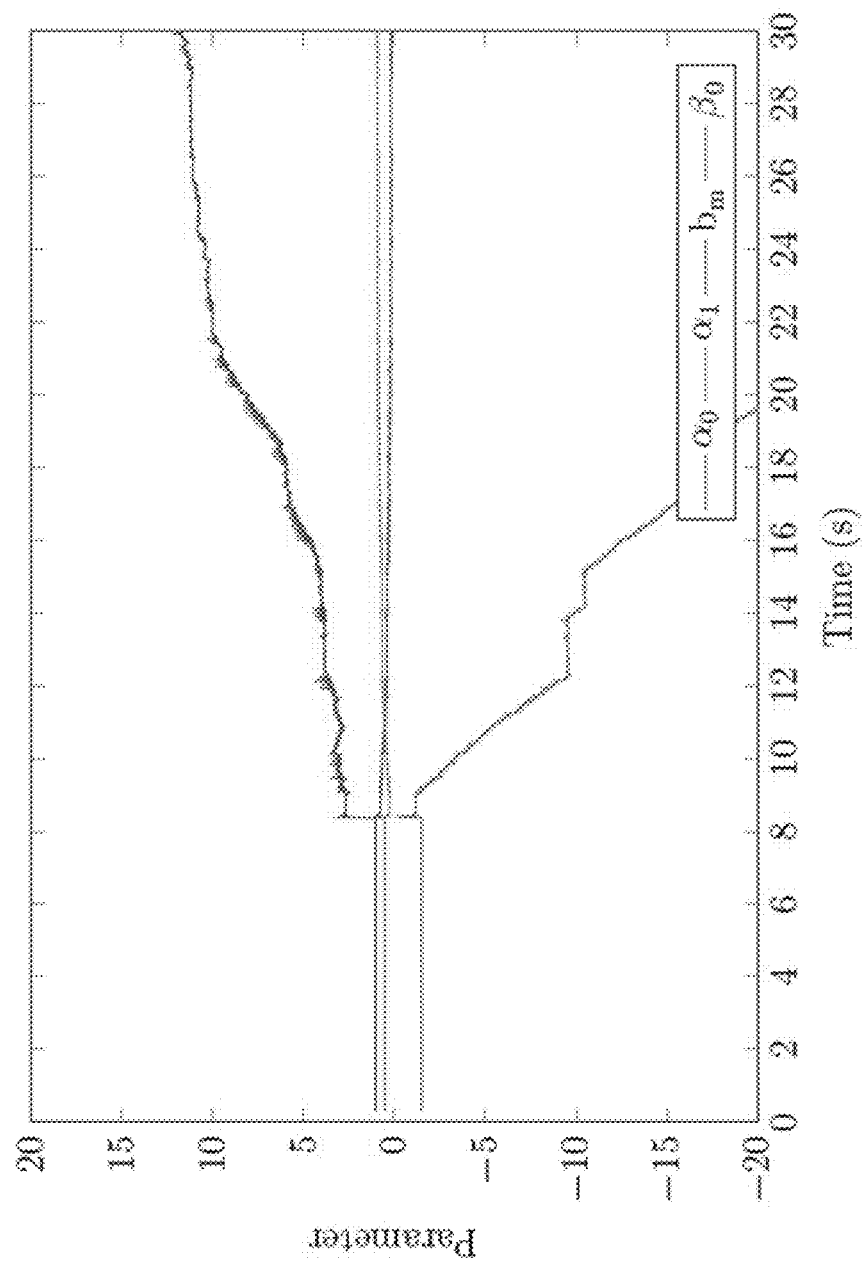
FIG. 80 is a representation of a plot showing parameter adaptation under significant system excitation, in accordance with some embodiments of the present invention.
Figure 81:
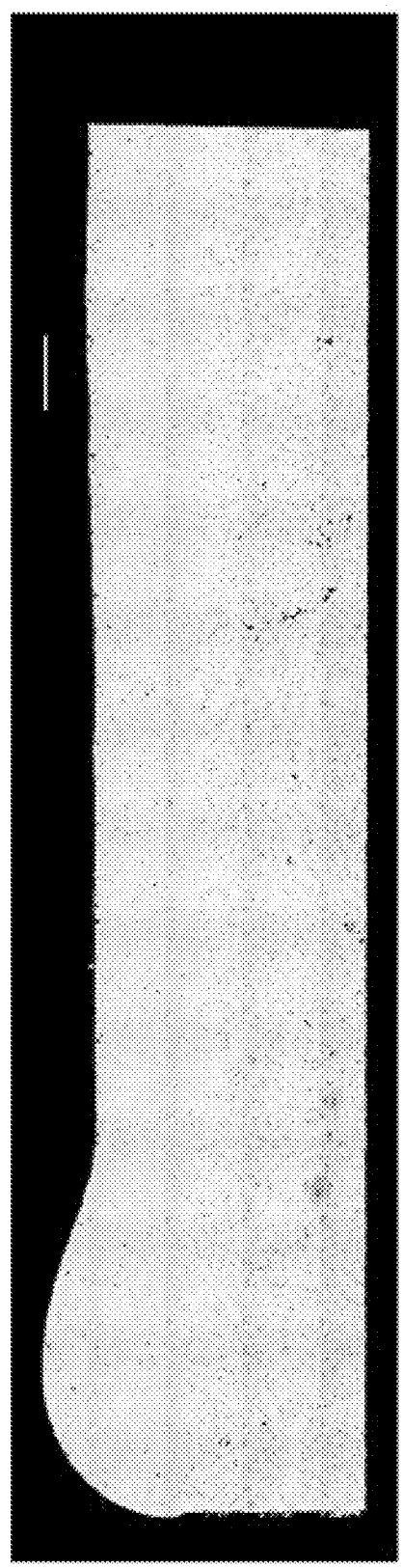
FIG. 81 is a representation of a micrograph of a sample run with a constant reference temperature of 1575° C., in accordance with some embodiments of the present invention.
Figure 82:
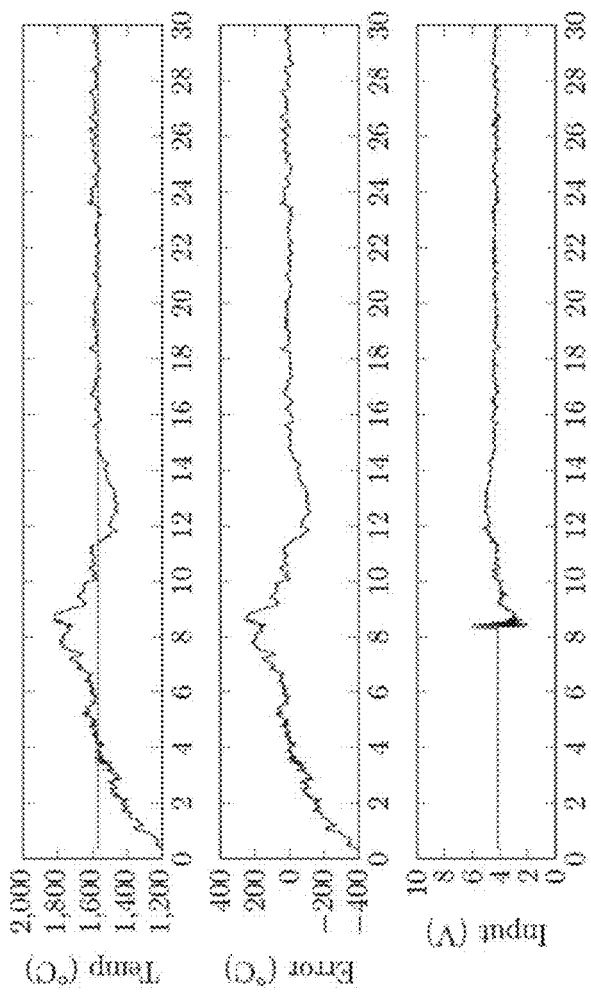
FIGS. 82a-82e are a representation of a measured temperature profile for a trial with a constant 1575° C. reference temperature, with an average error of 2.15° C., in accordance with some embodiments of the present invention.
Figure 83:
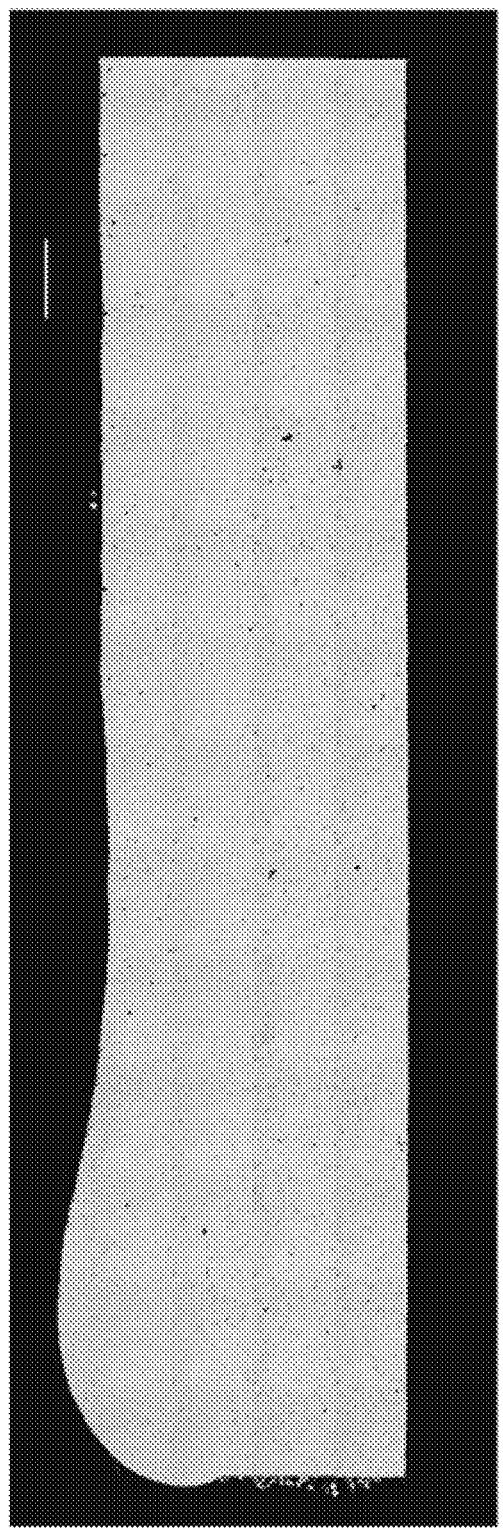
FIG. 83 is a representation of a micrograph of a sample run with a constant reference temperature of 1650° C., in accordance with some embodiments of the present invention.

Determination of controller parameters was easier when using the adaptive control scheme. To initially determine the initial conditions for the plant parameters, the weighting term was set to a small value so that the adaptation algorithm would quickly converge to values near the proper operating point due to significant excitation of the laser power input and resulting temperature output of the system. After this initial identification experiment, as illustrated in FIG. 80, the end values of the adaptation parameters were set as the initial values for future experiments. Using this strategy, controller parameters could be determined with a minimal number of experiments. For the adaptive trial runs, initial parameter identification was done using only three total trials.

Several trials were run with the OSAAC scheme on René-80 to determine whether altering the temperature profile had any effect on the deposit height or uniformity. FIGS. 81 and 82a-82e show the results of running with a constant reference temperature. As shown, even with the smoke extractor, the resulting deposit shows a remarkable uniformity. This uniformity was not seen in similar open loop trials discussed above. This level of deposit uniformity is desirable when using the SLE process for multi-layer deposition, as major variations in deposit height will significantly impact deposition of subsequent layers of material. FIGS. 83 and 84a-84e show the results of running with a higher constant reference temperature of 1650° C.

Figure 86:
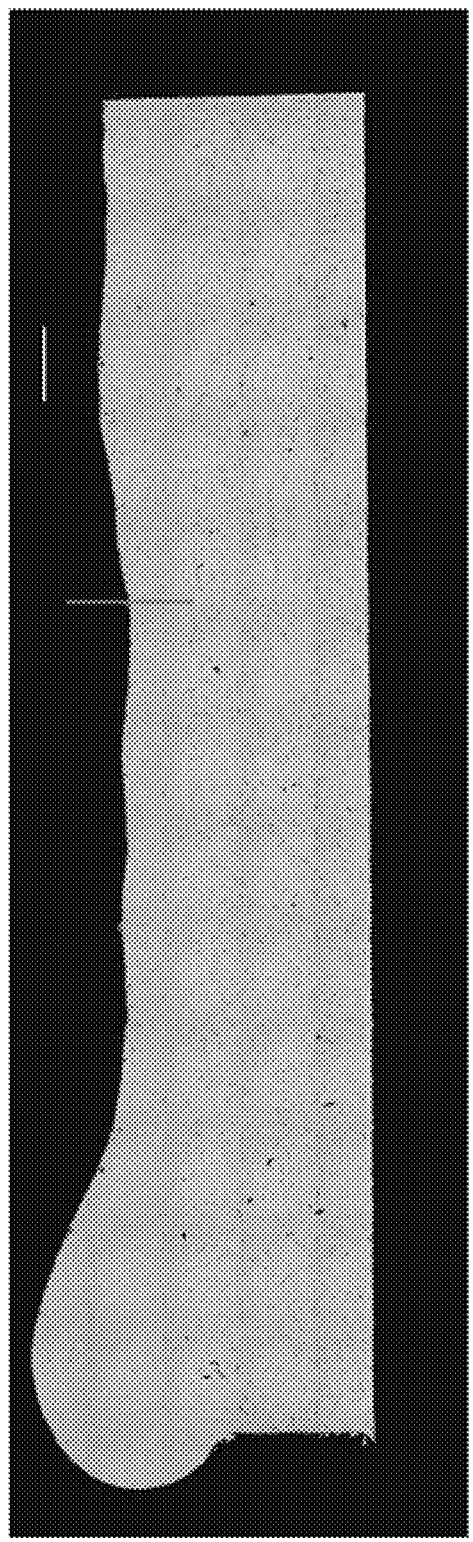
FIG. 86 is a representation of a micrograph of a sample run with a step up from 1600 to 1700° C. in reference temperature in the second half, in accordance with some embodiments of the present invention.

The higher constant reference temperature of 1650° C. again produced a high uniformity deposit of approximately 200 µm higher thickness than the lower reference temperature trial. FIGS. 85a-85e shows the results of running with a linear ramp down in reference temperature. The temperature profile follows the ramp down in reference temperature well, resulting in low average error. Although the deposit height is not as uniform as in the case of the constant temperature case, it is still more uniform than prior open loop trials. FIG. 86 shows the results of running with a step up in reference temperature in the middle of the sample. It can be seen that a large step in reference temperature does indeed result in an increase in the deposit height. Again clearly demonstrating that it possible to control microstructural features through the use of temperature feedback. The change in deposit height could be used to account for variations in the previous layer height when implementing multi-layer capabilities.

The results of the adaptive control trials demonstrate that the deposit height can be controlled using temperature feedback control. In fact, in spite of the deposit non-uniformity caused by the smoke extraction system in open loop trials, the adaptive control trials were able to appropriately control the temperature during processing to compensate and produce uniform deposits without significantly altering the average laser input power over those used in the open loop trials.

This was due, at least in part, to the controller compensating for drops in melt pool temperature before they resulted in instability at the melt front. Typically once there is a single occurrence of instability during processing, the powder begins falling into the melt pool cyclically pulling in excess powder and then starving itself until the run is over. Avoiding the first occurrence of this instability causes the deposit uniformity to be greatly enhanced.

These initial results in feedback control of the process running on René-80 demonstrate the capabilities of the system. The system can also be used to provide feedback control for using the process for multi-layer deposition on any material. FIGS. 87a-87e depict the measured temperature profile for a trial with a step from 1600° C. to 1700° C. reference temperature and an average error of −16.66° C. Note that the deposit height increases by over 300 µm after the step up in reference temperature.

Controller Parameter Tuning Procedure

Figure 88:
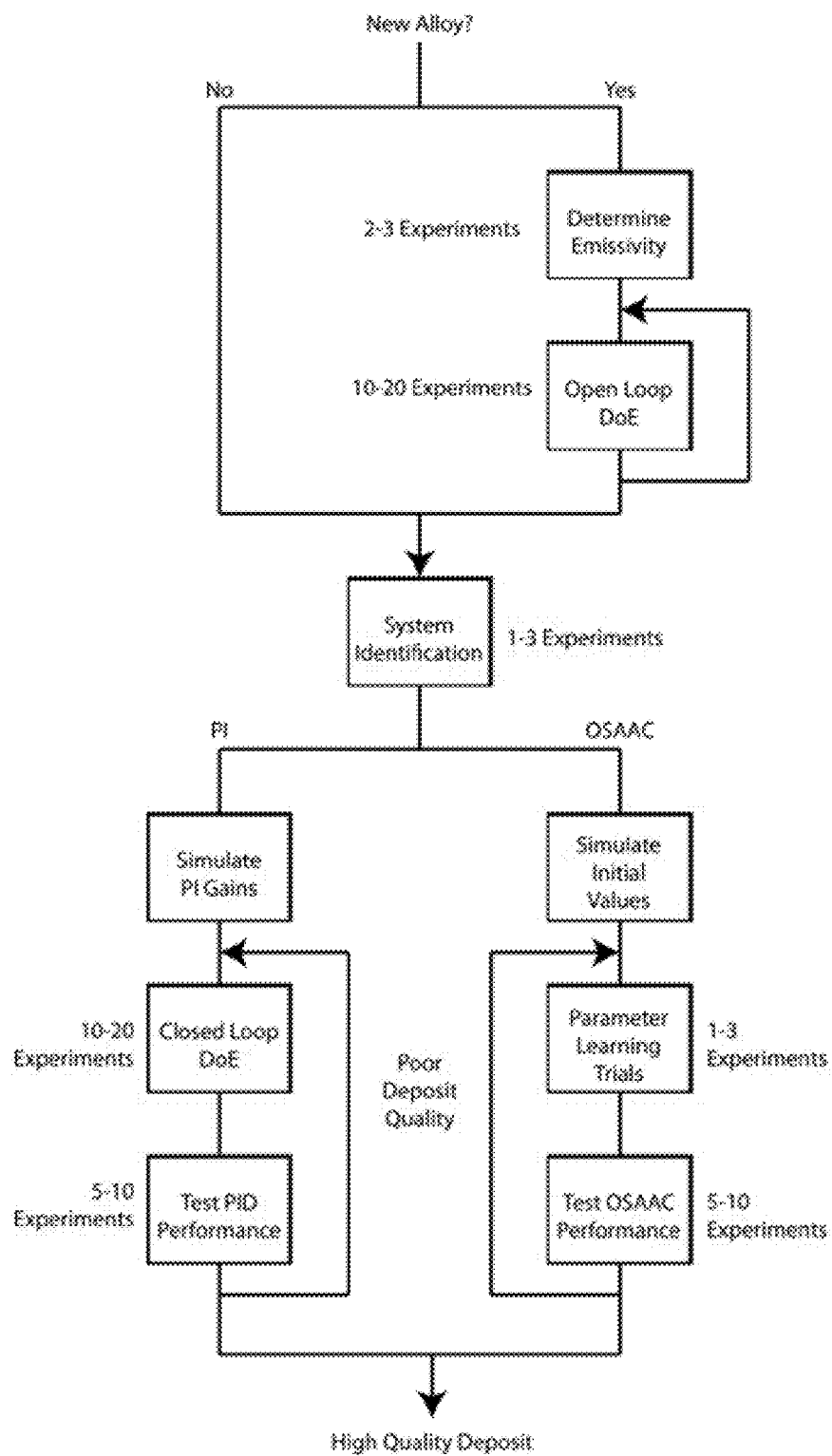
FIG. 88 is a representation of a flow chart overview of process parameter development for utilizing SLE on a new alloy or geometry, in accordance with some embodiments of the present invention.

Development of SLE processing parameters for new alloys and geometries can be a time consuming and difficult procedure. An overview of the process parameter development flow chart with the approximate number of samples used is shown in FIG. 88. In open loop control, many trials are generally required to determine a feasible range of parameters. There are two steps in determining open loop parameters. First, a set of initial feasibility trials can be run to determine a feasible operating range. A set of DoEs can then be run to drill down on the proper parameter set that produces the highest quality open loop deposits. The number of open loop DoEs required to produce well formed deposits can be reduced, or eliminated, with the use of a robust multiphysics model to predict the parameters required to produce well formed deposits on a new alloy.

Control parameter development can take place after open loop development and follows two different procedures for the PI and OSAAC schemes. Because of the relatively poor performance of the PI controller and difficulty choosing gain values, development of the PI gains leading to a high performance controller will generally require several iterations of a closed loop DoE. In these DoEs, the gains, $K_i$ and $K_p$, are the primary factors and controller parameters such as, for example and not limitation, response time, settling time, and average error are the responses to optimize. Optimizing the PI controller parameters can take upwards of 30 experiments.

Development of controller parameters for the OSAAC control scheme, on the other hand, generally uses fewer experiments because the parameter learning algorithm can quickly converge towards the proper process parameters over the course of only a few trials when the system is sufficiently excited by a varying laser power. These learning trials can be done by either reducing the weighting penalty, $\lambda$, on the prior control input, increasing the adaptive gains, $\gamma$, or providing a highly varying input reference temperature, such as a sine wave, to the system.

Additionally, performance of the OSAAC was generally better than the PI controller and thus it is relatively easier to track a desired melt temperature with the OSAAC scheme and produce high quality deposits using this scheme. This parameter tuning procedure can be used whenever a major change in alloy or part geometry occurs. The robustness of the adaptive control scheme will allow it to operate properly when similar alloys, in terms of melt temperature and flow characteristics, are used or only small changes in geometry are made, but control performance may degrade unless the learning trials are run again.

Embodiments of the present invention relate to a real-time, feedback control for the SLE process. Implementation of two machine vision algorithms to detect the average melt pool temperature through the use of a thermal camera can be used. In some embodiments, a connected component labeling algorithm can quickly locate the size and shape of the melt pool and calculate the average melt pool temperature without any loss in camera frame rate due to processing time. Using this temperature feedback data, system identification experiments were performed to determine a transfer function model for the system.

A second order transfer function was developed and used to successfully simulate and implement a PI controller to control the melt pool temperature during processing by varying the input laser power. It was found that an excessive number of experiments would generally be required to properly tune the gains of the PI controller for each alloy being processed, so an adaptive control scheme was implemented to quickly determine controller parameters. The adaptive controller was used to demonstrate that following a reference temperature profile had a significant effect on the resulting deposit height produced on René-80 alloy samples via SLE. It was found that constant reference temperature profiles produced the most uniform samples produced to date, significantly improving the process over the open loop trials. The process enables the ability to be used for multi-layer deposition for part manufacturing.

It should be noted that a Green's function model can be used to develop an online observer to estimate the substrate temperature of a location just below or near the melt pool for use in more advanced control schemes, such as a distributed parameter control scheme. Green's function analysis can be used to calculate a lookup table for determining the temperature profile generated in response to beam location. The lookup table developed using this analysis can enable quick estimation of substrate temperature during online SLE processing by allowing for convolution of the values in the lookup table to determine the temperature distribution caused as a result of past laser beam locations and powers.

Early analysis of the temperature fields produced in welding processes can be based upon Rosenthal's solution for a heat source moving on a semi infinite plate. Eagar and Tsai formulated a Green's function approach to the problem in the early 1980s.[6] A similar analysis as it pertains to SLE is discussed below.

[6] Eagar, T. and Tsai, N., Temperature Welds Produced by Traveling Distributed Heat Sources, Welding Journal, vol. 62, pp. 346-355 (December 1983); Tsai, N. and Eager, T., Changes of Weld Pool Shape by Variations in the Distribution of Heat Source in Arc Welding, Metallurgical Soc. of AIME, vol. 1984 (1984).

Figure 89:
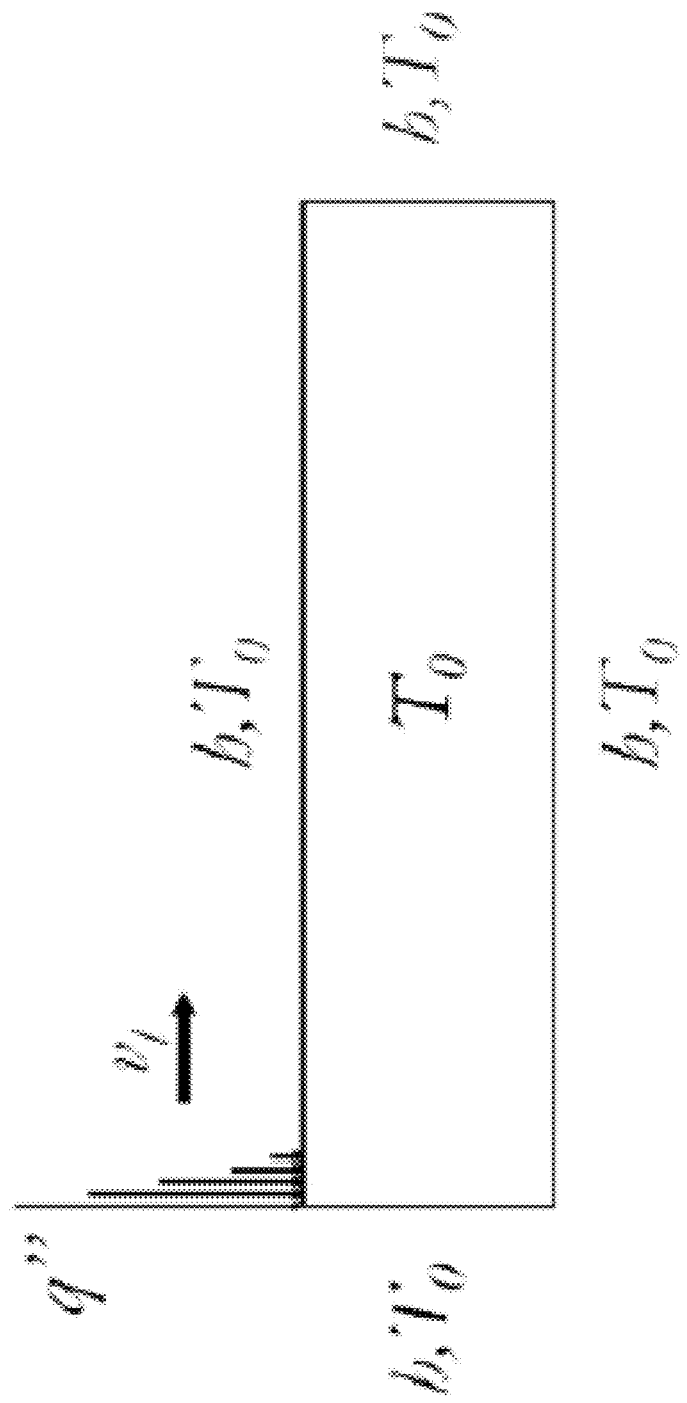
FIG. 89 is a two dimensional representation of the scanning laser epitaxy problem, in accordance with some embodiments of the present invention.

Although a 3D analysis may be needed for constructing a full lookup table for complex geometries, for the purposes of an initial study and proof of concept, a 2D model can be analyzed. Due to the extremely high scan speed, $U_r$, of the laser beam, it can be assumed to be equal to a line source of heat input on the top of the rectangular substrate. The rectangular block substrate can then modeled as a two-dimensional rectangle. The incident laser beam can be modeled as a Gaussian distributed heat source that moves across the top of the substrate with a line speed, $V_l$. Convective boundary conditions can be used on all boundaries, as this was most representative of the actual experimental setup. A graphical representation of the problem is shown in FIG. 89.

The Green's function for a heat conduction problem represents the temperature at a particular location and time, $T(x, y, t)$, due to an instantaneous line source of unit strength located at $(x', y')$ and time $\tau$. The Green's function for this problem can be found by utilizing a product of the finite extent Green's functions in the x and y directions for convective boundary conditions on both sides and is shown in Equation 58.[7]

[7] Ozisik, M. and Oezisik, M., Heat conduction, vol. 300, John Wiley & Sons, New York (1993).

$$G(x, y, \theta \mid x', y', \tau) = \left[\sum_{n=1}^{\infty} e^{\alpha \beta_n^2 (t-\tau)} \frac{1}{N(\beta_n)} X(\beta_n, x) X(\beta_n, x')\right] \quad (58)$$

$$\left[\sum_{m=1}^{\infty} e^{\alpha \beta_m^2 (t-\tau)} \frac{1}{N(\beta_m)} Y(\beta_m, y) Y(\beta_m, y')\right]$$

Where:

$$\alpha = \frac{k}{\rho c} \quad (59)$$

$$H = \frac{h}{k} \quad (60)$$

$$X(\beta_n, x) = \beta_n \cos(\beta_n x) + H \sin(\beta_n x) \quad (61)$$

-continued $$N(\beta_n) = \frac{1}{2}\left[(\beta_n^2 + H^2)\left(L_x + \frac{H}{\beta_n^2 + H^2}\right) + H\right] \quad (62)$$

$$Y(\beta_m, x) = \beta_m \cos(\beta_m y) + H\sin(\beta_m y) \quad (63)$$

$$N(\beta_m) = \frac{1}{2}\left[(\beta_m^2 + H^2)\left(L_y + \frac{H}{\beta_m^2 + H^2}\right) + H\right] \quad (64)$$

The eigenvalues $B_n$ and $B_m$ are the positive roots of:

$$\tan(\beta_n L_x) = \frac{2H\beta_n}{\beta_n^2 - H^2} \quad (65)$$

$$\tan(\beta_m L_y) = \frac{2H\beta_m}{\beta_m^2 - H^2} \quad (66)$$

The temperature distribution is then found by integrating the Green's functions as follows:

$$U(x, y, \theta) = \int_A G(x, y, \theta | x', y', \tau)|_{\theta=0} F(x', y') dA' d\tau + \quad (67)$$

$$\frac{\alpha}{k}\int_{\tau=0}^{\theta}\int_A G(x, y, \theta | x', y', \tau) g(x', y', \theta) dA' d\tau +$$

$$\frac{\alpha}{k}\int_{\tau=0}^{\theta}\sum_{i=1}^{N}\int_C G(x, y, \theta | x', y', \tau)|_{l'=r_i} f_i dl_i d\tau$$

The initial temperature distribution, F(x', y'), is zero due to the normalization in this particular formulation of the problem. The heat generation, g(x', y', θ), is also zero in this case. Likewise, all of the boundary heat flux terms, $f_i$, are also zero except for the heat flux from the gaussian beam on the top surface. Using these simplifications and substituting back in t(x, y, θ)=u(x, y, θ)+$T_o$, the temperature distribution is found to be:

$$T(x, y, \theta) = \frac{\alpha}{k}\int_{\tau=0}^{\theta}\int_{x'=0}^{L_x} G(x, y, \theta | x', y', \tau)|_{y'=0} q''(x', \tau) dx' d\tau + T_0 \quad (70)$$

This solution to the problem is particularly powerful because it represents the solution for this geometry for a heat source of arbitrary spatially and temporally varying power. This solution can thus give the temperature profile for an arbitrarily shape and a moving input laser beam through the use of integration or convolution. In this particular case, the heat input from the Gaussian distributed beam was taken as:

$$q''(x', \tau) = \frac{P(\tau)}{\sigma\sqrt{2\pi}} e^{-\frac{1}{2}\left(\frac{x'-v_l\tau}{\sigma}\right)^2} \quad (71)$$

P(τ) is the time varying amplitude of the Gaussian distribution chosen so that its total area represents the total incident laser power at each instant in time. σ is the standard deviation of the Gaussian chosen such that the distribution represents a beam of the chosen radius. The $v_{l_t}$ term causes the beam to move across the substrate at the line speed. To assess its validity, this analytical solution can be analyzed in a suitable package (e.g., MATLAB) and compared to an FEM analysis using a suitable software package (e.g., COMSOL). For the purposes of both this MATLAB simulation and the following COMSOL simulation, the parameters for CMSX-4 processed in air shown in Table 11 were used.

TABLE 11

Simulation Parameters for CMSX-4 in Air

| Parameter | Value | Units |
|---|---|---|
| k | 28.45 | W/(m · K) |
| p | 8700 | kg/m³ |
| c | 815.88 | J/(kg · K) |
| h | 5 | W/(m² K) |
| $L_x$ | 0.018 | m |
| $L_y$ | 0.003 | m |
| $v_l$ | 0.0002 | m/s |

Figure 90A:
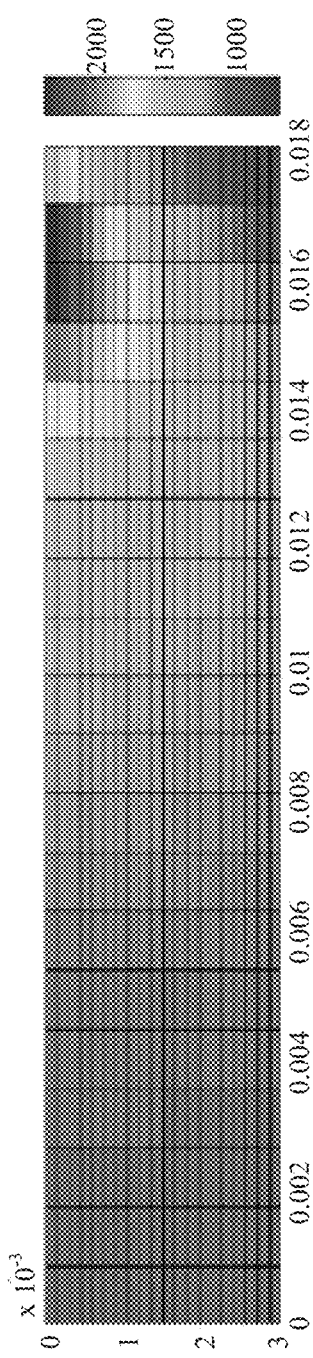
FIG. 90a is a representation of an analytical simulation, in accordance with some embodiments of the present invention.
Figure 90B:
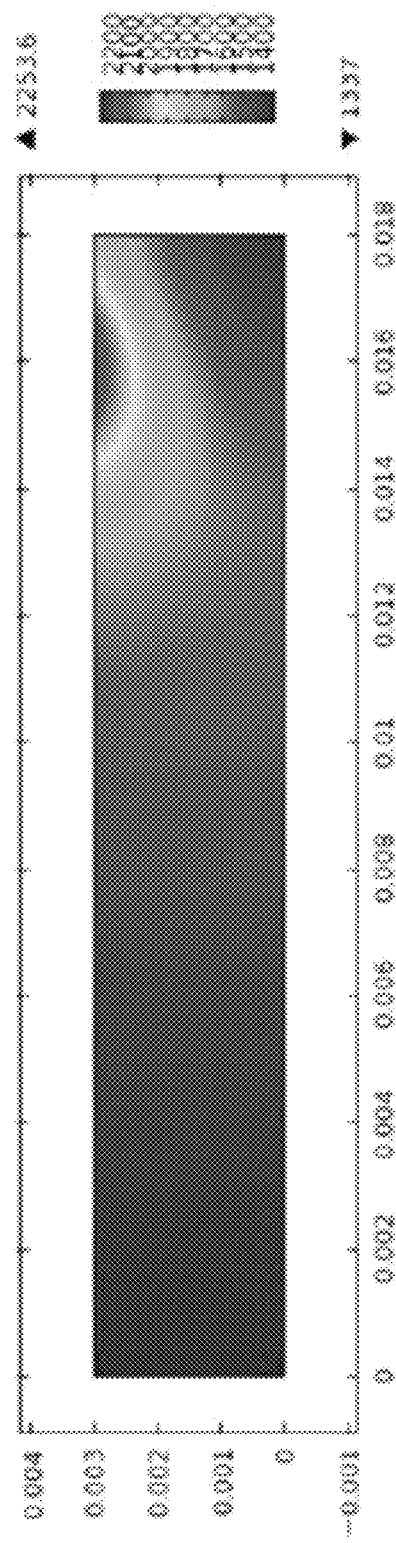
FIG. 90b is a representation of a COMSOL Simulation, in accordance with some embodiments of the present invention.

One comparison case between the analytical and FEM response is shown in the plots in FIG. 90a (analytical simulation) and 90b (COMSOL simulation). This set of simulations was run with a constant power intensity as the Gaussian beam moved across the substrate at a line speed of vl=1.8 mm/sec. It should be noted that the analytical and FEM analysis lines up well, though a comparison between the analytical and the experimental responses remains to be tested.

While several possible embodiments are disclosed above, embodiments of the present invention are not so limited. For instance, while several possible configurations for the system and laser have been disclosed, other suitable materials and combinations of materials could be selected without departing from the spirit of embodiments of the invention. A number of concentrated heat sources, in addition to those described above, could be used, for example, without departing from the spirit of the invention. The location and configuration used for various features of embodiments of the present invention can be varied according to a particular part size or shape, or configuration that requires a slight variation due to, for example, materials or space or power constraints. Such changes are intended to be embraced within the scope of the invention.

The specific configurations, choice of materials, and the size and shape of various elements can be varied according to particular design specifications or constraints requiring a device, system, or method constructed according to the principles of the invention. Such changes are intended to be embraced within the scope of the invention. The presently disclosed embodiments, therefore, are considered in all respects to be illustrative and not restrictive. The scope of the invention is indicated by the appended claims, rather than the foregoing description, and all changes that come within the meaning and range of equivalents thereof are intended to be embraced therein.

The invention claimed is:

1. A system for manufacturing components by melting and resolidifiying materials, the system comprising:
   a concentrated energy source for selectively melting a material; and
   a simulation and control system comprising a computing device, and a non-transitory computer-readable storage medium containing instructions that, when executed, cause the simulation and control system to:
      scan the concentrated energy source across a material to create a melt pool;
      calculate a melt pool temperature using a sensor;
      generate a temperature profile by simulating a process of scanning a concentrated energy source across the material; and control at least one of the power output, scan speed, or scan pattern of the concentrated energy source with a feedback controller to obtain the desired temperature of the melt pool, using the temperature profile and the calculated melt pool temperature as inputs to the feedback controller.

2. The system of claim 1, wherein the concentrated energy source is a laser.

3. The system of claim 1, wherein the material comprises a powdered metal.

4. The system of claim 3, wherein the powdered metal is a nickel-based superalloy.

5. The system of claim 1, wherein the sensor comprises a thermal imaging camera.

6. The system of claim 1, wherein the material is disposed in a vacuum chamber capable of maintaining a vacuum between $5 \times 10^{-3}$ Torr and $1 \times 10^{-7}$ Torr.

7. A method for repairing components by melting and resolidifying a material powder, the method comprising:
scanning a concentrated energy source along a path in a layer of the material powder deposited on a part to form a melt pool, where the path is selected to scan the concentrated energy source across a desired shape, and wherein the melt pool includes material from the part;
calculating a melt pool temperature using a sensor comprising a thermal imaging device or video microscope; and
adjusting at least one of the power output, scan speed, or scan pattern of the concentrated energy source using a control scheme to maintain a melt pool of the material powder under the concentrated energy source, using the calculated melt pool temperature as an input to the control scheme.

8. The method of claim 7, where scanning the concentrated energy source along the path includes repeatedly scanning a circle of a predetermined radius while increasing a power of the concentrated energy source to form the melt pool.

9. The method of claim 7, further comprising oscillating the concentrated energy source in a direction perpendicular to the path.

10. The method of claim 7, the melt pool including material from a previous layer, and the method further comprising depositing the layer of material powder on the previous layer.

11. The method of claim 7, wherein the concentrated energy source scans the desired shape along the path continuously.

12. The method of claim 10, the path comprising a neoid pattern within the desired shape.

13. The method of claim 10, the path comprising a cycloid pattern within the desired shape.

14. The method of claim 7, further comprising controlling the concentrated energy source to maintain a flow of melted material powder such that porosity in a finished part is reduced.

15. The method of claim 7, further comprising:
maintaining the layer of material powder in a vacuum in the range of $5 \times 10^{-3}$ Torr and $1 \times 10^{-7}$ Torr; and
heating the layer of material powder to a temperature between 500° C. and 750° C.

16. A method for manufacturing components by melting and resolidifying powdered materials, the method comprising:
generating a temperature profile by simulating a process of scanning a concentrated energy source across a part;
scanning the concentrated energy source across the part;
calculating a melt pool temperature using a sensor comprising a thermal imaging device or video microscope; and
controlling a power of the concentrated energy source to maintain a constant melt pool with a feedback controller, where the controller determines the power of the concentrated energy source as a function of the temperature profile, the melt pool temperature, and an estimated temperature gradient.

17. The method of claim 16, the step of controlling the power of the concentrated energy source further comprising calculating the melt pool temperature using a canny edge detection algorithm.

18. The method of claim 16, wherein the feedback controller is an adaptive feedback controller.

19. The method of claim 18, wherein the feedback controller is a distributed parameter controller.

* * * * *